United States Patent
Then et al.

(10) Patent No.: US 11,437,229 B2
(45) Date of Patent: Sep. 6, 2022

(54) SUBSTRATE PROCESSING METHOD

(71) Applicant: SCREEN Holdings Co., Ltd., Kyoto (JP)

(72) Inventors: Pohling Then, Kyoto (JP); Kenji Kobayashi, Kyoto (JP); Sadamu Fujii, Kyoto (JP); Taiki Hinode, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/960,106

(22) PCT Filed: Nov. 19, 2018

(86) PCT No.: PCT/JP2018/042723
§ 371 (c)(1),
(2) Date: Jul. 6, 2020

(87) PCT Pub. No.: WO2019/138694
PCT Pub. Date: Jul. 18, 2019

(65) Prior Publication Data
US 2021/0066071 A1    Mar. 4, 2021

(30) Foreign Application Priority Data

Jan. 9, 2018 (JP) .............................. JP2018-001373
Jan. 9, 2018 (JP) .............................. JP2018-001374

(51) Int. Cl.
*H01L 21/02* (2006.01)
*H01L 21/3105* (2006.01)
*H01L 21/67* (2006.01)

(52) U.S. Cl.
CPC .. *H01L 21/02065* (2013.01); *H01L 21/31053* (2013.01); *H01L 21/67051* (2013.01);
(Continued)

(58) Field of Classification Search
None
See application file for complete search history.

(56) References Cited

U.S. PATENT DOCUMENTS

| | | | | |
|---|---|---|---|---|
| 5,510,277 A | * | 4/1996 | Cunningham | .... H01L 21/02046 438/707 |
| 8,158,534 B2 | * | 4/2012 | Yokonaga | ......... H01L 21/76814 438/769 |

(Continued)

FOREIGN PATENT DOCUMENTS

| | | |
|---|---|---|
| JP | H01-050426 A | 2/1989 |
| JP | H11-224872 A | 8/1999 |

(Continued)

OTHER PUBLICATIONS

International Search Report dated Feb. 19, 2019 in corresponding PCT International Application No. PCT/JP2018/042723.

(Continued)

*Primary Examiner* — Shamim Ahmed
(74) *Attorney, Agent, or Firm* — Ostrolenk Faber LLP

(57) ABSTRACT

A substrate processing method and a substrate processing apparatus are provided, which solve problems of pattern collapse and particles. The substrate processing method includes: a surface modification step of modifying a surface of a substrate having an oxide thereon to improve or reduce roughness of the surface; a surface cleaning step of supplying a treatment liquid to the modified surface of the substrate to clean the surface of the substrate with the treatment liquid; and a hydrophobization step of supplying a hydrophobizing agent to the cleaned surface of the substrate to hydrophobize the surface of the substrate.

20 Claims, 31 Drawing Sheets

(52) U.S. Cl.
CPC .. *H01L 21/67115* (2013.01); *H01L 21/67207* (2013.01); *H01L 21/67167* (2013.01)

(56) References Cited

U.S. PATENT DOCUMENTS

| | | | | |
|---|---|---|---|---|
| 8,623,131 | B2* | 1/2014 | Yoshida | C09D 7/20 |
| | | | | 106/287.11 |
| 2004/0154641 | A1* | 8/2004 | Montierth | H01L 21/31111 |
| | | | | 134/3 |
| 2006/0196527 | A1 | 9/2006 | Nishimura et al. | 134/2 |
| 2009/0311874 | A1 | 12/2009 | Tomita et al. | 438/759 |
| 2010/0105192 | A1* | 4/2010 | Akae | H01L 21/0228 |
| | | | | 438/478 |
| 2011/0053349 | A1 | 3/2011 | Gao et al. | 438/473 |
| 2012/0045581 | A1 | 2/2012 | Kimura et al. | 427/248.1 |
| 2013/0052828 | A1 | 2/2013 | Hashizume et al. | 438/694 |
| 2015/0021643 | A1* | 1/2015 | Kurino | C01G 25/02 |
| | | | | 257/98 |
| 2015/0175814 | A1* | 6/2015 | Aizenberg | C03C 17/001 |
| | | | | 428/312.8 |
| 2016/0371529 | A1* | 12/2016 | Bhagavat | G06K 9/00053 |
| 2018/0047614 | A1* | 2/2018 | Usenko | H01L 21/76254 |

FOREIGN PATENT DOCUMENTS

| | | |
|---|---|---|
| JP | 2006-270032 A | 10/2006 |
| JP | 4403202 B1 | 1/2010 |
| JP | 2012-044065 A | 3/2012 |
| JP | 2012-222329 A | 11/2012 |
| JP | 2013-051264 A | 3/2013 |
| JP | 2016-021597 A | 2/2016 |
| JP | 2017-010977 A | 1/2017 |

OTHER PUBLICATIONS

Written Opinion dated Feb. 19, 2019 in corresponding PCT International Application No. PCT/JP2018/042723.
International Preliminary Report on Patentability (Chapter I) dated Jul. 23, 2020 with a Notification from the International Bureau (Form PCT/IB/326) in corresponding PCT International Application No. PCT/JP2018/042723 in Japanese.
English translation of the International Preliminary Report on Patentability (Chapter I) dated Jul. 23, 2020 with a Notification from the International Bureau (Form PCT/IB/338) in corresponding PCT International Application No. PCT/JP2018/042723 in English.

* cited by examiner

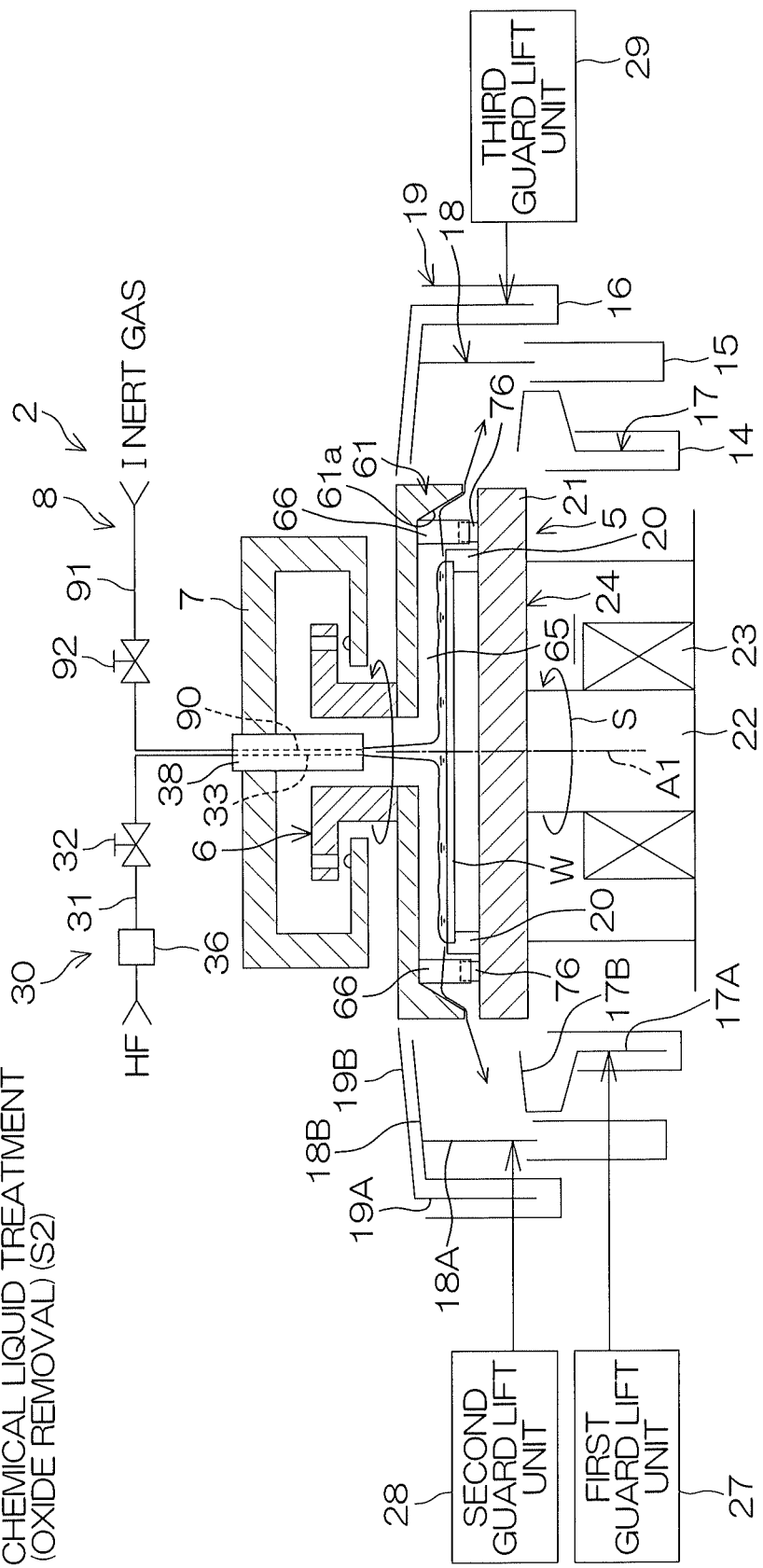

RINSING PROCESS (S3)

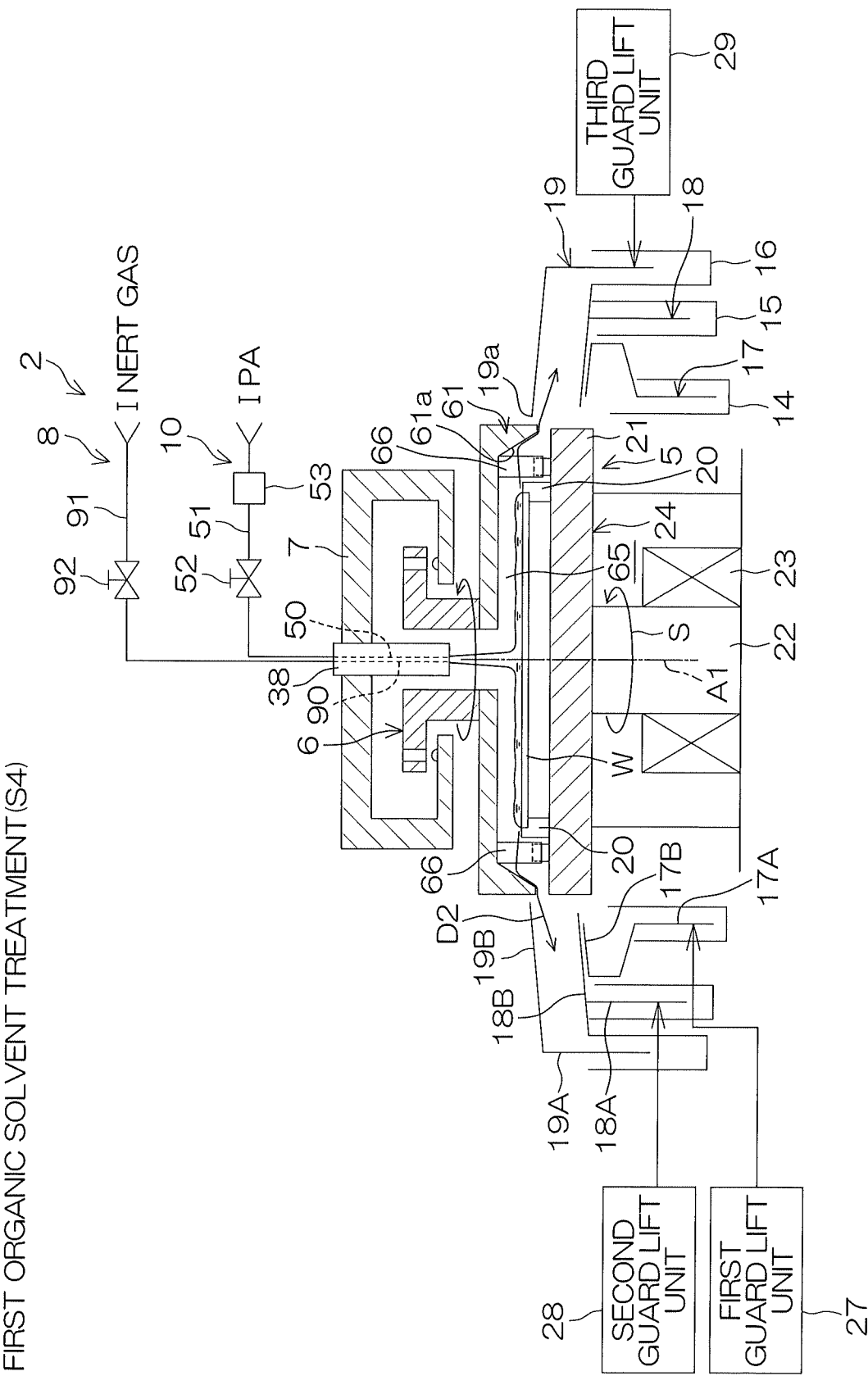

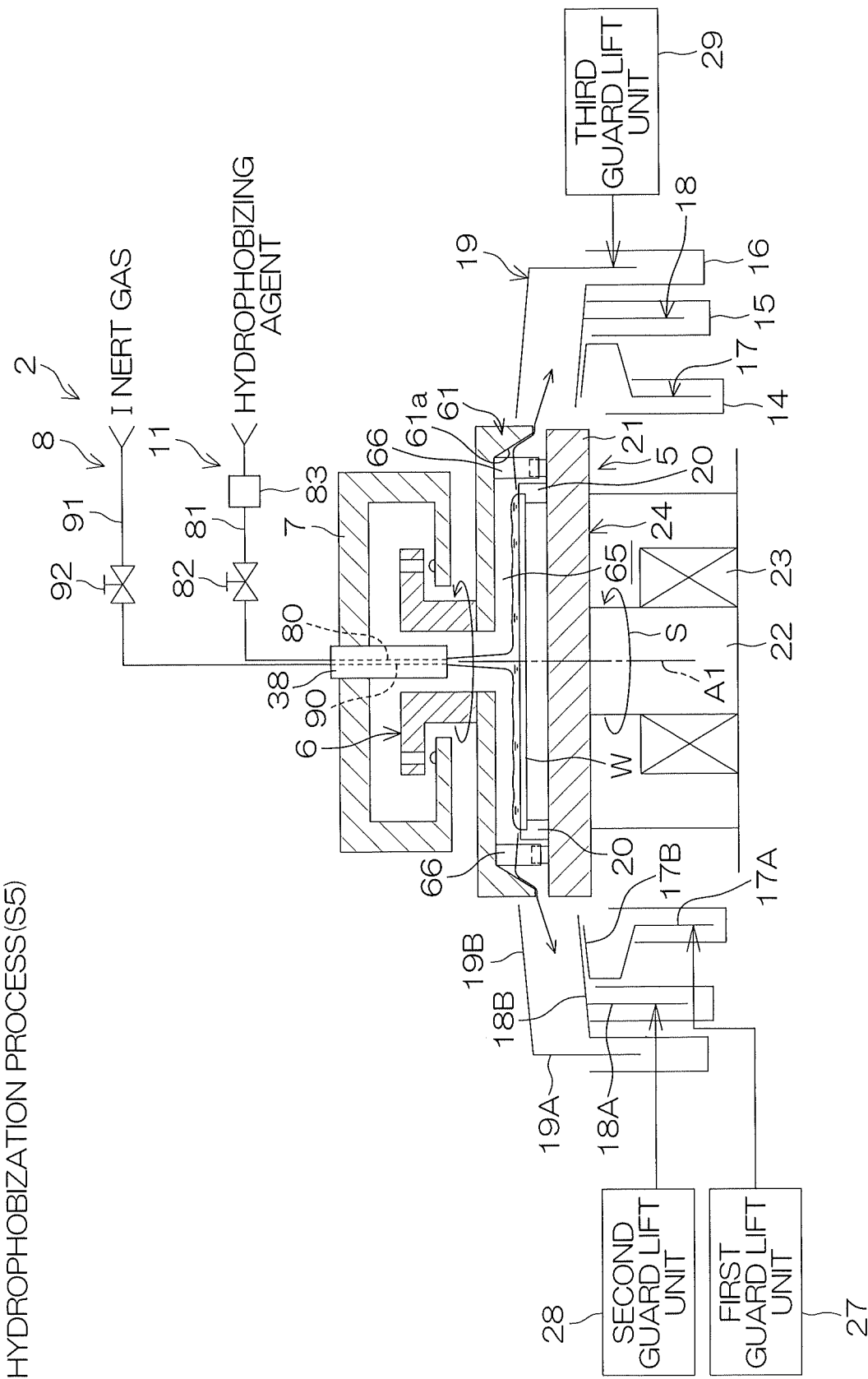
FIG. 8D HYDROPHOBIZATION PROCESS(S5)

SECOND ORGANIC SOLVENT TREATMENT (S6)

CHEMICAL LIQUID TREATMENT (S25)

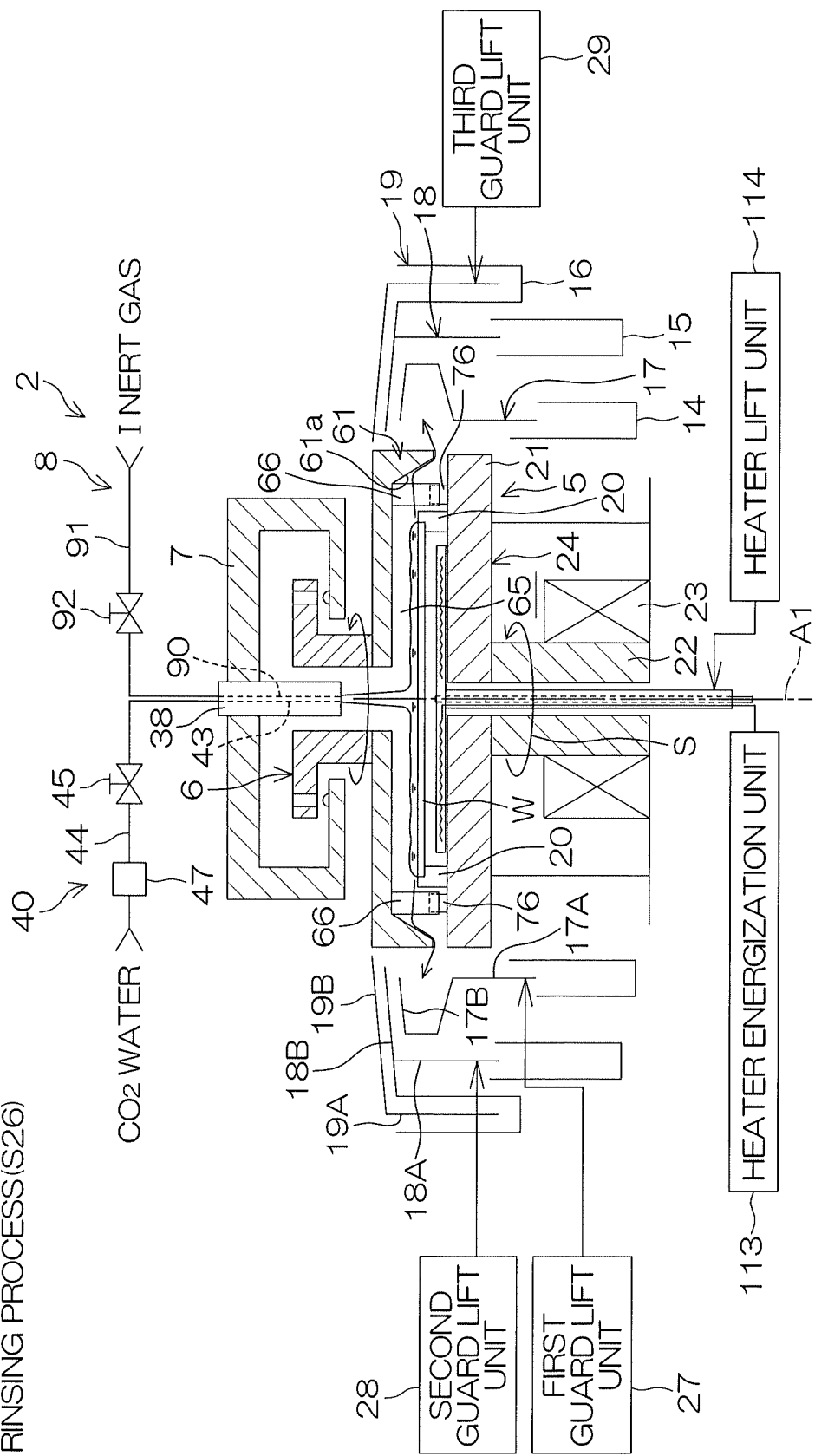
FIG. 14B RINSING PROCESS (S26)

FIRST ORGANIC SOLVENT TREATMENT (S27)

HYDROPHOBIZATION PROCESS (S28)

SECOND ORGANIC SOLVENT TREATMENT (S29)

SUBSEQUENT SUBSTRATE HEATING(S31)

SUBSEQUENT SUBSTRATE COOLING (S32)

CHEMICAL LIQUID TREATMENT
(OXIDE REMOVAL) (S41)

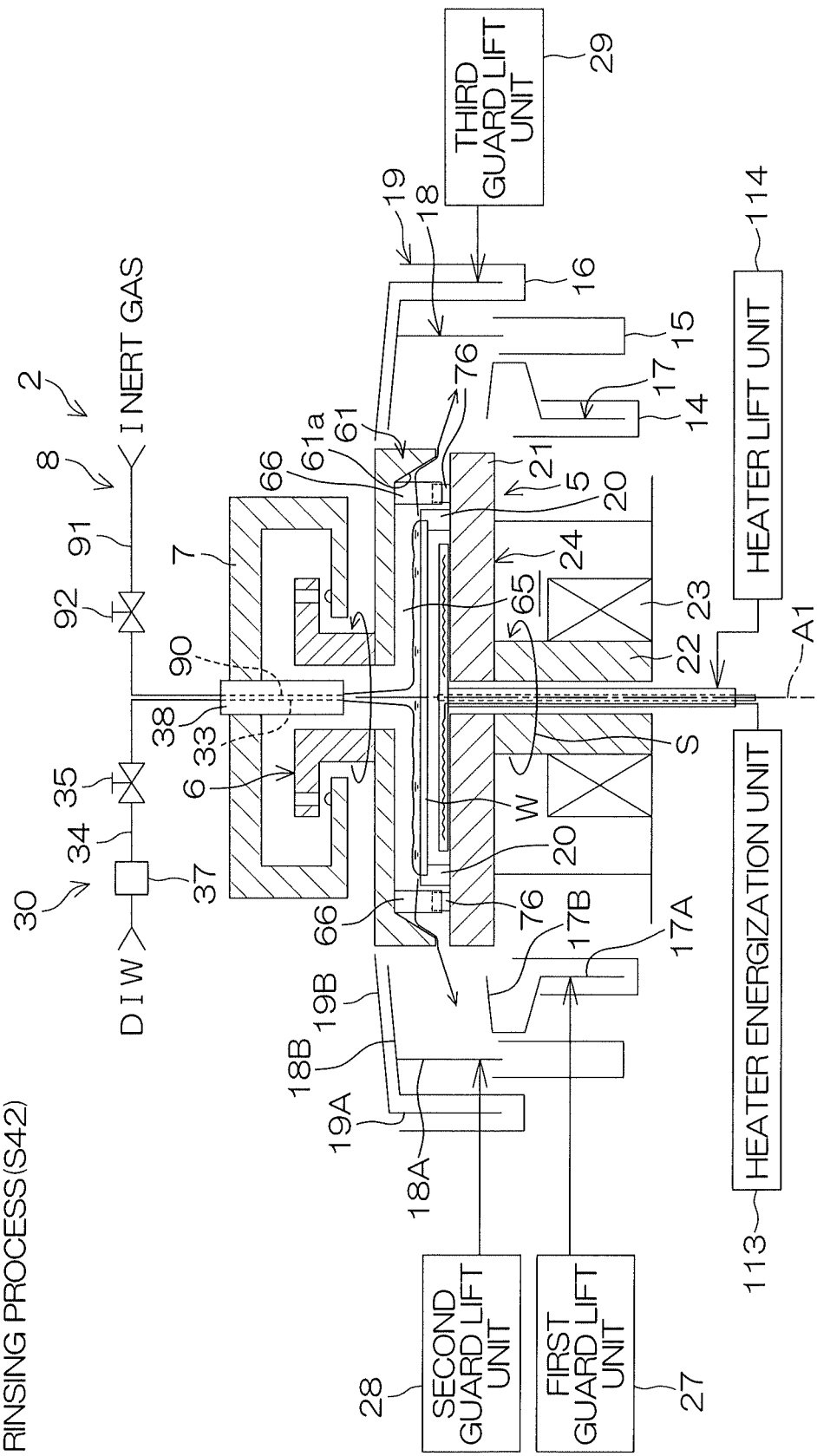
FIG. 15B RINSING PROCESS(S42)

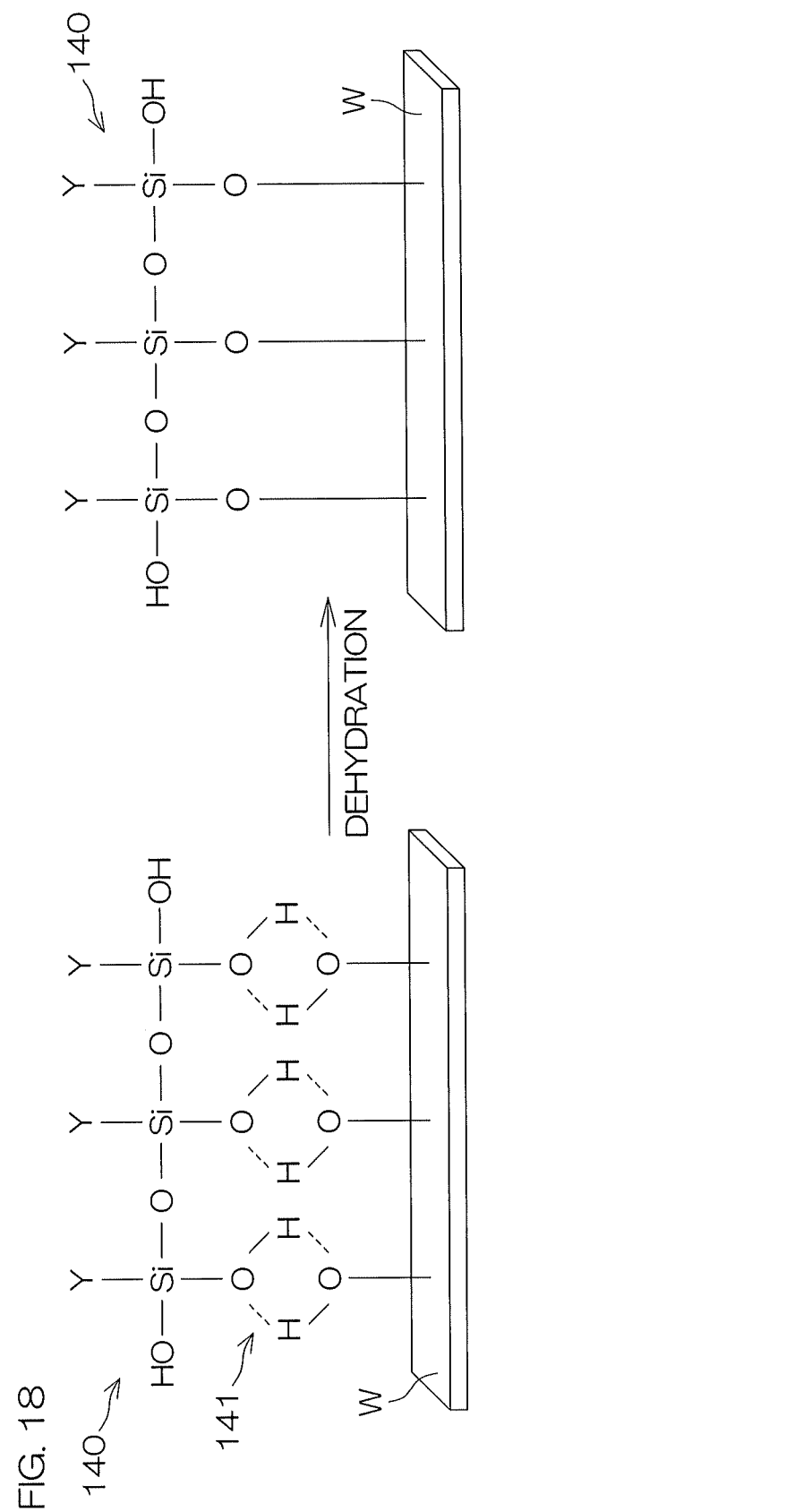

SUBSTRATE PROCESSING METHOD

TECHNICAL FIELD

This application is a 35 U.S.C. §§ 371 national phase conversion of International Application No. PCT/JP2018/042723, filed Nov. 19, 2018, which claims the priority benefits of Japanese Patent Application Nos. 2018-001373 and 2018-001374, both filed on Jan. 9, 2018, the disclosures of which are entirely incorporated herein by reference.

The present invention relates to a substrate processing method and a substrate processing apparatus for processing a substrate. Examples of the substrate to be processed include semiconductor wafers, substrates for liquid crystal display devices, substrates for FPDs (Flat Panel Displays) such as organic EL (Electroluminescence) display devices, substrates for optical disks, substrates for magnetic disks, substrates for magneto-optical disks, substrates for photomasks, ceramic substrates, and substrates for solar cells.

BACKGROUND ART

In substrate processing by a substrate processing apparatus of a single substrate processing type, substrates are processed one by one. More specifically, a substrate is generally horizontally held by a spin chuck. Then, an upper surface of the substrate is treated with a chemical liquid, and then rinsed with a rinse liquid. Thereafter, a spin drying step of rotating the substrate at a high speed is performed to dry the upper surface of the substrate.

Where a minute pattern is provided in the surface of the substrate, there is a possibility that a portion of the rinse liquid entering an inner portion of the pattern cannot be removed in the spin drying step. This may result in insufficient drying. A liquid surface of the rinse liquid entering the inner portion of the pattern (an air-liquid interface) is present inside the pattern. Therefore, the surface tension of the liquid acts on a contact portion between the liquid surface and the pattern. If the surface tension is high, the pattern is liable to collapse. Since water which is a typical rinse liquid has a high surface tension, the collapse of the pattern is not negligible in the spin drying step.

To cope with this, a method utilizing isopropyl alcohol (IPA) which is a low-surface tension liquid having a lower surface tension than water is proposed (see, for example, PTL 1). Specifically, IPA is supplied to the upper surface of the substrate, whereby water entering the inner portion of the pattern is replaced with IPA. Then, IPA is removed to dry the upper surface of the substrate. Where the surface tension acts on the pattern for a longer period or the pattern has a lower strength, however, the collapse of the pattern can occur even if water entering the inner portion of the pattern is replaced with IPA.

To cope with this, PTL 2 discloses a substrate processing method in which the surface tension acting on the pattern is reduced by hydrophobizing the upper surface of the substrate with the use of a silylation agent (hydrophobizing agent) to thereby prevent the collapse of the pattern. Specifically, the silylation agent is supplied to the upper surface of the substrate. The silylation agent supplied to the upper surface of the substrate flows from a center portion toward a peripheral edge of the substrate to spread over the upper surface of the substrate by the rotation of the substrate. Thus, the entire upper surface of the substrate is hydrophobized. Thereafter, the silylation agent remaining on the upper surface of the substrate is washed away by IPA, and then the substrate is dried.

CITATION LIST

Patent Literature

PTL 1: JP2016-21597A
PTL 2: JP2012-222329A

SUMMARY OF INVENTION

Problem to be Solved by Invention

However, recent researches conducted by the inventors of the present invention revealed that the pattern collapse may occur even if such a hydrophobization process is performed. In addition, it was found that a greater number of particles are observed on the surface of the substrate dried after the hydrophobization process.

According to a hypothesis suggested by the inventors, the cause of the occurrence of the particles is as follows:

If an oxide adheres to the surface of the substrate to be subjected to the hydrophobization process, the surface of the substrate has unevenness attributable to the oxide. Where the hydrophobization process is performed on such a substrate surface, functional groups of the hydrophobizing agent react with a substrate material present in exposed surface portions of the substrate, and react with the oxide present on the surface portions of the substrate covered with the oxide, whereby a hydrophobic film is formed to cover the exposed surface portions of the substrate and the oxide on the substrate surface. However, the hydrophobic film has surface unevenness due to the unevenness attributable to the oxide, and the surface unevenness is enhanced because the hydrophobizing agent contains a higher-molecular weight substance. That is, if the substrate surface has a roughness attributable to the oxide, the roughness is further aggravated by the hydrophobization process.

If a liquid (e.g., IPA in PTL 2) is supplied to the surface having an aggravated roughness or if a previously supplied liquid (e.g., water or IPA) remains on the surface having an aggravated roughness, the pattern collapse is liable to occur due to the surface tension of the liquid.

When the substrate surface is observed by means of a particle counter or the like, there is a possibility that the roughness enhanced by the hydrophobization process is detected as particles.

To cope with this, embodiments of the present invention provide a substrate processing method and a substrate processing apparatus capable of solving the problems of the pattern collapse and the particles.

Solution to Problem

According to one embodiment of the present invention, there is provided a substrate processing method, which includes: a surface modification step of modifying a surface of a substrate having an oxide thereon to improve roughness of the surface; a surface cleaning step of supplying a treatment liquid to the modified surface of the substrate to clean the surface of the substrate with the treatment liquid; and a hydrophobization step of supplying a hydrophobizing agent to the cleaned surface of the substrate to hydrophobize the surface of the substrate.

According to this method, a surface modification process for improving or reducing the roughness is performed on the surface of the substrate, whereby the surface of the substrate is planarized. The planarized surface is subjected to a cleaning process with the use of the treatment liquid, and then subjected to a hydrophobization process with the use of the hydrophobizing agent. Since the substrate surface is thus modified to be hydrophobic in a state free from substrate surface unevenness, the modified substrate surface is uniformly made hydrophobic and flat with a lower roughness. This makes it possible to solve the problems of the pattern collapse and the particles.

According to another embodiment of the present invention, there is provided a substrate processing method, which includes: a thermal modification step of heating a substrate having an oxide on a surface thereof to modify the surface; a surface cleaning step of supplying a treatment liquid to the modified surface of the substrate to clean the surface of the substrate with the treatment liquid; and a hydrophobization step of supplying a hydrophobizing agent to the cleaned surface of the substrate to hydrophobize the surface of the substrate.

According to this method, the surface of the substrate is modified by heating the substrate. The surface modification by the heating removes the oxide on the substrate, and decomposes and recombines the oxide on the substrate, whereby the surface of the substrate is planarized. The surface planarized by the surface modification is subjected to the cleaning process with the use of the treatment liquid, and then subjected to the hydrophobization process with the use of the hydrophobizing agent. Since the substrate surface is thus modified to be hydrophobic in a state free from substrate surface unevenness attributable to the oxide, the modified substrate surface is uniformly made hydrophobic and flat with a lower roughness. This makes it possible to solve the problems of the pattern collapse and the particles.

In further another embodiment of the present invention, the thermal modification step includes a thermal removal step of removing at least a portion of the oxide from the surface of the substrate by the heating.

In this method, the unevenness of the substrate surface is reduced or eliminated by the removal of the oxide. The oxide is decomposed by a thermal energy. More specifically, bonds between the substrate material and the oxide are broken by the thermal energy, whereby the oxide is removed. The removal of the oxide by the heating is more advantageous than the removal of the oxide with the use of a chemical liquid without a loss of the substrate material (film loss) due to the etching effect of the chemical liquid.

In still another embodiment of the present invention, the thermal modification step includes a planarization step of reducing unevenness attributable to the oxide on the surface of the substrate by the heating. In this method, the unevenness of the substrate surface attributable to the oxide is planarized by the heating.

In yet another embodiment of the present invention, the surface cleaning step includes a chemical liquid cleaning step of supplying a cleaning chemical liquid to the surface of the substrate, and a rinsing step of supplying a rinse liquid to the surface of the substrate to replace the chemical liquid with the rinse liquid.

Thus, the surface of the substrate can be hydrophobized after being subjected to the substrate cleaning process with the use of the chemical liquid. Since the substrate surface is modified by the heating of the substrate before the cleaning with the chemical liquid, the substrate surface has a proper hydrophobicity. Thus, it is possible to perform the substrate cleaning process with the use of the chemical liquid, while eliminating the problem of the pattern collapse and the problem of the particles.

In further another embodiment of the present invention, the treatment liquid has a dissolved oxygen concentration of not higher than 100 ppb. This suppresses or prevents oxidation of the substrate material attributable to oxygen dissolved in the treatment liquid, thereby improving or reducing the roughness of the substrate surface before the hydrophobization process. Therefore, the substrate surface subjected to the hydrophobization process has an excellent hydrophobicity.

In still another embodiment of the present invention, the hydrophobization step includes a hydrophobizing agent supply step of supplying a liquid hydrophobizing agent containing a solvent and a hydrophobizing substance dissolved in the solvent. The method further includes a precedent organic solvent supply step of supplying an organic solvent miscible with the solvent of the hydrophobizing agent to the surface of the substrate before the hydrophobization step after the surface cleaning step.

In this method, the treatment liquid on the surface of the substrate is replaced with the organic solvent, and then the liquid hydrophobizing agent is supplied to the substrate surface. Since the organic solvent is miscible (i.e., compatible) with the solvent of the hydrophobizing agent, the hydrophobizing agent efficiently replaces the organic solvent on the substrate surface. Even where a pattern is provided in the substrate surface, more specifically, the organic solvent in the pattern can be replaced with the hydrophobizing agent.

In yet another embodiment of the present invention, the method further includes a subsequent organic solvent supply step of supplying an organic solvent to the surface of the substrate to wash away an excess amount of the hydrophobizing agent on the substrate after the hydrophobization step. Thus, the substrate surface can be hydrophobized with the use of a proper amount of the hydrophobizing agent. This prevents the aggravation of the roughness of the substrate surface and the reduction in hydrophobization performance which may otherwise occur due to the excess hydrophobizing agent.

In further another embodiment of the present invention, the organic solvent has a dissolved oxygen concentration of not higher than 100 ppb. This suppresses or prevents oxidation of the substrate material attributable to oxygen dissolved in the organic solvent, thereby improving or reducing the roughness of the substrate surface before the hydrophobization process. Therefore, the substrate surface subjected to the hydrophobization process has an excellent hydrophobicity.

In still another embodiment of the present invention, the hydrophobizing agent has a dissolved oxygen concentration of not higher than 100 ppb. This suppresses or prevents oxidation of the substrate material attributable to oxygen dissolved in the hydrophobizing agent in the hydrophobizing agent supply step.

In yet another embodiment of the present invention, the method further includes an atmosphere control step of controlling an atmosphere around the substrate to a low-oxygen atmosphere having a lower oxygen concentration than atmospheric air during a period from the surface cleaning step to the hydrophobization step. Thus, the surface of the substrate can be modified to be hydrophobic in a state such that the growth of a new oxide on the substrate surface is suppressed after the modification of the substrate surface by the heating process.

In further another embodiment of the present invention, the low-oxygen atmosphere is an atmosphere having an oxygen concentration that does not permit dissolution of oxygen in the treatment liquid. Thus, oxygen from the atmosphere is not dissolved in the treatment liquid in the surface cleaning step, thereby suppressing or preventing the growth of the oxide on the substrate surface in the surface cleaning step.

In still another embodiment of the present invention, the method includes a cooling step of cooling the substrate after the thermal modification step, and the surface cleaning step is performed on the substrate after the cooling step. Thus, the substrate is cooled before the surface cleaning step, so that the oxidation of the substrate material can be more reliably suppressed during the surface cleaning step.

In yet another embodiment of the present invention, the method includes a thermal dehydration step of heating and dehydrating the hydrophobizing agent on the surface of the substrate after the hydrophobization step. Thus, the solvent of the hydrophobizing agent on the surface of the substrate can be evaporated away in the thermal dehydration step, thereby diminishing foreign matter and eliminating insufficient bonding of the hydrophobizing agent attributable to excess moisture. This makes it possible to impart the surface with an excellent hydrophobicity.

According to further another embodiment of the present invention, there is provided a substrate processing method, which includes: an oxide removal step of removing an oxide from a surface of a substrate; a surface cleaning step of supplying a treatment liquid to the oxide-removed surface of the substrate to clean the surface of the substrate with the treatment liquid; a hydrophobizing step of supplying a hydrophobizing agent to the cleaned surface of the substrate to hydrophobize the surface of the substrate; and an atmosphere control step of controlling an atmosphere around the substrate to a low-oxygen atmosphere having a lower oxygen concentration than atmospheric air during a period from the surface cleaning step to the hydrophobization step.

According to this method, the oxide is removed from the surface of the substrate, and then the surface cleaning step is performed to clean the surface of the substrate with the treatment liquid. In the hydrophobization step performed after the surface cleaning step, the hydrophobizing agent is supplied to the surface of the substrate, whereby the surface of the substrate is modified to be hydrophobic. During the period from the surface cleaning step to the hydrophobization step, the atmosphere around the substrate is controlled to the low-oxygen atmosphere. After the oxide is removed from the surface of the substrate, therefore, the substrate surface can be modified to be hydrophobic in a state such that the growth of a new oxide on the surface is suppressed. Since the surface of the substrate is modified to be hydrophobic in a state free from the substrate surface unevenness attributable to the oxide, the modified substrate surface is uniformly made hydrophobic and flat with a lower roughness. This makes it possible to solve the problem of the pattern collapse and the problem of the particles.

The treatment liquid to be used in the surface cleaning step is preferably a treatment liquid that does not oxidize the substrate material. This prevents occurrence of a new oxide attributable to the treatment liquid on the surface of the substrate during the cleaning.

In still another embodiment of the present invention, the low-oxygen atmosphere is an atmosphere having an oxygen concentration that does not permit dissolution of oxygen in the treatment liquid. Thus, oxygen from the atmosphere is not dissolved in the treatment liquid in the surface cleaning step, thereby suppressing or preventing the growth of the oxide on the substrate surface in the surface cleaning step.

In yet another embodiment of the present invention, the treatment liquid has a dissolved oxygen concentration of not higher than 100 ppb. This reliably suppresses or prevents oxidation of the substrate material attributable to oxygen in the treatment liquid in the surface cleaning step.

In further another embodiment of the present invention, the oxide removal step includes a chemical removal step of supplying a chemical liquid to the surface of the substrate to remove the oxide. For example, the chemical liquid removes the oxide from the surface of the substrate by etching. In this case, it is preferred to use a chemical liquid capable of selectively etching the oxide with respect to the substrate material. In general, however, the oxide on the surface of the substrate can be removed by etching with a chemical liquid having a dilute concentration in a short period. Therefore, even if an oxide is contained in a substrate material (e.g., a material forming a pattern in the surface of the substrate), there is no possibility that the structure of the substrate surface is virtually altered.

In still another embodiment of the present invention, the chemical liquid has a dissolved oxygen concentration of not higher than 100 ppb. This reliably suppresses or prevents oxidation of the substrate material attributable to oxygen in the chemical liquid in the chemical removal step.

In yet another embodiment of the present invention, the oxide removal step includes a thermal removal step of removing at least a portion of the oxide from the surface of the substrate by heating. In this case, the oxide is decomposed by a thermal energy. More specifically, bonds between the substrate material and the oxide are broken by the thermal energy, whereby the oxide is removed. The removal of the oxide by the heating is more advantageous than the removal of the oxide with the use of a chemical liquid without a loss of the substrate material (film loss) due to the etching effect of the chemical liquid.

In further another embodiment of the present invention, the method further includes a degassing step of degassing the treatment liquid to be supplied to the surface of the substrate to remove oxygen from the treatment liquid, and the treatment liquid subjected to the degassing step is supplied to the surface of the substrate in the surface cleaning step. This reliably reduces the amount of oxygen dissolved in the treatment liquid, thereby suppressing or preventing the oxidation of the substrate material attributable to the dissolved oxygen.

In still another embodiment of the present invention, the surface cleaning step includes a chemical liquid cleaning step of supplying a cleaning chemical liquid to the surface of the substrate, and a rinsing step of supplying a rinse liquid to the surface of the substrate to replace the chemical liquid with the rinse liquid. In this case, the chemical liquid and the rinse liquid each serve as the treatment liquid, and are each preferably a liquid that does not oxidize the substrate material. This suppresses or prevents the oxidation of the substrate material in both the chemical liquid cleaning step and the rinsing step.

In yet another embodiment of the present invention, the hydrophobization step includes a hydrophobizing agent supply step of supplying a liquid hydrophobizing agent containing a solvent and a hydrophobizing substance dissolved in the solvent. The method further includes a precedent organic solvent supply step of supplying an organic solvent miscible with the solvent of the hydrophobizing agent to the surface of the substrate before the hydrophobization step after the surface cleaning step.

In this method, the treatment liquid on the surface of the substrate is replaced with the organic solvent, and then the liquid hydrophobizing agent is supplied to the surface of the substrate. Since the organic solvent is miscible (i.e., compatible) with the solvent of the hydrophobizing agent, the hydrophobizing agent efficiently replaces the organic solvent on the substrate surface. Even where a pattern is provided in the substrate surface, more specifically, the organic solvent in the pattern can be replaced with the hydrophobizing agent. The organic solvent is preferably an organic solvent that does not oxidize the surface of the substrate. This suppresses or prevents the growth of the oxide on the surface of the substrate before the supply of the hydrophobizing agent, whereby the surface of the substrate can be uniformly hydrophobized.

In further another embodiment of the present invention, the organic solvent has a dissolved oxygen concentration of not higher than 100 ppb. This reliably suppresses or prevents oxidation of the substrate material attributable to oxygen in the organic solvent in the precedent organic solvent supply step.

In still another embodiment of the present invention, the hydrophobizing agent has a dissolved oxygen concentration of not higher than 100 ppb. This suppresses or prevents oxidation of the substrate material attributable to oxygen dissolved in the hydrophobizing agent in the hydrophobizing agent supply step.

In yet another embodiment of the present invention, the method further includes a subsequent organic solvent supply step of supplying an organic solvent to the surface of the substrate to wash away an excess amount of the hydrophobizing agent on the substrate after the hydrophobization step. Thus, the substrate surface can be hydrophobized with the use of a proper amount of the hydrophobizing agent. This prevents the aggravation of the roughness of the substrate surface and the reduction in hydrophobization performance which may otherwise occur due to the excess hydrophobizing agent.

In further another embodiment of the present invention, the atmosphere control step includes a shield placement step of placing a shield in a position in close opposed relation to the surface of the substrate, and an inert gas supply step of supplying an inert gas between the shield and the surface of the substrate.

In this method, a space to which the surface of the substrate is opposed can be limited by placing the shield in close opposed relation to the surface of the substrate. The inert gas is supplied to the limited space, whereby the surface of the substrate is maintained in an atmosphere having a lower oxygen concentration. This suppresses or prevents the growth of the oxide on the substrate surface during the process.

In still another embodiment of the present invention, the shield includes an opposing portion to be opposed to the surface of the substrate, and an annular extension portion connected to a peripheral portion of the opposing portion to surround a periphery of the substrate, and the extension portion is opposed to the periphery of the substrate in the atmosphere control step.

Thus, the space to which the surface of the substrate is opposed is limited by the opposing portion in a direction normal to the surface, and is limited by the annular extension portion in a direction parallel to the surface. Thus, the space to which the surface of the substrate is opposed is a substantially closed space, to which the inert gas is supplied. Therefore, the surface of the substrate is maintained in an atmosphere stabilized at a lower oxygen concentration and, in this state, the surface cleaning process and the like are performed. This more reliably suppresses or prevents the growth of the oxide on the substrate surface during the process.

According to yet another embodiment of the present invention, there is provided a substrate processing apparatus, which includes: a surface modification unit which modifies a surface of a substrate having an oxide thereon to improve roughness of the surface; a treatment liquid supply unit which supplies a treatment liquid to the modified surface of the substrate to clean the surface; and a hydrophobizing agent supply unit which supplies a hydrophobizing agent to the cleaned surface of the substrate to hydrophobize the surface of the substrate.

In further another embodiment of the present invention, there is provided a substrate processing apparatus, which includes: a heat treatment unit which heats a substrate having an oxide on a surface thereof to modify the surface; a treatment liquid supply unit which supplies a treatment liquid to the modified surface of the substrate to clean the surface; and a hydrophobizing agent supply unit which supplies a hydrophobizing agent to the cleaned surface of the substrate to hydrophobize the surface of the substrate.

In still another embodiment of the present invention, the heat treatment unit heats the substrate so as to remove at least a portion of the oxide from the surface of the substrate by the heating.

In yet another embodiment of the present invention, the heat treatment unit heats the substrate so as to reduce unevenness attributable to the oxide on the surface of the substrate by the heating.

In further another embodiment of the present invention, the treatment liquid supply unit includes a chemical liquid supply unit which supplies a cleaning chemical liquid to the surface of the substrate, and a rinse liquid supply unit which supplies a rinse liquid to the surface of the substrate to replace the chemical liquid with the rinse liquid.

In still another embodiment of the present invention, the treatment liquid supply unit supplies a treatment liquid having a dissolved oxygen concentration of not higher than 100 ppb to the surface of the substrate.

In yet another embodiment of the present invention, the hydrophobizing agent supply unit supplies a liquid hydrophobizing agent containing a solvent and a hydrophobizing substance dissolved in the solvent. The substrate processing apparatus further includes a precedent organic solvent supply unit which supplies an organic solvent miscible with the solvent of the hydrophobizing agent to the surface of the substrate before the hydrophobization of the surface of the substrate after the cleaning of the surface of the substrate.

In further another embodiment of the present invention, the substrate processing apparatus further includes a subsequent organic solvent supply unit which supplies an organic solvent to the surface of the substrate to wash away an excess amount of the hydrophobizing agent on the substrate after the hydrophobization of the surface of the substrate.

In still another embodiment of the present invention, the organic solvent has a dissolved oxygen concentration of not higher than 100 ppb.

In yet another embodiment of the present invention, the hydrophobizing agent has a dissolved oxygen concentration of not higher than 100 ppb.

In further another embodiment of the present invention, the substrate processing apparatus further includes an atmosphere control unit which controls an atmosphere around the substrate to a low-oxygen atmosphere having a lower oxygen concentration than atmospheric air during a period in which the treatment liquid is supplied to the surface of the substrate by the treatment liquid supply unit and during a period in which the hydrophobizing agent is supplied to the surface of the substrate by the hydrophobizing agent supply unit.

In still another embodiment of the present invention, the atmosphere control unit controls the atmosphere around the substrate to a low-oxygen atmosphere having an oxygen concentration that does not permit dissolution of oxygen in the treatment liquid.

In yet another embodiment of the present invention, the substrate processing apparatus further includes a cooling unit which cools the substrate before the cleaning of the surface after the heating by the heat treatment unit.

In further another embodiment of the present invention, the substrate processing apparatus further includes a subsequent heating unit which heats the substrate to heat and dehydrate the hydrophobizing agent on the surface of the substrate after the hydrophobization of the surface.

In still another embodiment of the present invention, there is provided a substrate processing apparatus, which includes: an oxide removal unit which removes an oxide from a surface of a substrate; a treatment liquid supply unit which supplies a treatment liquid to the oxide-removed surface of the substrate to clean the surface of the substrate; a hydrophobizing agent supply unit which supplies a hydrophobizing agent to the cleaned surface of the substrate to hydrophobize the surface of the substrate; and an atmosphere control unit which controls an atmosphere around the substrate to a low-oxygen atmosphere having a lower oxygen concentration than atmospheric air during a period in which the treatment liquid is supplied to the surface of the substrate by the treatment liquid supply unit and during a period in which the hydrophobizing agent is supplied to the surface of the substrate by the hydrophobizing agent supply unit.

In yet another embodiment of the present invention, the atmosphere control unit controls the atmosphere around the substrate to a low-oxygen atmosphere having an oxygen concentration that does not permit dissolution of oxygen in the treatment liquid.

In further another embodiment of the present invention, the treatment liquid supply unit supplies a treatment liquid having a dissolved oxygen concentration of not higher than 100 ppb to the surface of the substrate.

In still another embodiment of the present invention, the oxide removal unit includes an oxide removal chemical liquid supply unit which supplies a chemical liquid to the surface of the substrate to remove the oxide.

In yet another embodiment of the present invention, the oxide removal chemical liquid supply unit supplies a chemical liquid having a dissolved oxygen concentration of not higher than 100 ppb to the surface of the substrate.

In further another embodiment of the present invention, the oxide removal unit includes a heat treatment unit which removes at least a portion of the oxide from the surface of the substrate by heating.

In still another embodiment of the present invention, the treatment liquid supply unit includes a degassing unit which degasses the treatment liquid to be supplied to the surface of the substrate to remove oxygen from the treatment liquid.

In yet another embodiment of the present invention, the treatment liquid supply unit includes a chemical liquid supply unit which supplies a cleaning chemical liquid to the surface of the substrate, and a rinse liquid supply unit which supplies a rinse liquid to the surface of the substrate to replace the chemical liquid with the rinse liquid.

In further another embodiment of the present invention, the hydrophobizing agent supply unit supplies a liquid hydrophobizing agent containing a solvent and a hydrophobizing substance dissolved in the solvent. The substrate processing apparatus further includes a precedent organic solvent supply unit which supplies an organic solvent miscible with the solvent of the hydrophobizing agent to the surface of the substrate before the hydrophobization of the surface of the substrate after the cleaning of the surface of the substrate.

In still another embodiment of the present invention, the precedent organic solvent supply unit supplies an organic solvent having a dissolved oxygen concentration of not higher than 100 ppb.

In yet another embodiment of the present invention, the hydrophobizing agent supply unit supplies a liquid hydrophobizing agent having a dissolved oxygen concentration of not higher than 100 ppb.

In further another embodiment of the present invention, the substrate processing apparatus further includes a subsequent organic solvent supply unit which supplies an organic solvent to the surface of the substrate to wash away an excess amount of the hydrophobizing agent on the substrate after the hydrophobization of the surface of the substrate.

In still another embodiment of the present invention, the atmosphere control unit includes a shield which is opposed to the surface of the substrate, a shield placement unit which places the shield in a position close to the surface of the substrate in opposed relation to the surface of the substrate, and an inert gas supply unit which supplies an inert gas between the shield and the surface of the substrate.

In yet another embodiment of the present invention, the shield includes an opposing portion to be opposed to the surface of the substrate, and an annular extension portion connected to a peripheral portion of the opposing portion to surround a periphery of the substrate. The extension portion is opposed to the periphery of the substrate when the shield is placed in the position close to the surface of the substrate by the shield placement unit.

The foregoing and other objects, features, and effects of the present invention will become more apparent from the following description of embodiments with reference to the attached drawings.

BRIEF DESCRIPTION OF DRAWINGS

FIG. 8A is a schematic sectional view for describing a chemical liquid treatment (oxide removal step, surface cleaning step).

FIG. 8C is a schematic sectional view for describing a first organic solvent treatment.

FIG. 8D is a schematic sectional view for describing a hydrophobization process.

FIG. 14B is a schematic sectional view for describing a rinsing process (surface cleaning step) to be performed after the chemical liquid treatment.

FIG. 15B is a schematic sectional view for describing a rinsing process to be performed after the chemical liquid treatment.

FIG. 18 is a diagram for describing a dehydration effect to be provided by the subsequent substrate heating process.

DESCRIPTION OF EMBODIMENTS

Embodiments of the present invention will hereinafter be described in detail with reference to the attached drawings.

FIGS. 1A to 1D are explanatory diagrams for describing a substrate processing principle according to one embodiment of the present invention. A substrate to be processed is typically a silicon wafer and, generally, a substrate having an oxidation-susceptible material, such as silicon or germanium, present in a surface thereof. For example, the substrate surface may be a surface of a silicon wafer, or may be a surface of a pattern containing an oxidation-susceptible material such as silicon.

Figure 1A:
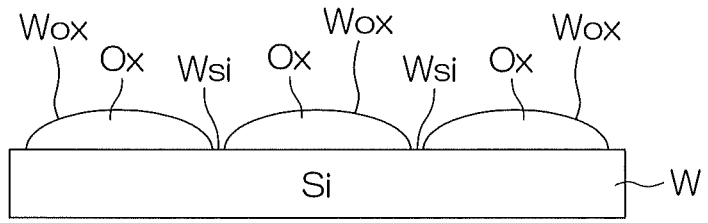
FIGS. 1A to 1D are explanatory diagrams for describing a substrate processing principle according to one embodiment of the present invention.

FIG. 1A shows a surface state of a silicon wafer W yet to be processed. The wafer W has an oxide Ox on its surface, which has unevenness attributable to the oxide Ox. The oxide Ox may be a natural oxide, or may be an oxide generated by a chemical reaction with a chemical liquid. Therefore, the surface of the wafer W includes silicon exposed portions Wsi in which silicon as a substrate material is exposed, and oxide portions Wox which are surfaces of the oxide Ox.

Figure 1B:
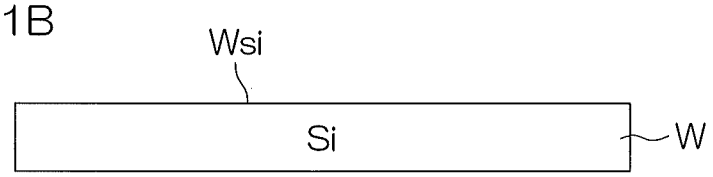
Figure 1C:
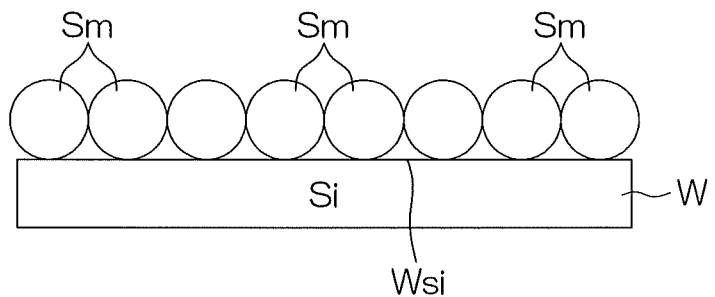
Figure 1D:
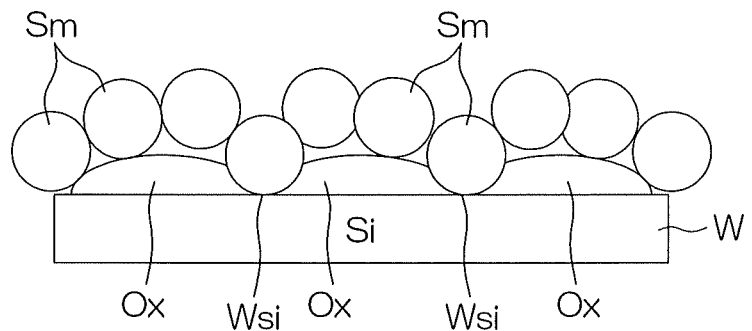

It is supposed that, where a hydrophobization process is performed by supplying a hydrophobizing agent to the wafer W having the surface state of FIG. 1A, i.e., having the surface unevenness attributable to the oxide Ox, the surface is modified into a state as shown in FIG. 1D. That is, functional groups (e.g., silanol groups) of a hydrophobizing substance Sm are bonded to OH groups (hydroxy groups) in the silicon exposed portions Wsi or OH groups in the surfaces of the oxide Ox, and molecules of the hydrophobizing substance Sm are bonded to each other. Thus, a hydrophobic film is formed over the silicon exposed portions Wsi and the oxide portions Wox. Since the molecules of the hydrophobizing substance Sm are relatively large, the surface of the hydrophobic film has unevenness greater than that of the original surface of the wafer W, resulting in an aggravated surface roughness. Therefore, the liquid contact angle is not sufficiently large, failing to provide a sufficient hydrophobicity. In addition, there is a possibility that the enhanced roughness is detected as particles when the substrate surface is observed by a particle counter.

In this exemplary process, an oxide removal process for removal of the oxide Ox is performed as a surface modification process on the wafer W of FIG. 1A. The oxide removal process may be a thermal removal process (an example of the thermal modification process) for removing the oxide Ox by heating the wafer W, or may be a chemical removal process for removing the oxide Ox by supplying a chemical liquid to the surface of the wafer W. Thus, as shown in FIG. 1B, the surface of the wafer W is substantially entirely modified into a silicon exposed portion Wsi due to exposure of the substrate material, whereby the roughness of the surface of the wafer W is improved or reduced. Where the hydrophobization process is performed by supplying the hydrophobizing agent to the surface of the wafer W in this state, the functional groups of the hydrophobizing substance Sm are uniformly bonded to the OH groups of the silicon exposed portion Wsi on substantially the entire surface of the wafer W as shown in FIG. 1C. As a result, the molecules of the hydrophobizing substance Sm are uniformly arranged along the surface of the wafer W, whereby the surface is hydrophobized without unevenness. The surface thus hydrophobized has a large liquid contact angle and, hence, a sufficient hydrophobicity and, in addition, is free from the unevenness that may be detected as particles.

The oxide Ox on the wafer W is not necessarily required to be completely removed, but may be partly removed from the wafer W to improve reduce the roughness, followed by the hydrophobization process.

Figure 2A:
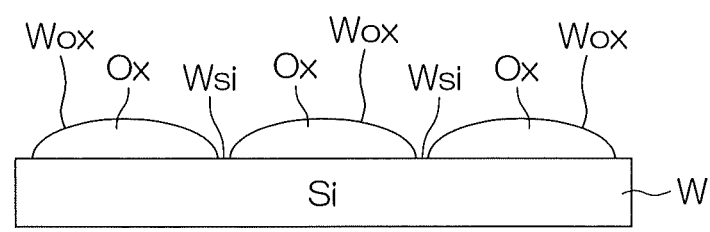
FIGS. 2A to 2C are explanatory diagrams for describing another substrate processing principle according to the embodiment of the present invention.
Figure 2B:
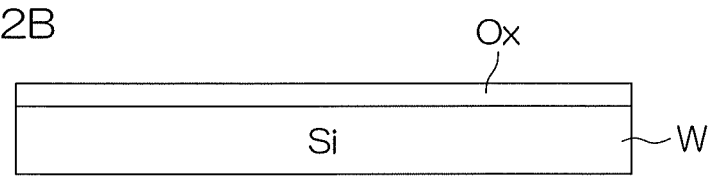
Figure 2C:
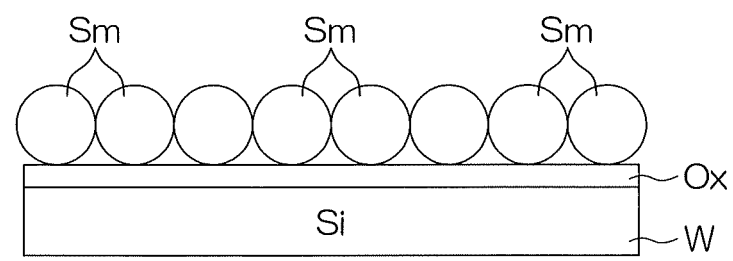

FIGS. 2A to 2C are explanatory diagrams for describing another substrate processing principle according to the embodiment of the present invention. FIG. 2A is similar to FIG. 1A, showing a surface state of a silicon wafer W yet to be processed.

In this example, a process for planarizing the oxide Ox is performed as a surface modification process (thermal modification process) on the wafer W of FIG. 2A (planarization step). More specifically, the oxide Ox is decomposed and recombined by performing a proper heating process on the wafer W. Thus, as shown in FIG. 2B, the surface state of the wafer W is such that the oxide Ox is formed as having a uniform thickness on substantially the entire surface of the wafer W, whereby the roughness of the surface of the wafer W is improved or reduced. Where the hydrophobization process is performed by supplying the hydrophobizing agent to the surface of the wafer W in this state, the functional groups of the hydrophobizing substance Sm are uniformly bonded to the OH groups of the oxide portion Wox on substantially the entire surface of the wafer W as shown in FIG. 2C.

As a result, the molecules of the hydrophobizing substance Sm are uniformly arranged along the surface of the wafer W, whereby the surface is hydrophobized without unevenness. The surface thus hydrophobized has a large liquid contact angle and, hence, a sufficient hydrophobicity and, in addition, is free from the unevenness that may be detected as particles.

Figure 3A:
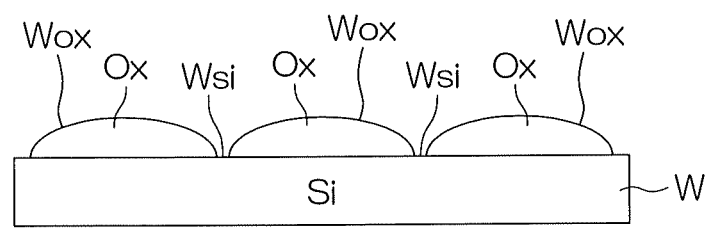
FIGS. 3A to 3D are explanatory diagrams for describing further another substrate processing principle according to the embodiment of the present invention.

FIGS. 3A to 3D are explanatory diagrams for describing further another substrate processing principle according to the embodiment of the present invention. FIG. 3A is similar to FIG. 1A, showing a surface state of a silicon wafer W yet to be processed.

In this exemplary process, a process for removing the oxide Ox is performed as a surface modification process (thermal modification process) on the wafer W of FIG. 3A (thermal removal step). Thus, as shown in FIG. 3B, the surface of the wafer W is substantially entirely modified into a silicon exposed portion Wsi due to exposure of the substrate material, whereby the roughness of the surface of the wafer W is improved or reduced.

Figure 3B:
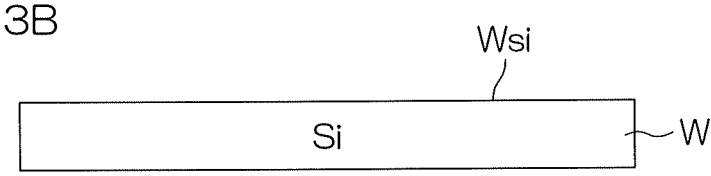
Figure 3C:
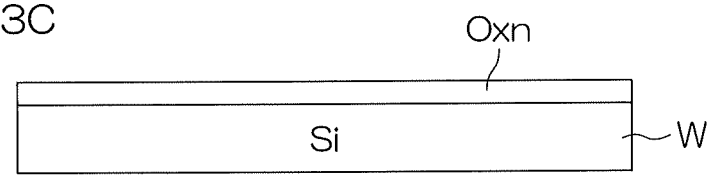

On the surface of the wafer W in this state, a new oxide film Oxn is formed as having a uniform film thickness as shown in FIG. 3C. The new oxide film Oxn may be formed by heating in an oxygen-containing atmosphere (an example of the thermal modification step).

Figure 3D:
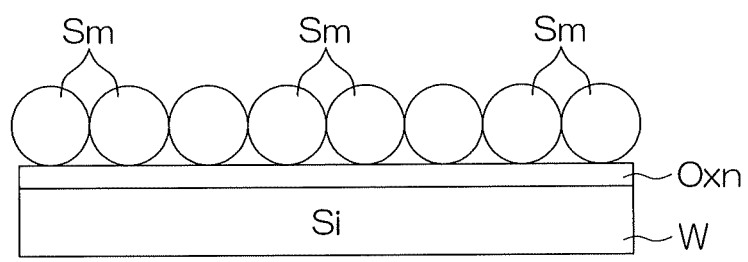

The new oxide film Oxn thus formed has a surface having an improved or reduced roughness that follows the roughness of the silicon exposed portion Wsi having a state of FIG. 3B. Where the hydrophobization process is performed by supplying the hydrophobizing agent to the surface of the wafer W in this state, i.e., to the surface of the new oxide film Oxn, the functional groups of the hydrophobizing substance Sm are uniformly bonded to the OH groups of the new oxide film Oxn on substantially the entire surface of the wafer W as shown in FIG. 3D.

As a result, the molecules of the hydrophobizing substance Sm are uniformly arranged along the surface of the wafer W, whereby the surface is hydrophobized without unevenness. The surface thus hydrophobized has a large liquid contact angle and, hence, a sufficient hydrophobicity and, in addition, is free from the unevenness that may be detected as particles.

Figure 4:
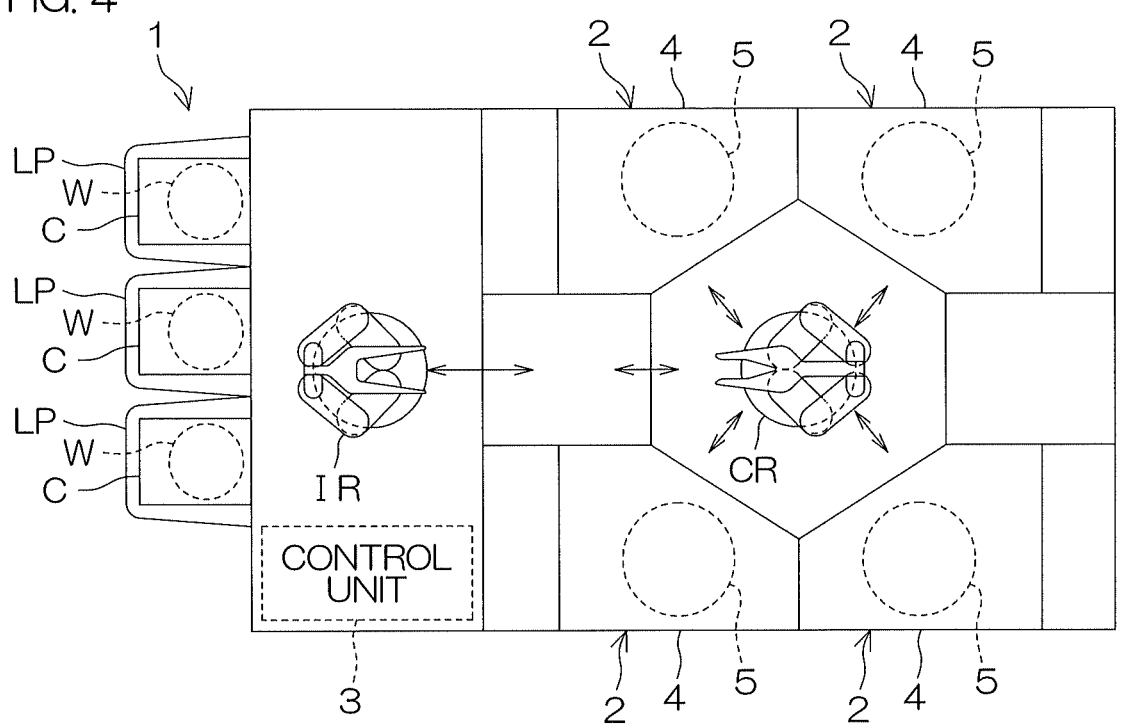
FIG. 4 is a schematic plan view for describing the inside layout of a substrate processing apparatus according to the embodiment of the present invention.

FIG. 4 is a schematic plan view for describing the inside layout of a substrate processing apparatus 1 according to the embodiment of the present invention. The substrate processing apparatus 1 is an apparatus of a single-wafer processing type for processing a single silicon wafer W (an example of the substrate) at a time. In this embodiment, the wafer W is a disk-shaped substrate. The substrate processing apparatus 1 includes: a plurality of treatment units 2 which each treat a wafer W with a treatment liquid; load ports LP which each retain thereon a carrier C accommodating a plurality of wafers W to be treated by the treatment units 2; transport robots IR and CR which transport the wafers W between the load ports LP and the treatment units 2; and a control unit 3 which controls the substrate processing apparatus 1. The transport robot IR transports the wafers W between the carriers C and the transport robot CR. The transport robot CR transports the wafers W between the transport robot IR and the treatment units 2. The treatment units 2 have, for example, the same construction.

Figure 5:
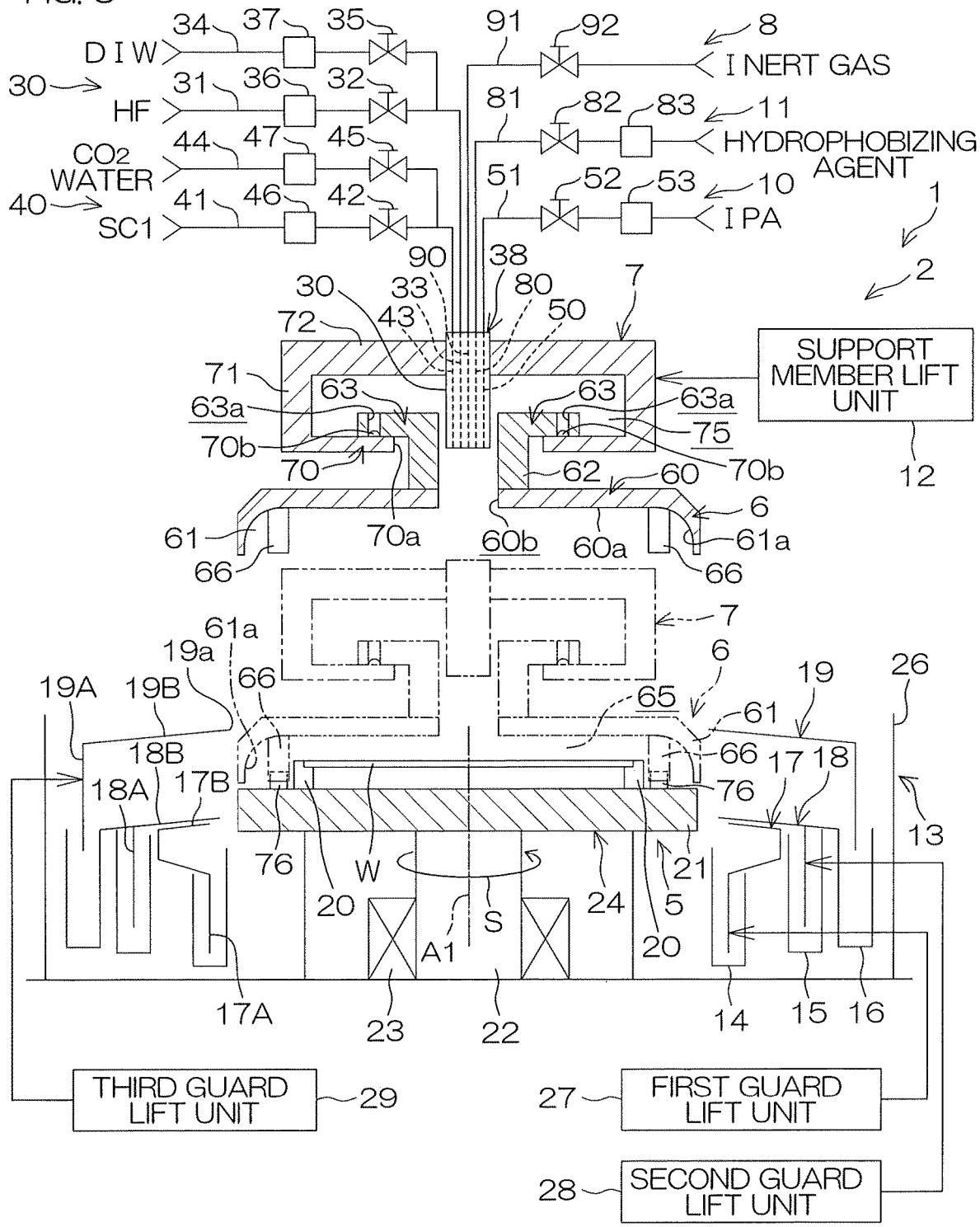
FIG. 5 is a schematic sectional view for describing the construction of a treatment unit provided in the substrate processing apparatus by way of example.

FIG. 5 is a schematic sectional view for describing the construction of the treatment units 2 by way of example. The treatment units 2 each include a chamber 4 (see FIG. 4), a spin chuck 5, an opposing member 6, a support member 7, an inert gas supply unit 8, a first treatment liquid supply unit 30, a second treatment liquid supply unit 40, an organic solvent supply unit 10, a hydrophobizing agent supply unit 11, a support member lift unit 12, and a treatment cup 13.

The spin chuck 5 rotates a single wafer W about a vertical rotation axis A1 extending through a center portion of the wafer W while holding the wafer W in a horizontal posture. The spin chuck 5 is housed in the chamber 4 (see FIG. 4). The chamber 4 has a port (not shown) through which the wafer W is loaded into the chamber 4 and unloaded out of the chamber 4. The chamber 4 includes a shutter unit (not shown) which opens and closes the port.

The spin chuck 5 includes a substrate holding unit 24, a rotary shaft 22, and an electric motor 23. The substrate holding unit 24 horizontally holds the wafer W. The substrate holding unit 24 includes a spin base 21 and a plurality of chuck pins 20. The spin base 21 has a disk shape extending horizontally. The chuck pins 20 are disposed in circumferentially spaced relation on an upper surface of the spin base 21. The rotary shaft 22 is connected to the center of a lower surface of the spin base 21. The rotary shaft 22 extends vertically along the rotation axis A1. The electric motor 23 applies a torque to the rotary shaft 22. The rotary shaft 22 is rotated by the electric motor 23, whereby the spin base 21 of the substrate holding unit 24 is rotated. Thus, the wafer W is rotated in a rotation direction S about the rotation axis A1. The electric motor 23 constitutes a substrate rotation unit which rotates the wafer W about the rotation axis A1.

The opposing member 6 has a generally round shape as seen in plan. The rotation axis A1 is a vertical axis extending through the center of the opposing member 6. In this embodiment, the opposing member 6 is made of a resin. Examples of the resin for the opposing member 6 include PEEK (polyether ether ketone) and the like. The opposing member 6 is an example of the shield which shields the atmosphere of a space 65 defined between the opposing member 6 and an upper surface of the wafer W from an ambient atmosphere.

The opposing member 6 is engageable with the substrate holding unit 24, for example, by magnetic force. More specifically, the opposing member 6 includes a plurality of first engagement portions 66. The first engagement portions 66 each extend downward from an opposing surface 60a of an opposing portion 60. The first engagement portions 66 are spaced from each other in the rotation direction S. The substrate holding unit 24 includes a plurality of second engagement portions 76 engageable in projection-and-recess fit with the first engagement portions 66. The second engagement portions 76 are spaced from each other in the rotation direction S, and fixed to the spin base 21.

With the first engagement portions 66 of the opposing member 6 respectively in engagement with the second engagement portions 76 of the substrate holding unit 24, the opposing member 6 is rotatable together with the substrate holding unit 24. With the opposing member 6 in engagement with the substrate holding unit 24, the electric motor 23 rotates the spin base 21, whereby the opposing member 6 is rotated together with the substrate holding unit 24. That is, the electric motor 23 also functions as an opposing member rotation unit which rotates the opposing member 6 about the rotation axis A1.

The opposing member 6 includes the opposing portion 60, an extension portion 61, a tubular portion 62, and a plurality of flange portions 63. The opposing portion 60 is opposed to the upper surface of the wafer W from above. The opposing portion 60 has a disk shape. The opposing portion 60 is disposed generally horizontally above the spin chuck 5. The opposing portion 60 has the opposing surface 60a, which is opposed to the upper surface of the wafer W. The opposing surface 60a is a lower surface of the opposing portion 60. The extension portion 61 extends downward from a peripheral portion of the opposing portion 60, and has an annular shape about the rotation axis A1. An inner peripheral surface 61a of the extension portion 61 is a tapered surface inclined downward outward radially about the rotation axis A1 with respect to the vertical direction. An outer peripheral surface of the extension portion 61 extends vertically.

In the following description, "inward radially about the rotation axis A1" is referred to simply as "radially inward" and "outward radially about the rotation axis A1" is referred to simply as "radially outward." With the opposing member 6 in engagement with the substrate holding unit 24, the extension portion 61 surrounds the wafer W radially inward of a first guard 17, and is opposed to a periphery of the wafer W from a lateral side (a radially outward side) (as shown by a two-dot-and-dash line in FIG. 5).

The tubular portion 62 is fixed to an upper surface of the opposing portion 60. The flange portions 63 are disposed on an upper end of the tubular portion 62, and spaced from each other circumferentially of the tubular portion 62 (in the rotation direction S). The flange portions 63 each extend horizontally from the upper end of the tubular portion 62.

The treatment liquid to be used in the substrate processing apparatus 1 includes a chemical liquid, a rinse liquid, an organic solvent, a hydrophobizing agent, and the like.

The first treatment liquid supply unit 30 and the second treatment liquid supply unit 40 each supply a chemical liquid and a rinse liquid (treatment liquid) to a center region of the upper surface of the wafer W. The center region of the upper surface of the wafer W is a region around the center of the upper surface of the wafer W including a position at which the rotation axis A1 intersects the upper surface of the wafer W.

The first treatment liquid supply unit 30 includes: a treatment liquid nozzle 33 from which a treatment liquid is spouted toward the center region of the upper surface of the wafer W; a chemical liquid supply pipe 31 connected to the treatment liquid nozzle 33; a rinse liquid supply pipe 34 connected to the treatment liquid nozzle 33; a chemical liquid valve 32 provided in the chemical liquid supply pipe 31; and a rinse liquid valve 35 provided in the rinse liquid supply pipe 34. An acid chemical liquid such as hydrofluoric acid (hydrogen fluoride: HF), for example, is supplied from a chemical liquid supply source to the chemical liquid supply pipe 31. The chemical liquid valve 32 opens and closes a flow path in the chemical liquid supply pipe 31. A rinse liquid such as DIW (deionized water) is supplied from a rinse liquid supply source to the rinse liquid supply pipe 34. The rinse liquid valve 35 opens and closes a flow path in the rinse liquid supply pipe 34. In this embodiment, the first treatment liquid supply unit 30 (particularly, a portion thereof related to the supply of the chemical liquid) is an example of the oxide removal chemical liquid supply unit which supplies the chemical liquid for removing the oxide from the surface of the wafer W and, therefore, is also an example of the oxide removal unit. Further, a portion of the first treatment liquid supply unit 30 related to the supply of the rinse liquid is an example of a treatment liquid cleaning unit which cleans the surface of the wafer W.

The second treatment liquid supply unit 40 includes: a treatment liquid nozzle 43 from which a treatment liquid is spouted toward the center region of the upper surface of the wafer W; a chemical liquid supply pipe 41 connected to the treatment liquid nozzle 43; a rinse liquid supply pipe 44 connected to the treatment liquid nozzle 43; a chemical liquid valve 42 provided in the chemical liquid supply pipe 41; and a rinse liquid valve 45 provided in the rinse liquid supply pipe 44. An alkali chemical liquid such as SC1 (liquid mixture of ammonia and hydrogen peroxide water), for example, is supplied from a chemical liquid supply source to the chemical liquid supply pipe 41. The chemical liquid valve 42 opens and closes a flow path in the chemical liquid supply pipe 41. A rinse liquid such as $CO_2$ water (carbonated water) is supplied from a rinse liquid supply source to the rinse liquid supply pipe 44. The rinse liquid valve 45 opens and closes a flow path in the rinse liquid supply pipe 44. In this embodiment, the second treatment liquid supply unit 40 is an example of the treatment liquid supply unit which supplies the treatment liquid to the surface of the wafer W to clean the surface of the wafer W. In particular, a portion of the second treatment liquid supply unit 40 related to the supply of the chemical liquid constitutes the chemical liquid supply unit, and a portion of the second treatment liquid supply unit 40 related to the supply of the rinse liquid constitutes the rinse liquid supply unit.

The exemplary chemical liquids are not limited to hydrofluoric acid and SC1. The chemical liquids to be spouted from the treatment liquid nozzles 33, 43 may each be a liquid containing at least one of sulfuric acid, acetic acid, nitric acid, hydrochloric acid, hydrofluoric acid, buffered hydrofluoric acid (BHF), diluted hydrofluoric acid (DHF), ammonia water, hydrogen peroxide water, an organic alkali (e.g., TMAH: tetramethylammonium hydroxide), a surfactant, and a corrosion inhibitor. Examples of a chemical liquid obtained by mixing any of these agents include SPM (liquid mixture of sulfuric acid and hydrogen peroxide water), SC1 (liquid mixture of ammonia and hydrogen peroxide water), and SC2 (liquid mixture of hydrochloric acid and hydrogen peroxide water). Where the acid chemical liquid and the alkali chemical liquid are used, however, it is preferred to supply these chemical liquids respectively from the first and second treatment liquid supply units 30, 40 so as to prevent these chemical liquids from being mixed together.

The rinse liquids to be spouted from the treatment liquid nozzles 33, 43 are not limited to DIW and $CO_2$ water. Examples of the rinse liquids to be spouted from the treatment liquid nozzles 33, 43 include electrolytic ion water, ozone water, ammonia water, a hydrochloric acid aqueous solution having a dilute concentration (e.g., about 10 ppm to about 100 ppm), and reduced water (hydrogen water). The rinse liquid contains water.

The organic solvent supply unit 10 is a unit which supplies an organic solvent to the center region of the upper surface of the wafer W. The organic solvent supply unit 10 includes: an organic solvent nozzle 50 from which the organic solvent is spouted toward the center region of the upper surface of the wafer W; an organic solvent supply pipe 51 connected to the organic solvent nozzle 50; and an organic solvent valve 52 provided in the organic solvent supply pipe 51. The organic solvent, e.g., IPA or the like, is supplied from an organic solvent supply source to the organic solvent supply pipe 51. The organic solvent valve 52 opens and closes a flow path in the organic solvent supply pipe 51. In this embodiment, the organic solvent supply unit 10 is an example of the precedent organic solvent supply unit which supplies the organic solvent before the surface of the wafer W is hydrophobized, and an example of the subsequent organic solvent supply unit which supplies the organic solvent after the surface of the wafer W is hydrophobized.

The organic solvent to be spouted from the organic solvent nozzle 50 is not limited to IPA. The organic solvent to be spouted from the organic solvent nozzle 50 may be an organic solvent, other than IPA, that is chemically unreactive (or, more precisely, has a poorer reactivity) with the upper surface of the wafer W and a pattern (not shown) formed on the wafer W. More specifically, the organic solvent to be spouted from the organic solvent nozzle 50 may be an organic solvent containing at least one of IPA, HFE (hydrofluoroether), methanol, ethanol, acetone, and trans-1,2-dichloroethylene. However, the organic solvent to be supplied from the organic solvent nozzle 50 is preferably an organic solvent miscible (i.e., compatible) with a solvent of a hydrophobizing agent to be supplied from the hydrophobizing agent supply unit 11. Further, the organic solvent to be supplied from the organic solvent nozzle 50 is preferably an organic solvent miscible (i.e., compatible) with the rinse liquids (DIW, $CO_2$ water, and the like) to be supplied from the treatment liquid supply units 30, 40.

The hydrophobizing agent supply unit 11 is a unit which supplies a liquid hydrophobizing agent to the center region of the upper surface of the wafer W. The hydrophobizing agent supply unit 11 includes: a hydrophobizing agent nozzle 80 from which the hydrophobizing agent is spouted toward the center region of the upper surface of the wafer W; a hydrophobizing agent supply pipe 81 connected to the hydrophobizing agent nozzle 80; and a hydrophobizing agent valve 82 provided in the hydrophobizing agent supply pipe 81. The liquid hydrophobizing agent is supplied from a hydrophobizing agent supply source to the hydrophobizing agent supply pipe 81. The hydrophobizing agent valve 82 opens and closes a flow path in the hydrophobizing agent supply pipe 81.

The hydrophobizing agent to be spouted from the hydrophobizing agent nozzle 80 is a liquid obtained by dissolving a hydrophobizing substance in a solvent. Usable examples of the hydrophobizing agent include a silicon hydrophobizing agent which hydrophobizes silicon per se or a silicon-containing compound, and a metal hydrophobizing agent which hydrophobizes a metal per se or a metal-containing compound. The metal hydrophobizing agent contains, for example, at least one of an amine having a hydrophobic group and an organic silicon compound as the hydrophobizing substance. The silicon hydrophobizing agent is, for example, a silane coupling agent. The silane coupling agent contains, for example, at least one of HMDS (hexamethyldisilazane), TMS (tetramethylsilane), fluorinated alkylchlorosilanes, alkyldisilazanes, and chlorine-free hydrophobizing agents as the hydrophobizing substance. The chlorine-free hydrophobizing agent contains, for example, at least one of dimethylsilyldimethylamine, dimethylsilyldiethylamine, hexamethyldisilazane, tetramethyldisilazane, bis(dimethylamino)dimethylsilane, N,N-dimethylaminotrimethylsilane, N-(trimethylsilyl)dimethylamine, and organosilane compounds as the hydrophobizing substance. The solvent for dissolving the hydrophobizing substance may be at least one selected from aliphatic hydrocarbons, aromatic hydrocarbons, esters, alcohols, ethers, and the like. More specifically, the solvent may be at least one selected from the group consisting of methanol, ethanol, IPA, butanol, ethylene glycol, propylene glycol, NMP (N-methyl-2-pyrrolidone), DMF (N,N-dimethylformamide), DMA (dimethylacetamide), DMSO (dimethyl sulfoxide), hexane, toluene, PGMEA (propylene glycol monomethyl ether acetate), PGME (propylene glycol monomethyl ether), PGPE (propylene glycol monopropyl ether), PGEE (propylene glycol monoethyl ether), GBL (γ-butyrolactone), acetylacetone, 3-pentanone, 2-heptanone, ethyl lactate, cyclohexanone, dibutyl ether, HFE (hydrofluoroether), ethyl nonafluoroisobutyl ether, and ethyl nonafluorobutyl ether, and m-xylene hexafluoride.

Degassing units are provided for reducing the amounts of oxygen dissolved in the treatment liquids (the chemical liquids, the rinse liquids, the organic solvent, and the hydrophobizing agent) to be supplied to the wafer W. That is, degassing units 36, 46, 37, 47, 53, 83 are provided in the chemical liquid supply pipes 31, 41, the rinse liquid supply pipes 34, 44, the organic solvent supply pipe 51, and the hydrophobizing agent supply pipe 81, respectively. Therefore, the treatment liquids each having a reduced dissolved oxygen amount are supplied to the surface of the wafer W. The degassing units may be provided in the respective treatment liquid supply sources. The degassing units may be each constructed so that oxygen dissolved in the treatment liquid is expelled by introducing an inert gas into the treatment liquid (e.g., by bubbling).

The inert gas supply unit 8 includes: an inert gas nozzle 90 from which an inert gas is spouted toward the center region of the upper surface of the wafer W; an inert gas supply pipe 91 connected to the inert gas nozzle 90; and an inert gas valve 92 provided in the inert gas supply pipe 91. The inert gas, e.g., nitrogen gas or the like, is supplied from an inert gas supply source to the inert gas supply pipe 91. The inert gas valve 92 opens and closes a flow path in the inert gas supply pipe 91.

In this embodiment, the treatment liquid nozzles 33, 43, the organic solvent nozzle 50, the hydrophobizing agent nozzle 80, and the inert gas nozzle 90 are housed together in a nozzle housing member 38. A lower end of the nozzle housing member 38 is opposed to the center region of the upper surface of the wafer W.

The support member 7 includes: an opposing member support portion 70 which supports the opposing member 6; a nozzle support portion 72 provided above the opposing member support portion 70 and supporting the nozzle housing member 38; and a wall portion 71 extending vertically to connect the opposing member support portion 70 to the nozzle support portion 72. A space 75 is defined by the opposing member support portion 70, the wall portion 71, and the nozzle support portion 72. The space 75 houses an upper end portion of the tubular portion 62 and the flange portions 63. The opposing member support portion 70 serves as a lower wall of the support member 7. The nozzle support portion 72 serves as an upper wall of the support member 7. The nozzle housing member 38 is attached to a generally center portion of the nozzle support portion 72. A distal end of the nozzle housing member 38 is located below the nozzle support portion 72. Spouts of the nozzles 33, 43, 50, 80, 90 are disposed at the lower end of the nozzle housing member 38 to be directed downward. These spouts are opposed to the center region of the wafer W from the vertically upward side through an inside space of the tubular portion 62 of the opposing member 6 and a through-hole 60*b* formed in the center of the opposing portion 60.

The opposing member support portion 70 supports the opposing member 6 (more specifically, the flange portions 63) from below. A tubular portion insertion hole 70*a* through which the tubular portion 62 is inserted is provided in a center portion of the opposing member support portion 70. The flange portions 63 each have a positioning hole 63*a* vertically extending therethrough. The opposing member support portion 70 has engagement projections 70*b* which are engageable with the positioning holes 63*a* of the respective flange portions 63. With the engagement projections 70*b* in engagement with the respective positioning holes 63*a*, the opposing member is positioned with respect to the support member in the rotation direction S.

The support member lift unit 12 moves up and down the opposing member 6 together with the support member 7. The support member lift unit 12 functions as an opposing member lift unit for moving up and down the opposing member 6. Therefore, the support member lift unit 12 has a function as the shield placement unit which places the opposing member 6 serving as the shield in a position close to the surface of the wafer W in opposed relation to the surface of the wafer W. The support member lift unit 12 includes, for example, a ball screw mechanism (not shown) and an electric motor (not shown) which applies a driving force to the ball screw mechanism.

The support member lift unit 12 is capable of positioning the support member 7 at a predetermined height position between an upper position and a lower position. The lower position is a position where the support member 7 is closest to the upper surface of the substrate holding unit 24 in a movable range of the support member 7. The upper position is a position shown by a solid line in FIG. 5. More specifically, the upper position is a position where the support member 7 is most distant from the upper surface of the substrate holding unit 24 in the movable range of the support member 7.

The support member 7 suspends and supports the opposing member 6 when being located in the upper position. In this state, the opposing member 6 is spaced upward from the substrate holding unit 24. The support member 7 passes through an engagement position between the upper position and the lower position when being moved up and down by the support member lift unit 12. The engagement position is a position shown by a two-dot-and-dash line in FIG. 5. The engagement position is a height position at which the support member 7 is located when the opposing member 6 is supported by the support member 7 from below and engaged with the substrate holding unit 24. The support member 7 is spaced downward from the opposing member 6 engaged with the substrate holding unit 24 when being located in the lower position.

When the support member 7 is moved up and down between the upper position and the engagement position, the opposing member 6 is moved up and down together with the support member 7. The support member 7 is spaced downward from the opposing member 6 when being located in a position between the engagement position and the lower position. The opposing member 6 is kept in engagement with the substrate holding unit 24 when the support member 7 is located in a position between the engagement position and the lower position.

The treatment cup 13 is disposed radially outward of the wafer W held by the spin chuck 5. The treatment cup 13 includes an exhaust tub 26, a plurality of cups 14 to 16, a plurality of guards 17 to 19, and a plurality of guard lift units 27 to 29. The cups include a first cup 14, a second cup 15, and a third cup 16. The guards include a first guard 17, a second guard 18, and a third guard 19. The guard lift units include a first guard lift unit 27, a second guard lift unit 28, and a third guard lift unit 29.

The exhaust tub 26 surrounds the spin chuck 5. An exhaust pipe (not shown) for expelling air flowing into the chamber 4 (see FIG. 4) to the outside of the chamber 4 is connected to the exhaust tub 26. The cups 14 to 16 and the guards 17 to 19 are disposed between the spin chuck 5 and the exhaust tub 26. The cups 14 to 16 each surround the wafer W. The guards 17 to 19 each surround the wafer W.

The guards 17 to 19 each receive the treatment liquid scattered radially outward from the wafer W held by the spin chuck 5. The second guard 18 is disposed radially outward of the first guard 17. The third guard 19 is disposed radially outward of the second guard 18.

The first guard 17 includes: a first tubular portion 17A disposed radially inward of the exhaust tub 26 to surround the spin chuck 5; and a first tilt portion 17B extending from the first tubular portion 17A so as to be directed upward radially inward. The second guard 18 includes: a second tubular portion 18A disposed radially inward of the exhaust tub 26 and radially outward of the first tubular portion 17A to surround the spin chuck 5; and a second tilt portion 18B extending upward radially inward from the second tubular portion 18A. The third guard 19 includes: a third tubular portion 19A disposed radially inward of the exhaust tub 26 and radially outward of the second tubular portion 18A to surround the spin chuck 5; and a third tilt portion 19B extending upward radially inward from the third tubular portion 19A.

The first tilt portion 17B is opposed to the second tilt portion 18B from below. The second tilt portion 18B is opposed to the third tilt portion 19B from below.

The cups 14 to 16 each have an upwardly open annular channel. The second cup 15 is disposed radially outward of the first cup 14. The third cup 16 is disposed radially outward of the second cup 15. The third cup 16 is integral with the second guard 18. Recovery pipes (not shown) or drainpipes (not shown) are connected to the channels of the respective cups 14 to 16. The treatment liquids are received by the corresponding guards 17 to 19 to be guided to bottoms of the respective cups 14 to 16. The treatment liquids guided to the bottoms of the respective cups 14 to 16 are each recovered or drained through the recovery pipe or the drainpipe.

The guard lift units 27 to 29 respectively drive the guards 17 to 19 to move up and down the guards 17 to 19. The guard lift units 27 to 29 each include, for example, a ball screw mechanism (not shown) and an electric motor (not shown) which applies a driving force to the ball screw mechanism.

Figure 6:
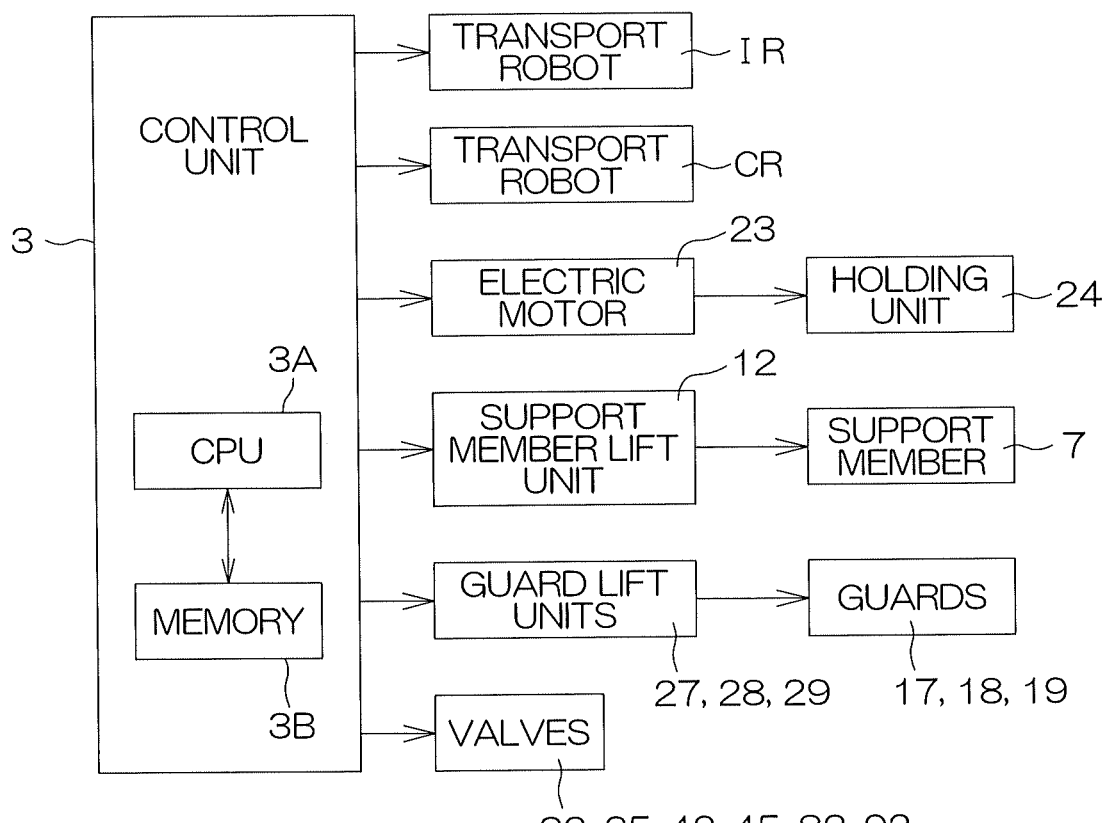
FIG. 6 is a block diagram for describing the electrical configuration of major portions of the substrate processing apparatus.

FIG. 6 is a block diagram for describing the electrical configuration of major portions of the substrate processing apparatus 1. The control unit 3 includes a microcomputer, and controls control objects provided in the substrate processing apparatus 1 according to a predetermined program. More specifically, the control unit 3 includes a processor (CPU) 3A and a memory 3B which stores the program, and is configured so that the processor 3A executes the program to control various processes for the substrate processing. Particularly, the control unit 3 controls operations of the transport robots IR, CR, the electric motor 23, the support member lift unit 12, the guard lift units 27 to 29, and the valves 32, 35, 42, 45, 52, 82, 92.

Figure 7A:
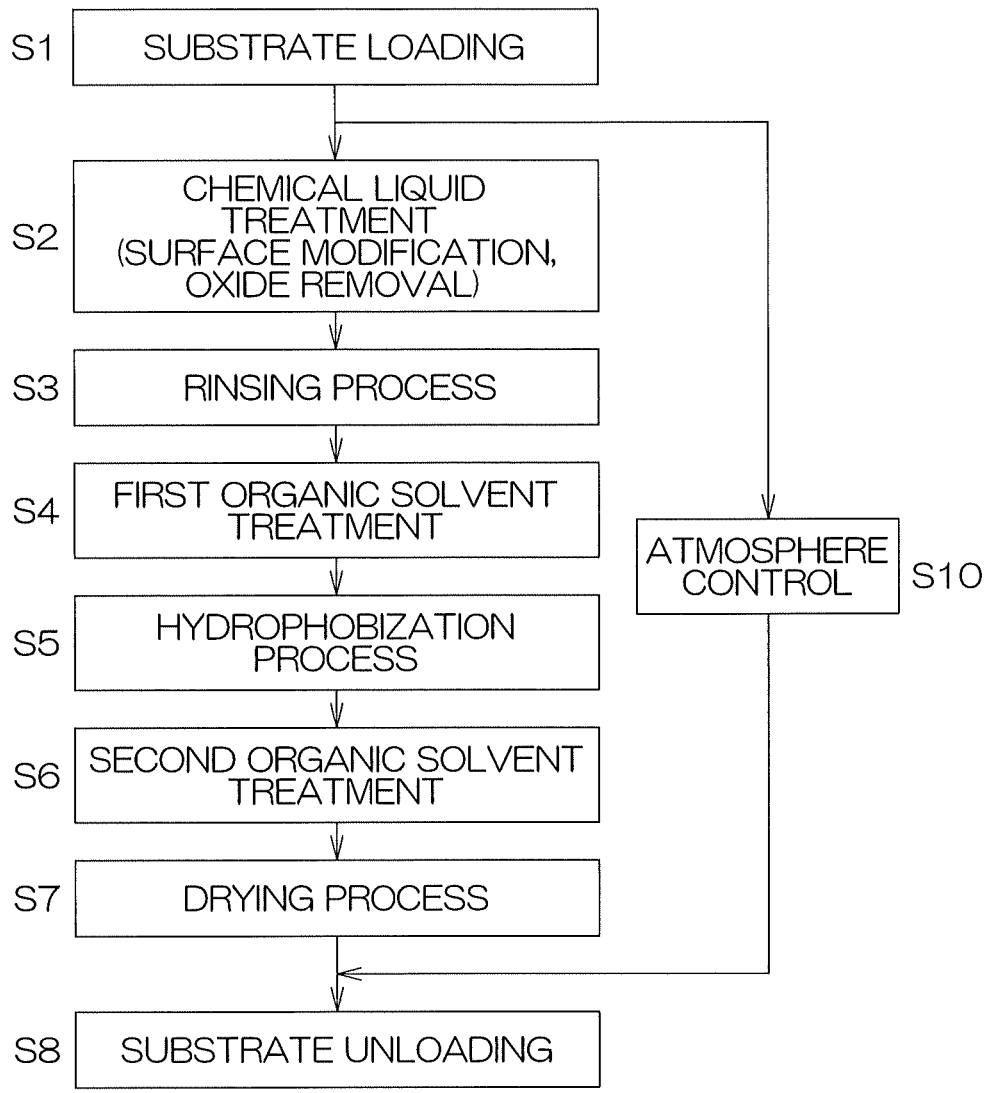
FIG. 7A is a flowchart for describing an exemplary substrate processing process to be performed by the substrate processing apparatus.

FIG. 7A is a flowchart for describing an exemplary substrate processing process to be performed by the substrate processing apparatus 1, mainly showing a process to be performed according to the program executed by the control unit 3. FIGS. 8A to 8E are schematic sectional views for describing the exemplary substrate processing process.

In the substrate processing process, as shown in FIG. 7A, a substrate loading step (S1), a chemical liquid treatment (S2), a rinsing process (S3), a first organic solvent treatment (S4), a hydrophobization process (S5), a second organic solvent treatment (S6), a drying process (S7), and a substrate unloading step (S8), for example, are performed in this order by the substrate processing apparatus 1.

Before the wafer W is loaded into the treatment unit 2, a positional relationship between the opposing member 6 and the substrate holding unit 24 with respect to the rotation direction S is first adjusted so that the opposing member 6 can be engaged with the substrate holding unit 24. More specifically, the electric motor 23 adjusts the position of the substrate holding unit 24 with respect to the rotation direction S so that the first engagement portions 66 of the opposing member 6 respectively overlap the second engagement portions 76 of the substrate holding unit 24 as seen in plan.

On the other hand, an untreated wafer W is transported from a carrier C to a treatment unit 2 by the transport robots IR, CR, and transferred to the spin chuck 5 (S1: substrate loading). Thereafter, the wafer W is horizontally held and spaced upward from the upper surface of the spin base 21 by the chuck pins 20 (substrate holding step), until the wafer W is unloaded by the transport robot CR.

Then, the support member lift unit 12 moves down the support member 7 from the upper position toward the lower position. The support member 7 passes through the engagement position before reaching the lower position. When the support member 7 reaches the engagement position, the opposing member 6 is engaged with the substrate holding unit 24 by magnetic force. Thus, the opposing member 6 is supported from below by the substrate holding unit 24 located at the fixed height position. With the opposing member 6 in engagement with the substrate holding unit 24, the opposing portion 60 of the opposing member 6 is located close to the upper surface of the wafer W to be opposed to the upper surface of the wafer W from above. On the other hand, the extension portion 61 of the opposing member 6 is opposed to the wafer W from the radially outside to surround the periphery of the wafer W. With the opposing member 6 in engagement with the substrate holding unit 24, a lower end portion of the extension portion 61 is opposed to the spin base 21 from above. A slight gap is provided between the lower end portion of the extension portion 61 and the upper surface of the spin base 21. Thus, the support member lift unit 12 places the opposing member 6 in a position where the inner peripheral surface of the extension portion 61 is opposed to the wafer W from the radially outside (shield placement step).

When the support member 7 is further moved down from the engagement position, the opposing member 6 is no longer supported by the support member 7. More specifically, the opposing member support portion 70 of the support member 7 is retreated downward from the flange portions 63 of the opposing member 6.

Then, as shown in FIG. 8A, the support member 7 reaches the lower position. Subsequently, the electric motor 23 is driven to start the rotation of the spin base 21 of the substrate holding unit 24. Thus, the horizontally held wafer W is rotated (substrate rotation step). The first engagement portions 66 of the opposing member 6 are engaged with the second engagement portions 76 provided on the spin base 21. Therefore, the opposing member 6 is rotated synchronously with the wafer W (opposing member rotation step). The synchronous rotation means rotation at the same rotation speed in the same direction.

Further, the control unit 3 opens the inert gas valve 92 to spout the inert gas from the inert gas nozzle 90 (inert gas supply step), whereby air in the treatment space 65 between the spin base 21 and the opposing portion 60 is replaced with an inert gas atmosphere. Thus, the atmosphere around the wafer W becomes a low-oxygen atmosphere having a lower oxygen concentration than the atmospheric air. In this way, an atmosphere control step (S10) of controlling the space around the wafer W to the low-oxygen atmosphere is continued until the wafer W is unloaded from the treatment unit 2.

With the low-oxygen atmosphere thus maintained, the chemical liquid treatment (S2) is started. The rotation speed of the wafer W is controlled at a chemical liquid treatment speed (e.g., 300 rpm). In the chemical liquid treatment (S2), hydrofluoric acid (HF) is supplied as the chemical liquid onto the wafer W from the treatment liquid nozzle 33, whereby the upper surface of the wafer W is subjected to etching or the like. More specifically, an oxide removal step (chemical removal step) of etching off the oxide from the surface of the wafer W is performed by the supply of hydrofluoric acid. A chemical liquid cleaning step of cleaning the surface of the wafer W may also be performed by the supply of hydrofluoric acid. Hydrofluoric acid to be supplied is a low-oxygen concentration hydrofluoric acid aqueous solution obtained by reducing the concentration of oxygen dissolved therein by the degassing unit 36. Specifically, hydrofluoric acid to be spouted from the treatment liquid nozzle 33 preferably has a dissolved oxygen concentration of not higher than 100 ppb, thereby preventing the oxidation of the surface of the wafer W attributable to the dissolved oxygen.

Referring to FIG. 8A, more specifically, the first guard lift unit 27 places the first guard 17 in a lower position, and the third guard lift unit 29 places the third guard 19 in an upper position. Then, the second guard lift unit 28 places the second guard 18 at a height position where the treatment liquid can be received (guard placement step).

In this state, the chemical liquid valve 32 is opened. Thus, the chemical liquid (hydrofluoric acid) is supplied from the treatment liquid nozzle 33 to the center region of the upper surface of the wafer W being rotated. The chemical liquid spreads over the entire upper surface of the wafer W by centrifugal force.

The chemical liquid is scattered radially outward from the wafer W by centrifugal force. The chemical liquid scattered radially outward from the wafer W reaches the inner peripheral surface 61a of the extension portion 61 of the opposing member 6 opposed to the wafer W from the radially outside. Since the opposing member 6 is rotated together with the wafer W, the chemical liquid adhering to the inner peripheral surface 61a of the extension portion 61 is scattered radially outward of the extension portion 61 by centrifugal force. The chemical liquid scattered radially outward of the extension portion 61 is received by the second guard 18. The chemical liquid received by the second guard 18 is guided to the second cup 15 along the second tubular portion 18A.

After the chemical liquid treatment (S2) is performed for a predetermined period, the rinsing process (S3) is performed. The rotation speed of the wafer W is controlled at a rinsing process speed (e.g., 300 rpm). In the rinsing process, hydrofluoric acid (chemical liquid) on the wafer W is replaced with DIW as the rinse liquid, whereby the upper surface of the wafer W is rinsed. The rinsing process is an example of the surface cleaning step of cleaning the surface of the wafer W. The rinse liquid to be supplied is a low-oxygen concentration rinse liquid (e.g., DIW) obtained by reducing the concentration of oxygen dissolved therein by the degassing unit 37. Specifically, the rinse liquid to be spouted from the treatment liquid nozzle 33 preferably has a dissolved oxygen concentration of not higher than 100 ppb, thereby preventing the oxidation of the surface of the wafer W attributable to the dissolved oxygen.

Figure 8B:
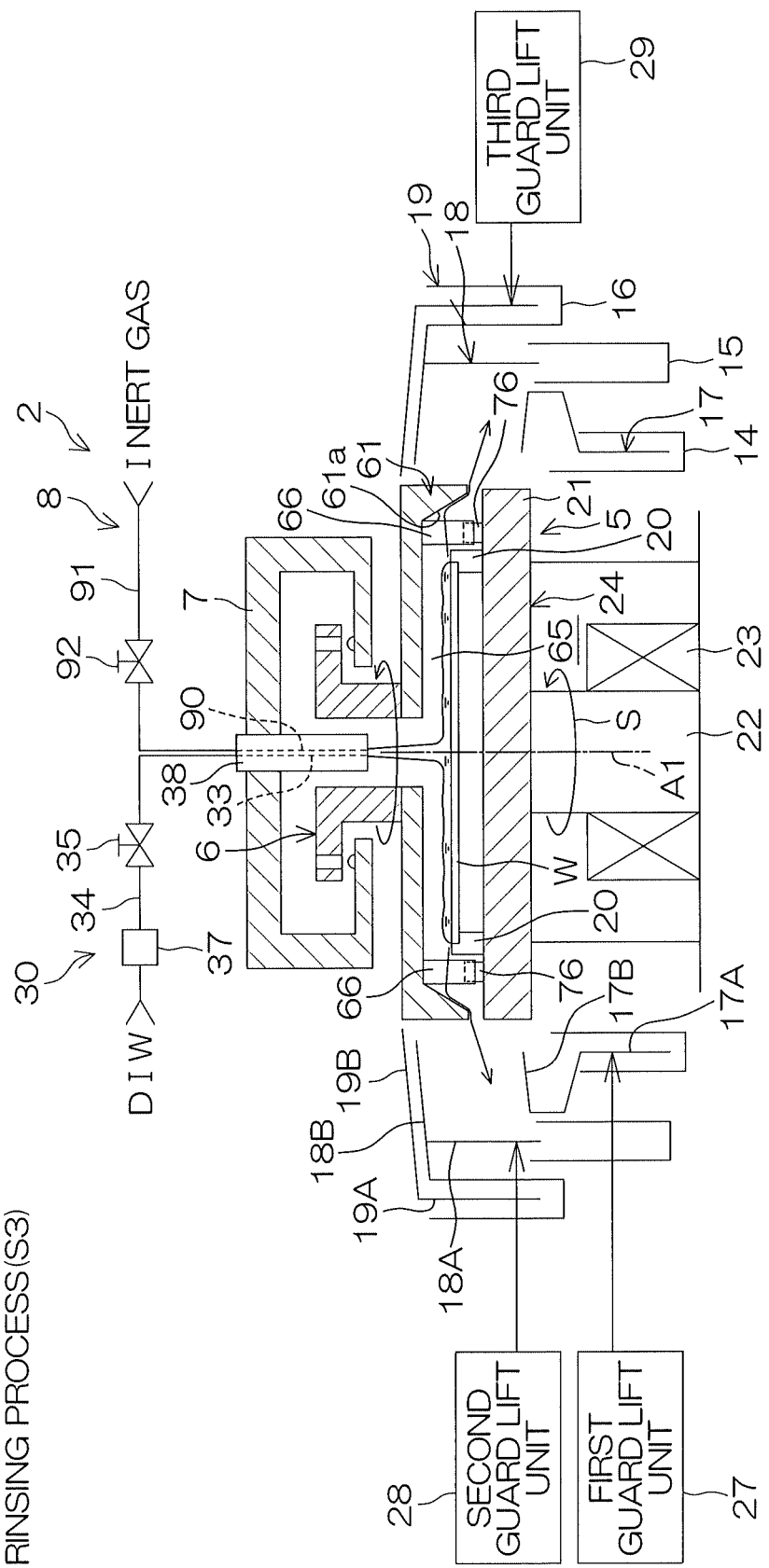
FIG. 8B is a schematic sectional view for describing a rinsing process to be performed after the chemical liquid treatment.

At the start of the rinsing process (S2), the chemical liquid valve 32 is closed to stop spouting hydrofluoric acid from the treatment liquid nozzle 33. Referring to FIG. 8B, the first guard lift unit 27 maintains the first guard 17 in the lower position, and the third guard lift unit 29 maintains the third guard 19 in the upper position. The second guard lift unit 28 places the second guard 18 at the height position where the treatment liquid can be received (guard placement step).

In this state, the rinse liquid valve 35 is opened, whereby the rinse liquid is supplied from the treatment liquid nozzle 33 to the center region of the upper surface of the wafer W being rotated. The rinse liquid spreads over the entire upper surface of the wafer W by centrifugal force. Thus, the chemical liquid on the wafer W is replaced with the rinse liquid.

The rinse liquid or a liquid mixture of the chemical liquid and the rinse liquid on the wafer W is scattered radially outward from the wafer W by centrifugal force. The rinse liquid or the liquid mixture of the chemical liquid and the rinse liquid scattered radially outward from the wafer W reaches the inner peripheral surface 61a of the extension portion 61 of the opposing member 6 opposed to the wafer W from the radially outside. Since the opposing member 6 is rotated together with the wafer W, the rinse liquid or the liquid mixture of the chemical liquid and the rinse liquid adhering to the inner peripheral surface 61a of the extension portion 61 is scattered radially outward of the extension portion 61 by centrifugal force. The rinse liquid or the liquid mixture of the chemical liquid and the rinse liquid scattered radially outward of the extension portion 61 is received by the second guard 18. The rinse liquid or the liquid mixture of the chemical liquid and the rinse liquid received by the second guard 18 is guided to the second cup 15 along the second tubular portion 18A.

After the rinsing process (S3) is performed for a predetermined period, the first organic solvent treatment (S4, precedent organic solvent supply step) is performed. The rotation speed of the wafer W is controlled at an organic solvent treatment speed (e.g., 300 rpm). In the first organic solvent treatment (S4), the rinse liquid on the wafer W is replaced with the organic solvent, e.g., IPA. The organic solvent is an organic solvent miscible (compatible) with DIW which is the rinse liquid used in the rinsing process (S3).

Specifically, the rinse liquid valve 35 is closed. Thus, the spouting of the rinse liquid from the treatment liquid nozzle 33 is stopped. Referring to FIG. 8C, the first guard lift unit 27 places the first guard 17 in the lower position. The second guard lift unit 28 places the second guard 18 in a lower position. Further, the third guard lift unit 29 places the third guard 19 at a height position where the treatment liquid can be received.

Then, the organic solvent valve 52 is opened, whereby the organic solvent is supplied from the organic solvent nozzle 50 of the organic solvent supply unit 10 toward the center region of the upper surface of the wafer W being rotated. The organic solvent spreads over the entire upper surface of the wafer W by centrifugal force. Thus, the rinse liquid on the wafer W is replaced with the organic solvent. The organic solvent to be supplied at this time is a low-oxygen concentration organic solvent obtained by reducing the concentration of oxygen dissolved therein by the degassing unit 53. Specifically, the organic solvent to be spouted from the organic solvent nozzle 50 preferably has a dissolved oxygen concentration of not higher than 100 ppb, thereby preventing the oxidation of the surface of the wafer W attributable to the dissolved oxygen.

The organic solvent or a liquid mixture of the rinse liquid and the organic solvent on the wafer W is scattered radially outward from the wafer W by centrifugal force. The organic solvent or the liquid mixture of the rinse liquid and the organic solvent scattered radially outward from the wafer W reaches the inner peripheral surface 61a of the extension portion 61 of the opposing member 6 opposed to the wafer W from the radially outside. Since the opposing member 6 is rotated together with the wafer W, the organic solvent or the liquid mixture of the rinse liquid and the organic solvent adhering to the inner peripheral surface 61a of the extension portion 61 is scattered radially outward of the extension portion 61 by centrifugal force. The organic solvent or the liquid mixture of the rinse liquid and the organic solvent scattered radially outward of the extension portion 61 is received by the third guard 19. The organic solvent or the liquid mixture of the rinse liquid and the organic solvent received by the third guard 19 is guided to the third cup 16 along the third tubular portion 19A.

After the first organic solvent treatment (S4) is performed for a predetermined period, the hydrophobization process (S5) is performed. The rotation speed of the wafer W is controlled at a hydrophobization process speed (e.g., 500 rpm). In the hydrophobization process (S5), the organic solvent on the wafer W is replaced with the hydrophobizing agent. The hydrophobizing agent is a liquid obtained by dissolving a hydrophobizing substance in a solvent. The solvent of the hydrophobizing agent is preferably a solvent, e.g., PGMEA, that is miscible (compatible) with IPA supplied in the first organic solvent treatment (S4). Thus, the organic solvent (IPA) on the wafer W can be replaced with the hydrophobizing agent.

In the hydrophobization process (S5), the organic solvent valve 52 is closed. Thus, the spouting of the organic solvent from the organic solvent nozzle 50 is stopped. Referring to FIG. 8D, the first guard lift unit 27 maintains the first guard 17 in the lower position, and the second guard lift unit 28 maintains the second guard 18 in the lower position. Further, the third guard lift unit 29 places the third guard 19 at the height position where the treatment liquid can be received.

Then, the hydrophobizing agent valve 82 is opened, whereby the hydrophobizing agent is supplied from the hydrophobizing agent nozzle 80 of the hydrophobizing agent supply unit 11 toward the center region of the upper surface of the wafer W being rotated (hydrophobizing agent supply step). The hydrophobizing agent spreads over the entire upper surface of the wafer W by centrifugal force, whereby the organic solvent on the wafer W is replaced with the hydrophobizing agent. The hydrophobizing agent to be supplied at this time is a low-oxygen concentration hydrophobizing agent obtained by reducing the concentration of oxygen dissolved therein by the degassing unit 83. Specifically, the hydrophobizing agent to be spouted from the hydrophobizing agent nozzle 80 preferably has a dissolved oxygen concentration of not higher than 100 ppb, thereby preventing the oxidation of the surface of the wafer W attributable to the dissolved oxygen.

The hydrophobizing agent or a liquid mixture of the organic solvent and the hydrophobizing agent on the wafer W is scattered radially outward from the wafer W by centrifugal force. The hydrophobizing agent or the liquid mixture of the organic solvent and the hydrophobizing agent scattered radially outward from the wafer W reaches the inner peripheral surface 61a of the extension portion 61 of the opposing member 6 opposed to the wafer W from the radially outside. Since the opposing member 6 is rotated together with the wafer W, the hydrophobizing agent or the liquid mixture of the organic solvent and the hydrophobizing agent adhering to the inner peripheral surface 61a of the extension portion 61 is scattered radially outward of the extension portion 61 by centrifugal force. The hydrophobizing agent or the liquid mixture of the organic solvent and the hydrophobizing agent scattered radially outward of the extension portion 61 is received by the third guard 19. The hydrophobizing agent or the liquid mixture of the organic solvent and the hydrophobizing agent received by the third guard 19 is guided to the third cup 16 along the third tubular portion 19A.

After the hydrophobization process (S5) is performed for a predetermined period, the second organic solvent treatment (S6, subsequent organic solvent supply step) is performed. The rotation speed of the wafer W is controlled at the organic solvent treatment speed (e.g., 300 rpm). In the second organic solvent treatment, the hydrophobizing agent on the wafer W is replaced with the organic solvent. The organic solvent is an organic solvent, e.g., IPA, that is miscible (compatible) with the solvent of the hydrophobizing agent used in the hydrophobization process (S5).

Figure 8E:
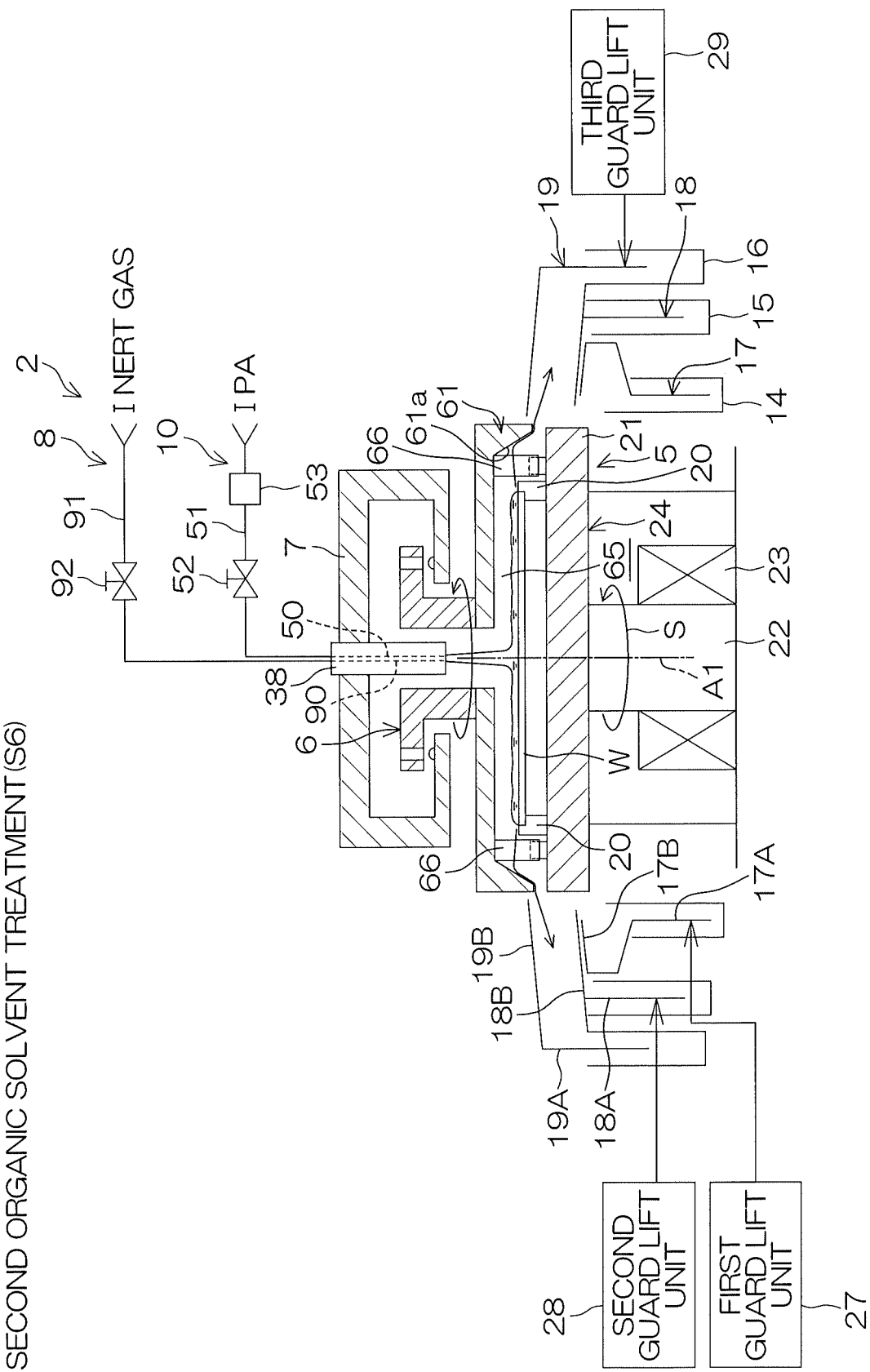
FIG. 8E is a schematic sectional view for describing a second organic solvent treatment.

Specifically, the hydrophobizing agent valve 82 is closed. Referring to FIG. 8E, the first guard lift unit 27 maintains the first guard 17 in the lower position, and the second guard lift unit 28 maintains the second guard 18 in the lower position. The third guard lift unit 29 places the third guard 19 at the height position where the treatment liquid can be received (guard placement step).

Then, the organic solvent valve 52 is opened, whereby the organic solvent is spouted from the organic solvent nozzle 50 toward the center region of the upper surface of the wafer W being rotated. The organic solvent spreads over the entire upper surface of the wafer W by centrifugal force. Thus, the hydrophobizing agent on the wafer W is replaced with the organic solvent. The organic solvent to be supplied at this time is a low-oxygen concentration organic solvent obtained by reducing the concentration of oxygen dissolved therein by the degassing unit 53. Specifically, the organic solvent to be spouted from the organic solvent nozzle 50 preferably has a dissolved oxygen concentration of not higher than 100 ppb, thereby preventing the oxidation of the surface of the wafer W attributable to the dissolved oxygen.

The organic solvent or a liquid mixture of the organic solvent and the hydrophobizing agent on the wafer W is scattered radially outward from the wafer W by centrifugal force. The organic solvent or the liquid mixture of the organic solvent and the hydrophobizing agent scattered radially outward from the wafer W reaches the inner peripheral surface of the extension portion 61 of the opposing member 6 opposed to the wafer W from the radially outside. Since the opposing member 6 is rotated together with the wafer W, the organic solvent or the liquid mixture of the organic solvent and the hydrophobizing agent adhering to the inner peripheral surface of the extension portion 61 is scattered radially outward of the extension portion 61 by centrifugal force. The organic solvent or the liquid mixture of the organic solvent and the hydrophobizing agent scattered radially outward of the extension portion 61 is received by the third guard 19. The organic solvent or the liquid mixture of the organic solvent and the hydrophobizing agent received by the third guard 19 is guided to the third cup 16 along the third tubular portion 19A.

After the second organic solvent treatment (S6) is performed for a predetermined period, the drying process (S7) is performed to spin off the liquid component from the upper surface of the wafer W by centrifugal force. Specifically, the organic solvent valve 52 is closed, and then the wafer W is rotated at a high speed (drying process speed, e.g., 2000 rpm). Then, the electric motor 23 stops the rotation of the wafer W.

After the drying process (S7) is completed, the control unit 3 closes the inert gas valve 92 to stop the supply of the inert gas, and ends the atmosphere control step (S10).

Thereafter, the transport robot CR enters the treatment unit 2, lifts up the treated wafer W from the spin chuck 5, and unloads the treated wafer W out of the treatment unit 2 (S8: substrate unloading). The wafer W is transferred from the transport robot CR to the transport robot IR, and is stored in the carrier C by the transport robot IR.

Figure 7B:
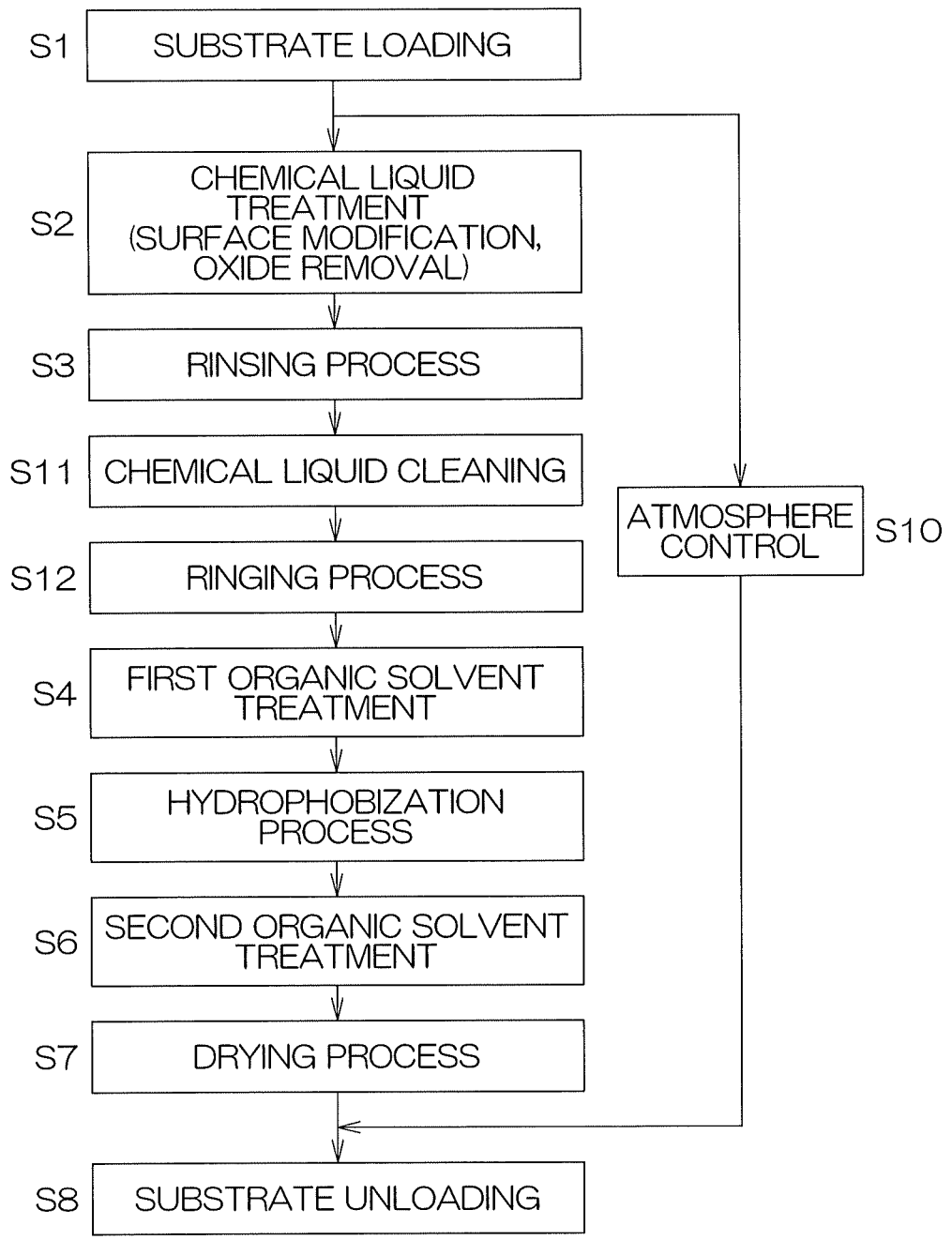
FIG. 7B is a flowchart for describing another exemplary substrate processing process to be performed by the substrate processing apparatus.

After the chemical liquid treatment with hydrofluoric acid (S2: oxide removal process) and the rinsing process (S3) for washing away hydrofluoric acid, as shown in FIG. 7B, a chemical liquid cleaning process (S11) with the use of another chemical liquid (e.g., SC1) may be further performed. In this case, a rinsing process (S12) may be performed for washing away the chemical liquid (e.g., SC1), and then a process sequence including the first organic solvent treatment (S4) and the subsequent steps may be performed. The chemical liquid cleaning process (S11) and the rinsing process (S12) are examples of the surface cleaning step.

In the chemical liquid cleaning process (S11) and the subsequent rinsing process (S12), the chemical liquid and the rinse liquid are supplied, for example, from the second treatment liquid supply unit 40.

For the chemical liquid cleaning process (S11), more specifically, the control unit 3 opens the chemical liquid valve 42 to spout the chemical liquid from the treatment liquid nozzle 43 toward the center region of the wafer W. The rotation speed of the wafer W is controlled at the chemical liquid treatment speed (e.g., 300 rpm). Further, the height positions of the guards 17 to 19 are controlled so that the treatment liquid is received, for example, by the first guard 17.

After the chemical liquid cleaning process is performed for a predetermined period, the control unit 3 closes the chemical liquid valve 42, and ends the chemical liquid cleaning process. Further, the control unit 3 opens the rinse liquid valve 45 to spout the rinse liquid from the treatment liquid nozzle 43 toward the center region of the wafer W. Thus, the chemical liquid on the surface of the wafer W can be replaced with the rinse liquid. The rotation speed of the wafer W is controlled at the rinsing process speed (e.g., 300 rpm). Further, the height positions of the guards 17 to 19 are controlled so that the treatment liquid is received, for example, by the first guard 17. After the rinsing process is performed for a predetermined period, the control unit 3 closes the rinse liquid valve 45.

The concentration of oxygen dissolved in the chemical liquid to be supplied in the chemical liquid cleaning process (S11) and the concentration of oxygen dissolved in the rinse liquid to be supplied in the rinsing process (S12) are respectively reduced by the degassing units 46 and 47. Specifically, the chemical liquid and the rinse liquid to be spouted from the treatment liquid nozzle 43 each preferably have a dissolved oxygen concentration of not higher than 100 ppb, thereby preventing the oxidation of the surface of the wafer W attributable to the dissolved oxygen.

According to this embodiment, as described above, the oxide is removed from the surface of the wafer W (S2), and then the surface cleaning step of cleaning the surface of the wafer W with the treatment liquids (S2, S3, S11, S12) is performed. The treatment liquids herein used each have a lower dissolved oxygen concentration (e.g., not higher than 100 ppb), and do not oxidize the material of the wafer W. Therefore, a new oxide attributable to the treatment liquids is not formed on the surface of the wafer W during the cleaning. In the hydrophobization step (S5) performed after the surface cleaning step, the hydrophobizing agent is supplied to the surface of the wafer W, whereby the surface of the wafer W is modified to be hydrophobic. During a period from the surface cleaning step to the hydrophobization step, the atmosphere around the wafer W is controlled to the low-oxygen atmosphere (S10). After the oxide is removed from the surface of the wafer W, therefore, the surface of the wafer W can be modified to be hydrophobic in a state such that the growth of the new oxide on the surface is suppressed.

Thus, the unevenness of the surface of the wafer W attributable to the oxide is eliminated and, in this state, the surface of the wafer W is modified to be hydrophobic. Therefore, the surface of the wafer W thus modified is uniformly made hydrophobic and flat with a reduced roughness. This suppresses or prevents the pattern collapse on the surface of the wafer W in the second organic solvent treatment (S6) and the like. In addition, the reduced surface roughness suppresses or prevents the unevenness of the surface of the wafer W which may otherwise be detected as particles.

The low-oxygen atmosphere is an atmosphere having an oxygen concentration that does not permit dissolution of oxygen in the treatment liquids. This suppresses or prevents the growth of the oxide on the surface of the wafer W.

In the exemplary processes shown in FIGS. 7A and 7B, the oxide removal process is a chemical removal step of removing the oxide by an etching effect of the chemical liquid. In this case, it is preferred to use a chemical liquid capable of selectively etching the oxide with respect to the substrate material. In general, the oxide can be removed from the surface of the wafer W by a short-period etching process with the use of a chemical liquid having a dilute concentration. Therefore, even if the oxide is contained in the substrate material (e.g., a material forming the pattern on the surface of the wafer W), there is no possibility that the structure of the substrate surface is virtually altered.

In this embodiment, the second organic solvent treatment (S6, subsequent organic solvent supply step) is performed to wash away an excess amount of the hydrophobizing agent on the wafer W by supplying the organic solvent to the surface of the wafer W after the hydrophobization process (S5). This makes it possible to hydrophobize the surface of the wafer W with a proper amount of the hydrophobizing agent, thereby preventing the aggravation of the surface roughness of the wafer W and the reduction in hydrophobization performance which may otherwise occur due to the excess hydrophobizing agent.

In this embodiment, the opposing member 6 is disposed in the position close to the surface of the wafer W in opposed relation to the surface of the wafer W in the atmosphere control step (S10), thereby limiting the space to which the surface of the wafer W is opposed. The inert gas is supplied to the limited space, whereby the surface of the wafer W is maintained in the atmosphere having a lower oxygen concentration. This suppresses or prevents the growth of the oxide on the surface of the wafer W during the process.

In this embodiment, with the opposing member 6 disposed in close opposed relation to the surface of the wafer W, the space to which the surface of the wafer W is opposed is limited by the opposing portion 60 in a direction normal to the surface, and is limited by the annular extension portion 61 in a direction parallel to the surface. Thus, the space to which the surface of the wafer W is opposed is a substantially closed space, and the inert gas is supplied to this closed space. Therefore, the surface of the wafer W is maintained in the atmosphere stabilized at the lower oxygen concentration and, in this state, the surface cleaning process and the like are performed. This more reliably suppresses or prevents the growth of the oxide on the surface of the wafer W during the process.

Figure 9:
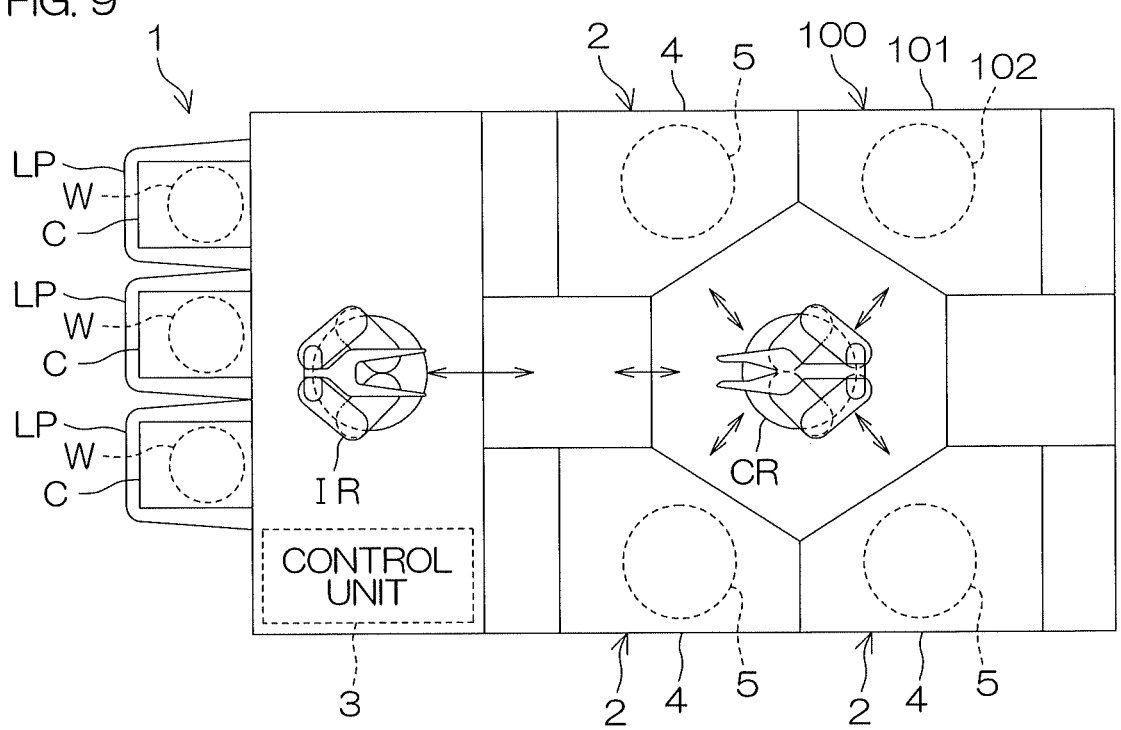
FIG. 9 is a schematic plan view for describing the inside layout of a substrate processing apparatus according to another embodiment of the present invention.

FIG. 9 is a schematic plan view for describing the inside layout of a substrate processing apparatus according to another embodiment of the present invention. In FIG. 9, components corresponding to those shown in FIG. 4 will be denoted by the same reference characters.

In this embodiment, the substrate processing apparatus 1 includes a single heat treatment unit 100 and three treatment units 2. That is, one of the four treatment units in the substrate processing apparatus 1 of the first embodiment is replaced with the heat treatment unit 100. The transport robot CR can load and unload the wafer W with respect to the heat treatment unit 100 and the three treatment units 2, and transfer the wafer W with respect to the transport robot IR. The heat treatment unit 100 can be used to perform the thermal modification step of modifying the surface of the wafer W by heating the wafer W. More specifically, the heat treatment unit 100 can be used to perform the thermal removal step of removing the oxide from the surface of the wafer W by heating the wafer W, and to perform the planarization step of planarizing the oxide by the decomposition and the recombination of the oxide.

The transport robot CR loads an untreated wafer W received from the transport robot IR into the heat treatment unit 100. The transport robot CR unloads a wafer W subjected to the oxide removal process by the heat treatment unit 100 from the heat treatment unit 100, and then loads the wafer W into the treatment unit 2. Further, the transport robot CR unloads a wafer W treated by the treatment unit 2 from the treatment unit 2, and transfers the wafer W to the transport robot IR.

Figure 10:
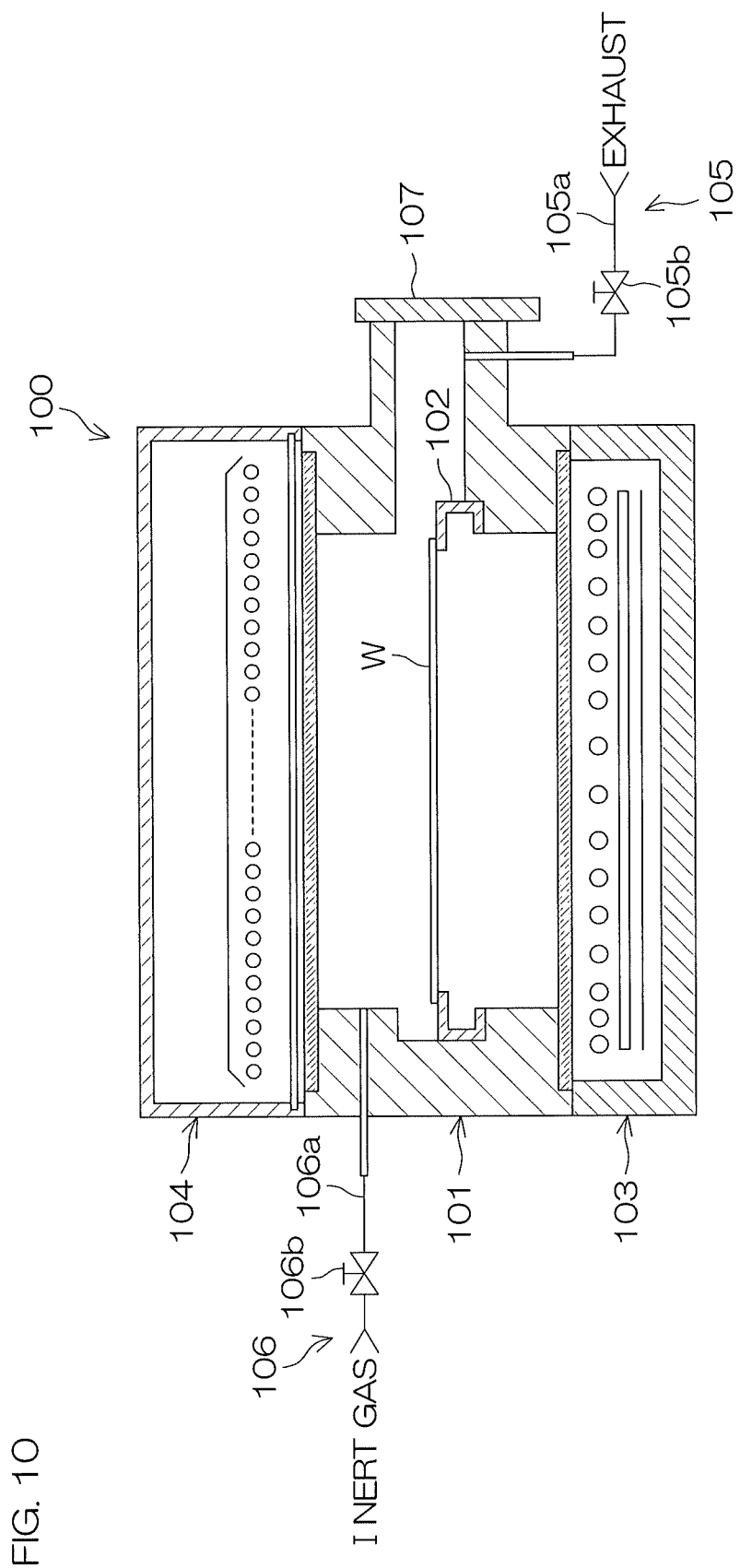
FIG. 10 is a schematic sectional view for describing the construction of a heat treatment unit provided in the substrate processing apparatus of FIG. 9 by way of example.

FIG. 10 is a schematic sectional view for describing the construction of the heat treatment unit 100 by way of example. The heat treatment unit 100 may be a so-called annealing device. More specifically, the heat treatment unit 100 may include a sealable chamber 101, a susceptor 102 which supports the wafer W in the chamber 101, and a lamp heater unit 103 (e.g., a halogen lamp heater unit) which lamp-heats the wafer W supported by the susceptor 102. The chamber 101 has an openable gate 107. With the gate 107 open, the wafer W can be loaded and unloaded with respect to the chamber 101. The heat treatment unit 100 may further include a flash lamp unit 104 (e.g., a xenon flash lamp unit, a krypton flash lamp unit, or the like) for flash-heating the surface of the wafer W supported by the susceptor 102.

The heat treatment unit 100 further includes an exhaust unit 105 which exhausts the inside atmosphere of the chamber 101. The exhaust unit 105 includes an exhaust pipe 105a communicating with the inside of the chamber 101, and an exhaust valve 105b which opens and closes a flow path of the exhaust pipe 105a. The heat treatment unit 100 further includes an inert gas supply unit 106 which supplies an inert gas into the chamber 101. The inert gas supply unit 106 includes an inert gas supply pipe 106a communicating with the inside of the chamber 101, and an inert gas valve 106b which opens and closes a flow path of the inert gas supply pipe 106a. The inside atmosphere of the chamber 101 is exhausted by the exhaust unit 105, and the inert gas is supplied into the chamber 101 by the inert gas supply unit 106, whereby the inside atmosphere of the chamber 101 can be a low-oxygen atmosphere. That is, the exhaust unit 105 and the inert gas supply unit 106 constitute the atmosphere control unit. Further, the wafer W subjected to the heat treatment can be cooled by supplying the inert gas from the inert gas supply unit 106. That is, the inert gas supply unit 106 is an example of the cooling unit which cools the wafer W subjected to the heat treatment.

Figure 11:
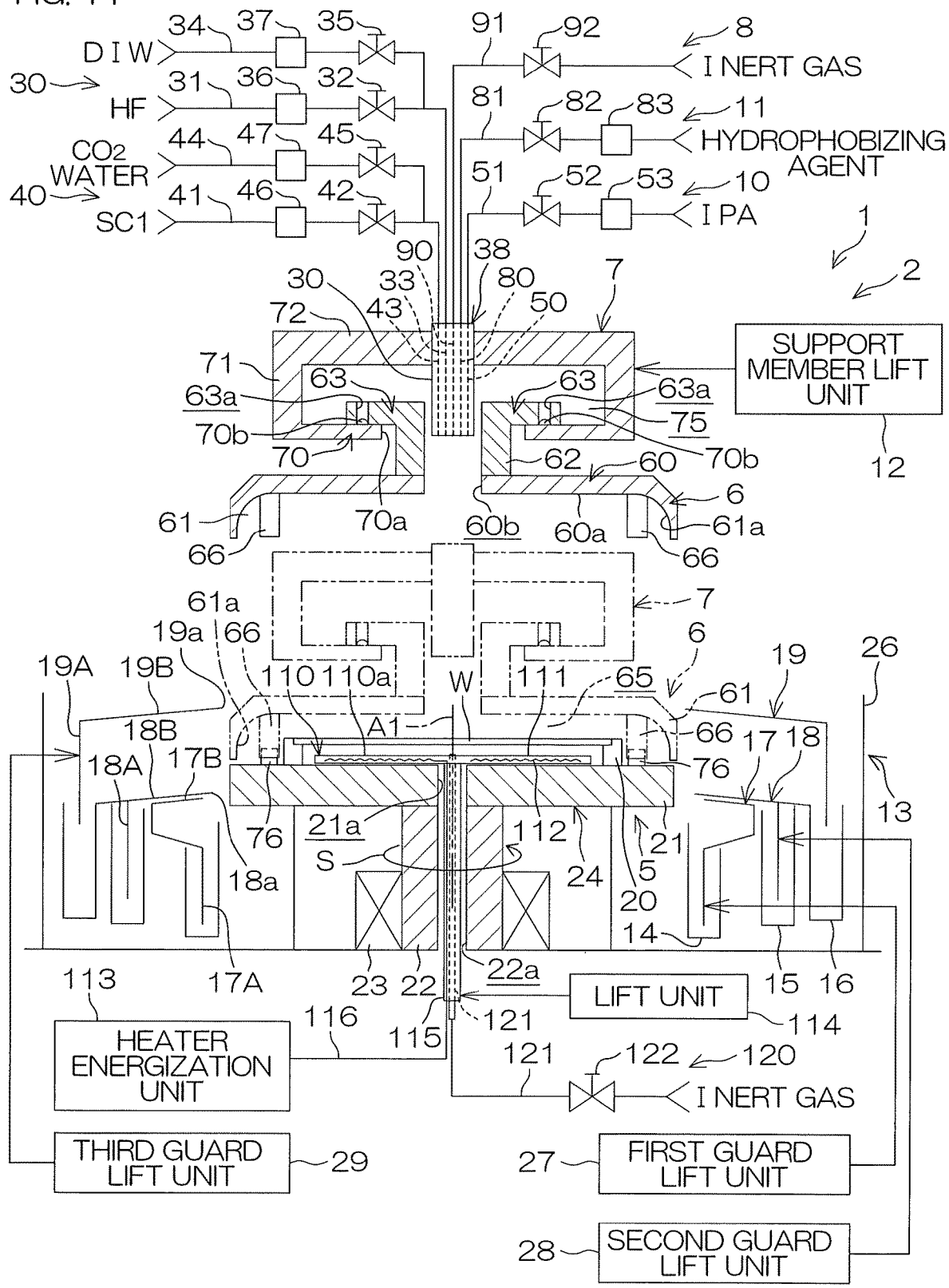
FIG. 11 is a schematic sectional view for describing the construction of a treatment unit provided in the substrate processing apparatus of FIG. 9 by way of example.

FIG. 11 is a schematic sectional view for describing the construction of the treatment unit 2 by way of example. In FIG. 11, components corresponding to those shown in FIG. 5 will be denoted by the same reference characters. The treatment unit 2 includes a heater unit 110 for heating the wafer W held by the spin chuck 5. The heater unit 110 can be used as the subsequent heating unit which heats the wafer W subjected to the hydrophobization process.

The heater unit 110 is in the form of a disk-shaped hot plate. The heater unit 110 has an opposing surface 110a which is opposed to a lower surface of the wafer W from below.

The heater unit 110 includes a plate body 111 and a heater 112. The plate body 111 is slightly smaller than the wafer W as seen in plan. The front surface of the plate body 111 serves as the opposing surface 110a. The heater 112 may be a resistor incorporated in the plate body 111. The opposing surface 110a is heated by energizing the heater 112. Power is supplied from a heater energization unit 113 to the heater 112 via a power supply line.

The heater unit 110 is disposed above the spin base 21. The treatment unit 2 includes a heater lift unit 114 which moves up and down the heater unit 110 with respect to the spin base 21. The heater lift unit 114 includes, for example, a ball screw mechanism and an electric motor which applies a driving force to the ball screw mechanism.

A lift shaft 115 vertically extending along the rotation axis A1 is connected to a lower surface of the heater unit 110. The lift shaft 115 is inserted through a through-hole 21a provided at the center of the spin base 21 and through a hollow rotary shaft 22. The power supply line 116 is inserted into the lift shaft 115. The heater lift unit 114 moves up and down the heater unit 110 via the lift shaft 115 to place the heater unit 110 in a lower position, an upper position, and a desired intermediate position between the lower position and the upper position. With the heater unit 110 placed in the lower position, a distance between the opposing surface 110a and the lower surface of the wafer W is, for example, 15 mm. Since the heater unit 110 is moved (up and down) with respect to the spin base 21, the distance between the lower surface of the wafer W and the opposing surface 110a of the heater unit 110 is changed.

The substrate processing apparatus 1 further includes a lower surface inert gas supply unit 120 which supplies an inert gas such as nitrogen gas toward the center of the lower surface of the wafer W held by the spin chuck 5. The lower surface inert gas supply unit 120 includes an inert gas supply pipe 121, and an inert gas valve 122 provided in the inert gas supply pipe 121. The inert gas supply pipe 121 is inserted through the hollow lift shaft 115 and through a center opening (not shown) of the heater unit 110, and has a spout provided at an upper end thereof to face the center of the lower surface of the wafer W from below.

In this embodiment, the first treatment liquid supply unit 30 is an example of the treatment liquid supply unit which supplies the treatment liquid to the surface of the wafer W to clean the surface of the wafer W. In particular, a portion of the first treatment liquid supply unit 30 related to the supply of the chemical liquid constitutes the chemical liquid supply unit, and a portion of the first treatment liquid supply unit 30 related to the supply of the rinse liquid constitutes the rinse liquid supply unit. In this embodiment, the second treatment liquid supply unit 40 is an example of the treatment liquid supply unit which supplies the treatment liquid to the surface of the wafer W to clean the surface of the wafer W. In particular, a portion of the second treatment liquid supply unit 40 related to the supply of the chemical liquid constitutes the chemical liquid supply unit, and a portion of the second treatment liquid supply unit 40 related to the supply of the rinse liquid constitutes the rinse liquid supply unit.

Figure 12:
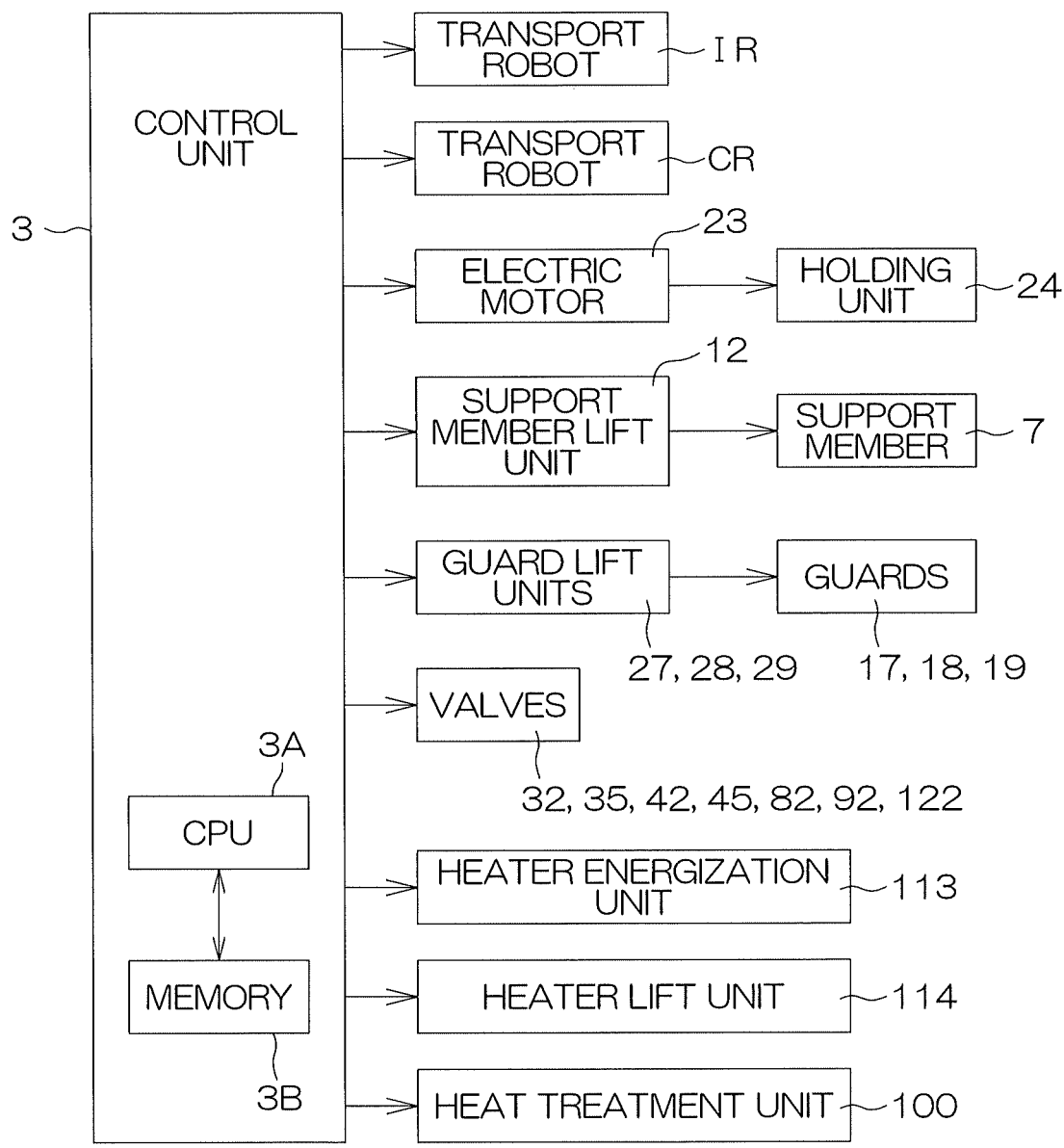
FIG. 12 is a block diagram for describing the electrical configuration of the substrate processing apparatus of FIG. 9.

FIG. 12 is a block diagram for describing the electrical configuration of the substrate processing apparatus 1 of this embodiment. In FIG. 12, components corresponding to those shown in FIG. 6 will be denoted by the same reference characters. The control unit 3 controls operations of the transport robots IR, CR, the electric motor 23, the support member lift unit 12, the guard lift units 27 to 29, and the valves 32, 35, 42, 45, 52, 82, 92, 122, and the like. The control unit 3 is programmed so as to control the energization of the components of the heat treatment unit 100, particularly the lamp heater unit 103 and the flash lamp unit 104, to control the exhaust operation of the exhaust unit 105, and to control the inert gas supply operation of the inert gas supply unit 106. Further, the control unit 3 is programmed so as to control the energization of the heater 112 by the heater energization unit 113, and to control the operation of the heater lift unit 114

Figure 13A:
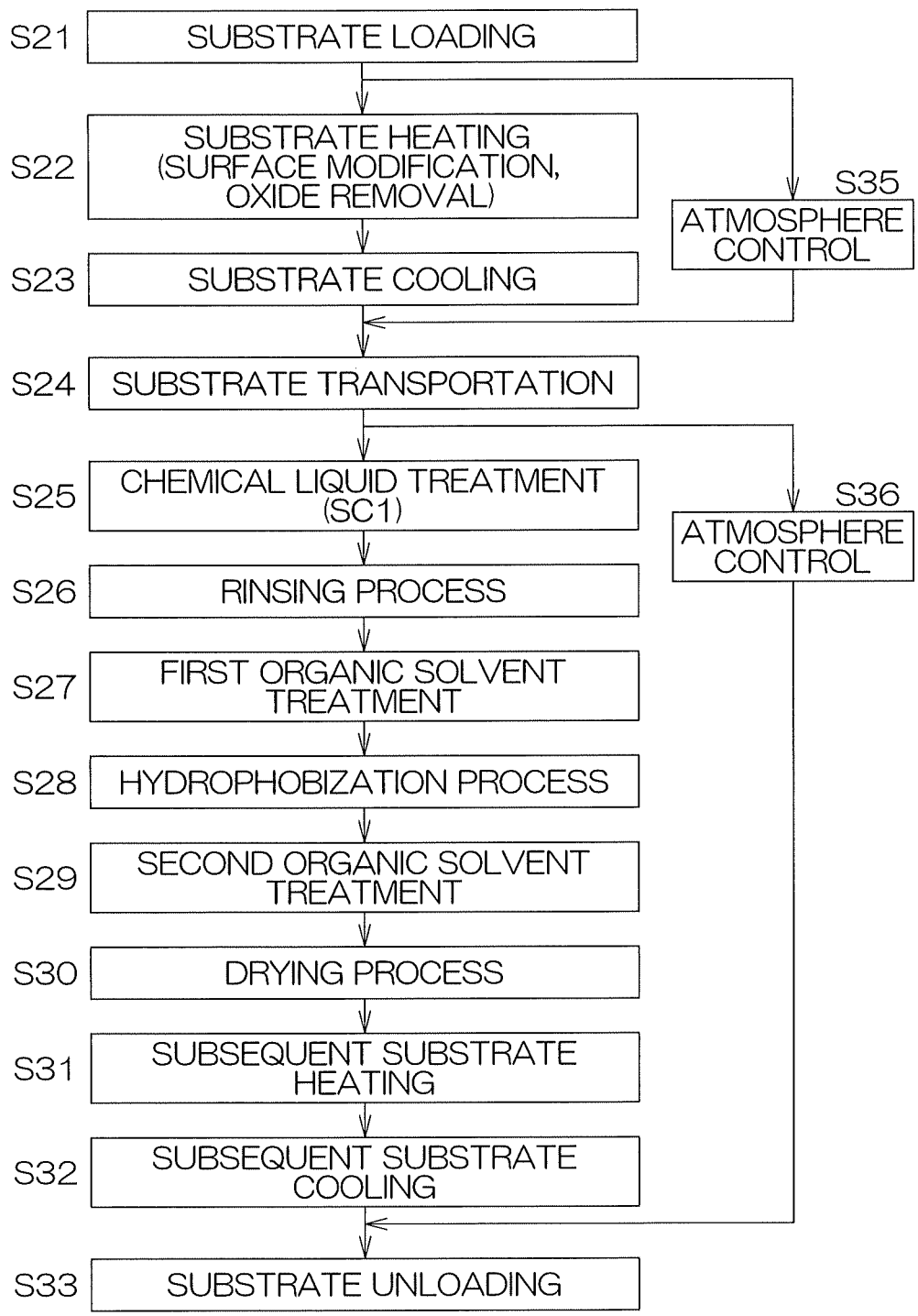
FIG. 13A is a flowchart for describing an exemplary substrate processing process to be performed by the substrate processing apparatus of FIG. 9.

FIG. 13A is a flowchart for describing an exemplary substrate processing process to be performed by the substrate processing apparatus 1 of this embodiment, mainly showing a process to be performed according to a program executed by the control unit 3. FIGS. 14A to 14G are schematic sectional views for describing the exemplary substrate processing process.

In the substrate processing process, as shown in FIG. 13A, a substrate loading step (S21), a substrate heating process (S22), a substrate cooling process (S23), a substrate transportation step (S24), a chemical liquid treatment (S25), a rinsing process (S26), a first organic solvent treatment (S27), a hydrophobization process (S28), a second organic solvent treatment (S29), a drying process (S30), a subsequent substrate heating process (S31), a subsequent substrate cooling process (S32), and a substrate unloading step (S33), for example, are performed in this order by the substrate processing apparatus 1.

More specifically, the transport robot IR takes out an untreated wafer W from a carrier C. The transport robot CR receives the untreated wafer W from the transport robot IR, loads the wafer W into the chamber 101 of the heat treatment unit 100 to place the wafer W on the susceptor 102, and is retracted from the chamber 101 (S21: substrate loading). The control unit 3 heats the wafer W, for example, by energizing the lamp heater unit 103 (S22: substrate heating process). The substrate heating process is performed so that a thermal energy required for breaking bonds between the material (e.g., silicon) of the wafer W and oxygen can be applied to the wafer W. That is, the substrate heating process (S22) may be the thermal removal step (an example of the oxide removal step or the thermal modification step) of removing at least a portion of the oxide on the surface of the wafer W by heating (see FIG. 1B). More specifically, the wafer W is heated to not lower than 300° C., more preferably not lower than 500° C., still more preferably not lower than 700° C. For example, the energization of the lamp heater unit 103 may be controlled so that the wafer W is kept at 750° C. for a predetermined period (e.g., 20 seconds). As required, the flash lamp unit 104 for the flash heating may be used in combination with the lamp heater unit.

The substrate heating process (S22) may be the planarization step (an example of the thermal modification step) of planarizing the oxide on the surface of the wafer W by the decomposition and the recombination of the oxide (see FIG. 2B).

Prior to the substrate heating process (S22), the control unit 3 operates the exhaust unit 105 to exhaust the inside atmosphere of the chamber 101, and causes the inert gas supply unit 106 to supply the inert gas into the chamber 101. Thus, atmosphere control (S35) is performed for maintaining the atmosphere around the wafer W to the low-oxygen atmosphere. The atmosphere control is continued until the wafer W is unloaded from the heat treatment unit 100.

After the substrate heating process (S22), the substrate cooling process (S23, cooling step) is performed for cooling the wafer W close to a room temperature. Specifically, the control unit 3 stops the energization of the lamp heater unit 103. On the other hand, the supply of the inert gas by the inert gas supply unit 106 and the exhaust from the chamber 101 by the exhaust unit 105 are continued. Thus, the wafer W is cooled by heat exchange between the wafer W and the inert gas.

After a lapse of a predetermined cooling period, the control unit 3 unloads the cooled wafer W from the heat treatment unit 100, and loads the wafer W into any of the treatment units 2 (S24: substrate transportation).

Before the substrate cooling process (S23) or during the substrate cooling process, air (oxygen) may be introduced into the chamber 101 to form a new oxide film Oxn (see FIG. 3C) on the surface of the wafer W (an example of the thermal modification step). The oxide film Oxn can be uniformly formed on the surface of the wafer W by placing the wafer W in the atmosphere having a controlled oxygen concentration while maintaining the wafer W at the high temperature.

Before the wafer W is loaded into the treatment unit 2, a positional relationship between the opposing member 6 and the substrate holding unit 24 with respect to the rotation direction S is adjusted so that the opposing member 6 and the substrate holding unit 24 can be engaged with each other. More specifically, the position of the substrate holding unit 24 with respect to the rotation direction S is adjusted by the electric motor 23 so that the first engagement portions 66 of the opposing member 6 overlap the second engagement portions 76 of the substrate holding unit 24 as seen in plan.

On the other hand, the wafer W yet to be further treated is transported from the heat treatment unit 100 to the treatment unit 2 by the transport robot CR (see FIG. 9), and transferred to the spin chuck 5 (S24: substrate transportation). Thereafter, the wafer W is horizontally held and spaced upward from the upper surface of the spin base 21 by the chuck pins 20 (substrate holding step), until the wafer W is unloaded by the transport robot CR.

Then, the support member lift unit 12 moves down the support member 7 from the upper position toward the lower position. The support member 7 passes through the engagement position before reaching the lower position. When the support member 7 reaches the engagement position, the opposing member 6 is engaged with the substrate holding unit 24 by magnetic force. Thus, the opposing member 6 is supported from below by the substrate holding unit 24 located at the fixed height position. With the opposing member 6 in engagement with the substrate holding unit 24, the opposing portion 60 of the opposing member 6 is located close to the upper surface of the wafer W to be opposed to the upper surface of the wafer W from above. On the other hand, the extension portion 61 of the opposing member 6 is opposed to the wafer W from the radially outside to surround the periphery of the wafer W. With the opposing member 6 in engagement with the substrate holding unit 24, the lower end portion of the extension portion 61 is opposed to the spin base 21 from above. A slight gap is provided between the lower end portion of the extension portion 61 and the upper surface of the spin base 21. Thus, the support member lift unit 12 places the opposing member 6 in a position where the inner peripheral surface of the extension portion 61 is opposed to the wafer W from the radially outside (shield placement step).

When the support member 7 is moved further down from the engagement position, the opposing member 6 is no longer supported by the support member 7. More specifically, the opposing member support portion 70 of the support member 7 is retreated downward from the flange portions 63 of the opposing member 6.

Figure 14A:
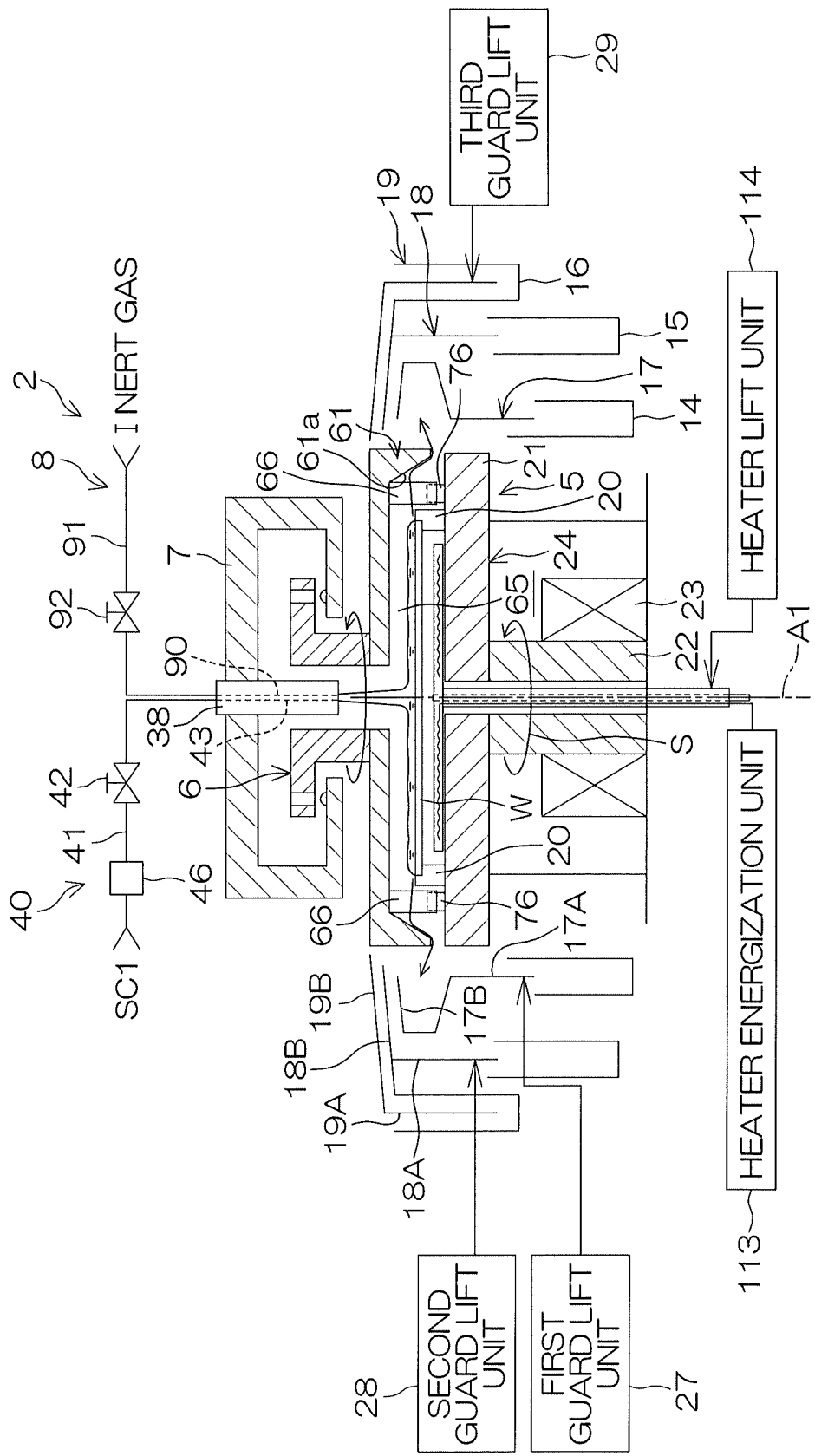
FIG. 14A is a schematic sectional view for describing a chemical liquid treatment (surface cleaning step).

Then, as shown in FIG. 14A, the support member 7 reaches the lower position. Subsequently, the electric motor 23 is driven to start the rotation of the spin base 21 of the substrate holding unit 24. Thus, the horizontally held wafer W is rotated (substrate rotation step). The first engagement portions 66 of the opposing member 6 are engaged with the second engagement portions 76 provided on the spin base 21. Therefore, the opposing member 6 is rotated synchronously with the wafer W (opposing member rotation step). The synchronous rotation means rotation at the same rotation speed in the same direction.

Further, the control unit 3 opens the inert gas valve 92 to spout the inert gas from the inert gas nozzle 90, whereby air in the treatment space 65 between the spin base 21 and the opposing portion 60 is replaced with the inert gas atmosphere. Thus, the atmosphere around the wafer W becomes a low-oxygen atmosphere having a lower oxygen concentration than the atmospheric air. In this way, an atmosphere control step (S36) of controlling the space around the wafer W to the low-oxygen atmosphere is continued until the wafer W is unloaded from the treatment unit 2.

With the low-oxygen atmosphere thus maintained, the chemical liquid treatment (S25, chemical liquid cleaning step, surface cleaning step) is started. The rotation speed of the wafer W is controlled at the chemical liquid treatment speed (e.g., 300 rpm). In the chemical liquid treatment (S25), SC1 is supplied as the chemical liquid onto the wafer W from the treatment liquid nozzle 43, whereby the chemical liquid cleaning process is performed on the upper surface of the wafer W. The SC1 to be supplied at this time is low-oxygen concentration SC1 obtained by reducing the concentration of oxygen dissolved therein by the degassing unit 46. Specifically, the SC1 to be spouted from the treatment liquid nozzle 43 has a dissolved oxygen concentration of not higher than 100 ppb, thereby preventing the oxidation of the surface of the wafer W attributable to the dissolved oxygen.

Referring to FIG. 14A, more specifically, the third guard lift unit 29 places the third guard 19 in the upper position, and the second guard lift unit 28 places the second guard 18 in the upper position. The first guard lift unit 27 places the first guard 17 at a height position where the treatment liquid can be received (guard placement step).

In this state, the chemical liquid valve 42 is opened. Thus, the chemical liquid (SC1) is supplied from the treatment liquid nozzle 43 to the center region of the upper surface of the wafer W being rotated. The chemical liquid spreads over the entire upper surface of the wafer W by centrifugal force.

The chemical liquid is scattered radially outward from the wafer W by centrifugal force. The chemical liquid scattered radially outward from the wafer W reaches the inner peripheral surface 61a of the extension portion 61 of the opposing member 6 opposed to the wafer W from the radially outside. Since the opposing member 6 is rotated together with the wafer W, the chemical liquid adhering to the inner peripheral surface 61a of the extension portion 61 is scattered radially outward of the extension portion 61 by centrifugal force. The chemical liquid scattered radially outward of the extension portion 61 is received by the first guard 17. The chemical liquid received by the first guard 17 is guided to the first cup 14 along the first tubular portion 17A.

After the chemical liquid treatment (S25) is performed for a predetermined period, the rinsing process (S26, rinsing step, surface cleaning step) is performed. The rotation speed of the wafer W is controlled at the rinsing process speed (e.g., 300 rpm). In the rinsing process, the SC1 (chemical liquid) on the wafer W is replaced with $CO_2$ water as the rinse liquid, whereby the upper surface of the wafer W is rinsed. The rinse liquid to be supplied at this time is a low-oxygen concentration rinse liquid (e.g., $CO_2$ water) obtained by reducing the concentration of oxygen dissolved therein by the degassing unit 47. Specifically, the rinse liquid to be spouted from the treatment liquid nozzle 43 preferably has a dissolved oxygen concentration of not higher than 100 ppb, thereby preventing the oxidation of the surface of the wafer W attributable to the dissolved oxygen.

At the start of the rinsing process (S26), the chemical liquid valve 42 is closed to stop spouting the SC1 from the treatment liquid nozzle 43. Referring to FIG. 14B, the third guard lift unit 29 maintains the third guard 19 in the upper position, and the second guard lift unit 28 maintains the second guard 18 in the upper position. The first guard lift unit 27 places the first guard 17 at the height position where the treatment liquid can be received (guard placement step).

In this state, the rinse liquid valve 45 is opened, whereby the rinse liquid is supplied from the treatment liquid nozzle 43 to the center region of the upper surface of the wafer W being rotated. The rinse liquid spreads over the entire upper surface of the wafer W by centrifugal force. Thus, the chemical liquid on the wafer W is replaced with the rinse liquid.

The rinse liquid or a liquid mixture of the chemical liquid and the rinse liquid on the wafer W is scattered radially outward from the wafer W by centrifugal force. The rinse liquid or the liquid mixture of the chemical liquid and the rinse liquid scattered radially outward from the wafer W reaches the inner peripheral surface 61a of the extension portion 61 of the opposing member 6 opposed to the wafer W from the radially outside. Since the opposing member 6 is rotated together with the wafer W, the rinse liquid or the liquid mixture of the chemical liquid and the rinse liquid adhering to the inner peripheral surface 61a of the extension portion 61 is scattered radially outward of the extension portion 61 by centrifugal force. The rinse liquid or the liquid mixture of the chemical liquid and the rinse liquid scattered radially outward of the extension portion 61 is received by the first guard 17. The rinse liquid or the liquid mixture of the chemical liquid and the rinse liquid received by the first guard 17 is guided to the first cup 14 along the first tubular portion 17A.

After the rinsing process (S26) is performed for a predetermined period, the first organic solvent treatment (S27, precedent organic solvent supply step) is performed. The rotation speed of the wafer W is controlled at the organic solvent treatment speed (e.g., 300 rpm). In the first organic solvent treatment (S27), the rinse liquid on the wafer W is replaced with the organic solvent, e.g., IPA. The organic solvent is an organic solvent miscible (compatible) with the $CO_2$ water which is the rinse liquid used in the rinsing process (S26).

Figure 14C:
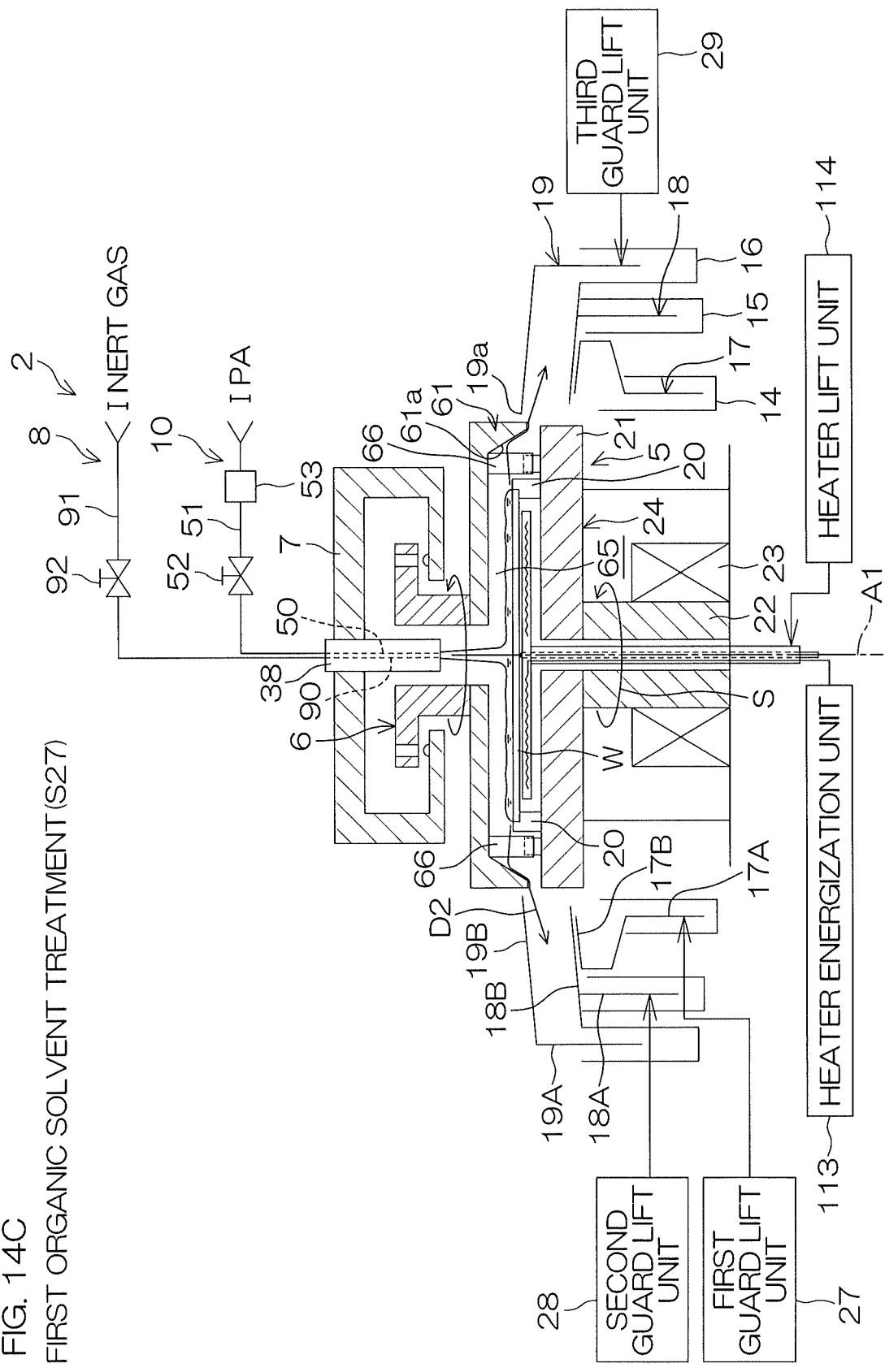
FIG. 14C is a schematic sectional view for describing a first organic solvent treatment.

Specifically, the rinse liquid valve 45 is closed to thereby stop the spouting of the rinse liquid from the treatment liquid nozzle 43. Referring to FIG. 14C, the first guard lift unit 27 places the first guard 17 in the lower position. The second guard lift unit 28 places the second guard 18 in the lower position. Further, the third guard lift unit 29 places the third guard 19 at the height position where the treatment liquid can be received.

Then, the organic solvent valve 52 is opened, whereby the organic solvent is supplied from the organic solvent nozzle 50 of the organic solvent supply unit 10 toward the center region of the upper surface of the wafer W being rotated. The organic solvent spreads over the entire upper surface of the wafer W by centrifugal force. Thus, the rinse liquid on the wafer W is replaced with the organic solvent. The organic solvent to be supplied at this time is a low-oxygen concentration organic solvent obtained by reducing the concentration of oxygen dissolved therein by the degassing unit 53. Specifically, the organic solvent to be spouted from the organic solvent nozzle 50 preferably has a dissolved oxygen concentration of not higher than 100 ppb, thereby preventing the oxidation of the surface of the wafer W attributable to the dissolved oxygen.

The organic solvent or a liquid mixture of the rinse liquid and the organic solvent on the wafer W is scattered radially outward from the wafer W by centrifugal force. The organic solvent or the liquid mixture of the rinse liquid and the organic solvent scattered radially outward from the wafer W reaches the inner peripheral surface 61a of the extension portion 61 of the opposing member 6 opposed to the wafer W from the radially outside. Since the opposing member 6 is rotated together with the wafer W, the organic solvent or the liquid mixture of the rinse liquid and the organic solvent adhering to the inner peripheral surface 61a of the extension portion 61 is scattered radially outward of the extension portion 61 by centrifugal force. The organic solvent or the liquid mixture of the rinse liquid and the organic solvent scattered radially outward of the extension portion 61 is received by the third guard 19. The organic solvent or the liquid mixture of the rinse liquid and the organic solvent received by the third guard 19 is guided to the third cup 16 along the third tubular portion 19A.

After the first organic solvent treatment (S27) is performed for a predetermined period, the hydrophobization process (S28) is performed. The rotation speed of the wafer W is controlled at the hydrophobization process speed (e.g., 500 rpm). In the hydrophobization process (S28), the organic solvent on the wafer W is replaced with the hydrophobizing agent. The hydrophobizing agent is a liquid obtained by dissolving a hydrophobizing substance in a solvent. The solvent of the hydrophobizing agent is preferably a solvent, e.g., PGMEA, that is miscible (compatible) with IPA supplied in the first organic solvent treatment (S27). Thus, the organic solvent (IPA) on the wafer W can be replaced with the hydrophobizing agent.

Figure 14D:
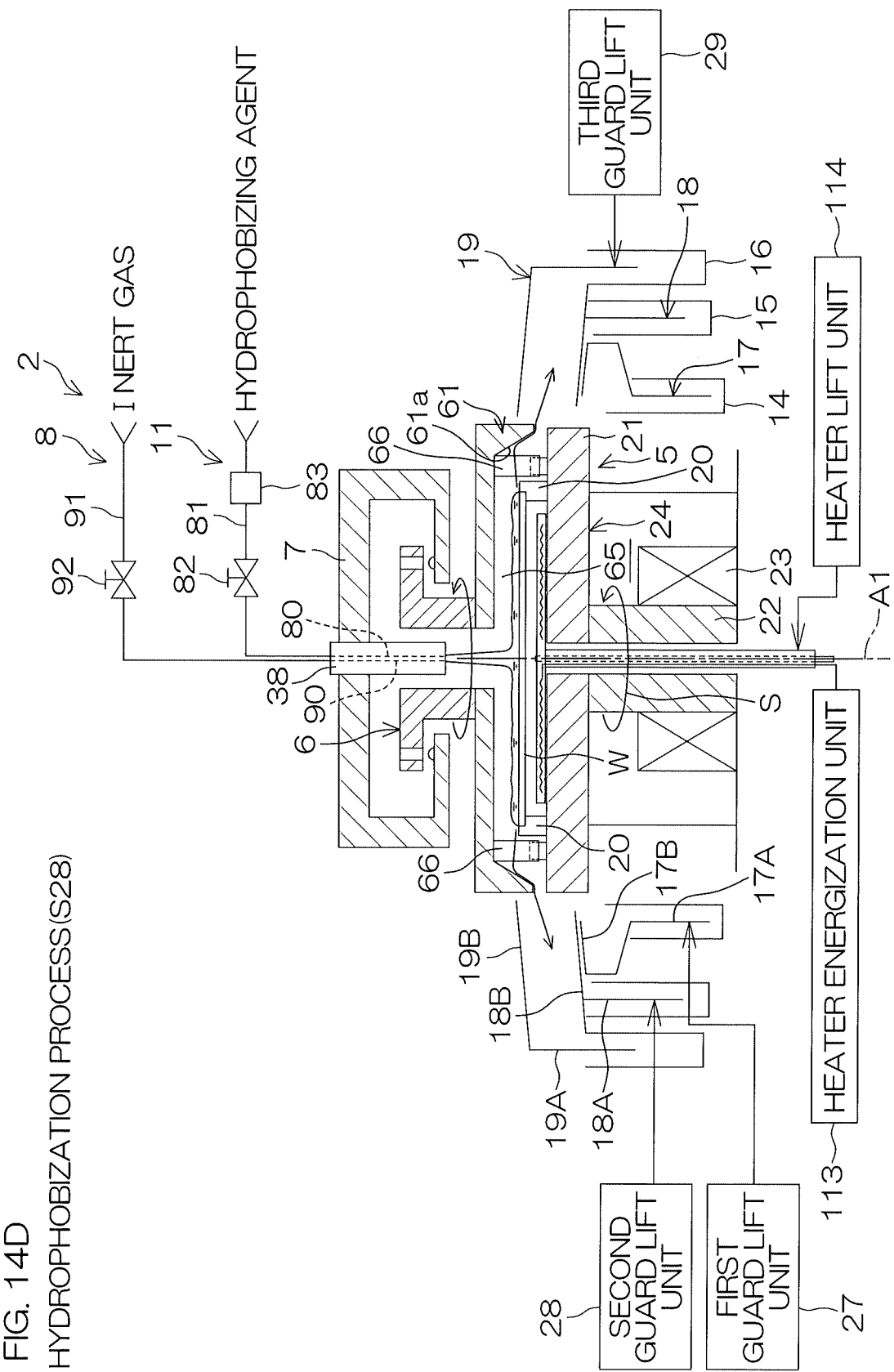
FIG. 14D is a schematic sectional view for describing a hydrophobization process.

In the hydrophobization process (S28), the organic solvent valve 52 is closed to thereby stop the spouting of the organic solvent from the organic solvent nozzle 50. Referring to FIG. 14D, the first guard lift unit 27 maintains the first guard 17 in the lower position, and the second guard lift unit 28 maintains the second guard 18 in the lower position. Further, the third guard lift unit 29 places the third guard 19 at the height position where the treatment liquid can be received.

Then, the hydrophobizing agent valve 82 is opened, whereby the hydrophobizing agent is supplied from the hydrophobizing agent nozzle 80 of the hydrophobizing agent supply unit 11 toward the center region of the upper surface of the wafer W being rotated (hydrophobizing agent supply step). The hydrophobizing agent spreads over the entire upper surface of the wafer W by centrifugal force, whereby the organic solvent on the wafer W is replaced with the hydrophobizing agent. The hydrophobizing agent to be supplied at this time is a low-oxygen concentration hydrophobizing agent obtained by reducing the concentration of oxygen dissolved therein by the degassing unit 83. Specifically, the hydrophobizing agent to be spouted from the hydrophobizing agent nozzle 80 preferably has a dissolved oxygen concentration of not higher than 100 ppb, thereby preventing the oxidation of the surface of the wafer W attributable to the dissolved oxygen.

The hydrophobizing agent or a liquid mixture of the organic solvent and the hydrophobizing agent on the wafer W is scattered radially outward from the wafer W by centrifugal force. The hydrophobizing agent or the liquid mixture of the organic solvent and the hydrophobizing agent scattered radially outward from the wafer W reaches the inner peripheral surface 61a of the extension portion 61 of the opposing member 6 opposed to the wafer W from the radially outside. Since the opposing member 6 is rotated together with the wafer W, the hydrophobizing agent or the liquid mixture of the organic solvent and the hydrophobizing agent adhering to the inner peripheral surface 61a of the extension portion 61 is scattered radially outward of the extension portion 61 by centrifugal force. The hydrophobizing agent or the liquid mixture of the organic solvent and the hydrophobizing agent scattered radially outward of the extension portion 61 is received by the third guard 19. The hydrophobizing agent or the liquid mixture of the organic solvent and the hydrophobizing agent received by the third guard 19 is guided to the third cup 16 along the third tubular portion 19A.

After the hydrophobization process (S28) is performed for a predetermined period, the second organic solvent treatment (S29, subsequent organic solvent supply step) is performed. The rotation speed of the wafer W is controlled at the organic solvent treatment speed (e.g., 300 rpm). In the second organic solvent treatment, the hydrophobizing agent on the wafer W is replaced with the organic solvent. The organic solvent is an organic solvent, e.g., IPA, that is miscible (compatible) with the solvent of the hydrophobizing agent used in the hydrophobization process (S28).

Specifically, the hydrophobizing agent valve 82 is closed. Then, referring to FIG. 14E, the first guard lift unit 27 maintains the first guard 17 in the lower position, and the second guard lift unit 28 maintains the second guard 18 in the lower position. The third guard lift unit 29 places the third guard 19 at the height position where the treatment liquid can be received (guard placement step).

Then, the organic solvent valve 52 is opened, whereby the organic solvent is spouted from the organic solvent nozzle 50 toward the center region of the upper surface of the wafer W being rotated. The organic solvent spreads over the entire upper surface of the wafer W by centrifugal force. Thus, the hydrophobizing agent on the wafer W is replaced with the organic solvent. The organic solvent to be supplied at this time is a low-oxygen concentration organic solvent obtained by reducing the concentration of oxygen dissolved therein by the degassing unit 53. Specifically, the organic solvent to be spouted from the organic solvent nozzle 50 preferably has a dissolved oxygen concentration of not higher than 100 ppb, thereby preventing the oxidation of the surface of the wafer W attributable to the dissolved oxygen.

The organic solvent or a liquid mixture of the organic solvent and the hydrophobizing agent on the wafer W is scattered radially outward from the wafer W by centrifugal force. The organic solvent or the liquid mixture of the organic solvent and the hydrophobizing agent scattered radially outward from the wafer W reaches the inner peripheral surface of the extension portion 61 of the opposing member 6 opposed to the wafer W from the radially outside. Since the opposing member 6 is rotated together with the wafer W, the organic solvent or the liquid mixture of the organic solvent and the hydrophobizing agent adhering to the inner peripheral surface of the extension portion 61 is scattered radially outward of the extension portion 61 by centrifugal force. The organic solvent or the liquid mixture of the organic solvent and the hydrophobizing agent scattered radially outward of the extension portion 61 is received by the third guard 19. The organic solvent or the liquid mixture of the organic solvent and the hydrophobizing agent received by the third guard 19 is guided to the third cup 16 along the third tubular portion 19A.

After the second organic solvent treatment (S29) is performed for a predetermined period, the drying process (S30) is performed to spin off the liquid component from the upper surface of the wafer W by centrifugal force. Specifically, the organic solvent valve 52 is closed, and then the wafer W is rotated at a high speed (drying process speed, e.g., 2000 rpm).

Figure 14E:
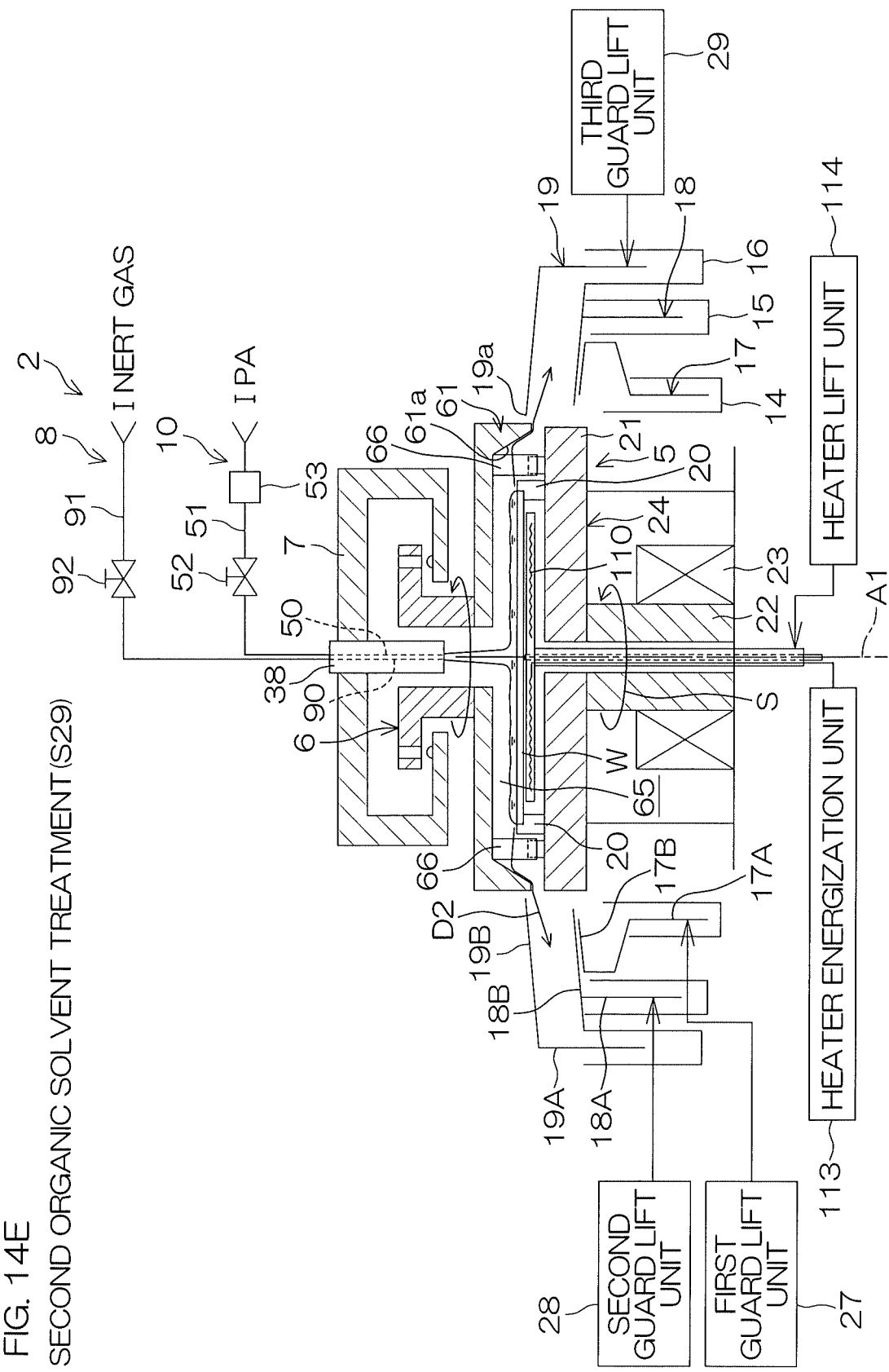
FIG. 14E is a schematic sectional view for describing a second organic solvent treatment.
Figure 14F:
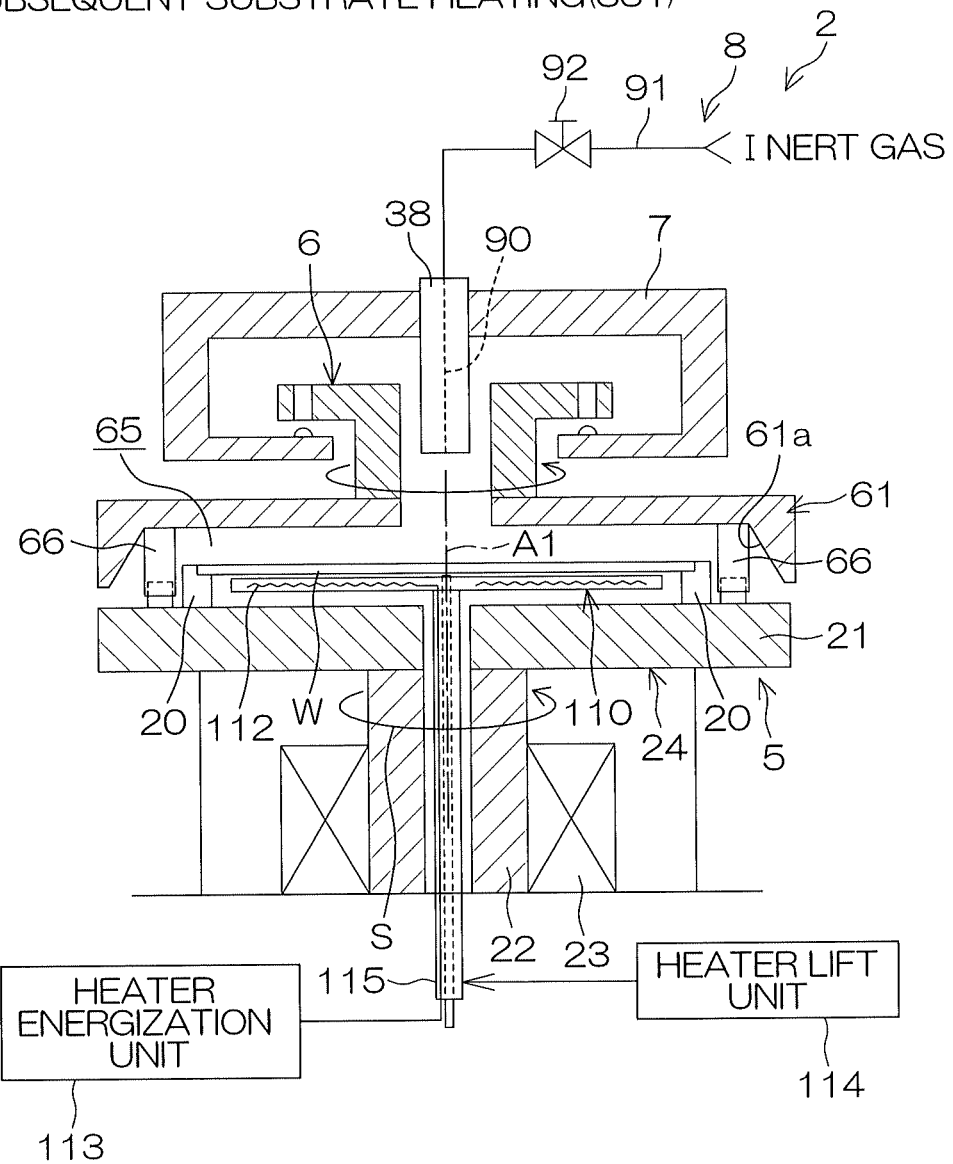
FIG. 14F is a schematic sectional view for describing a subsequent substrate heating process.

After the drying process (S30) is performed for a predetermined period, the control unit 3 decelerates the rotation of the wafer W (e.g., to 300 rpm), and heats the wafer W by the heater unit 110, as shown in FIG. 14F. Thus, the subsequent substrate heating process (S31, thermal dehydration process) is performed for evaporating the solvent component of the hydrophobizing agent remaining on the wafer W.

Figure 14G:
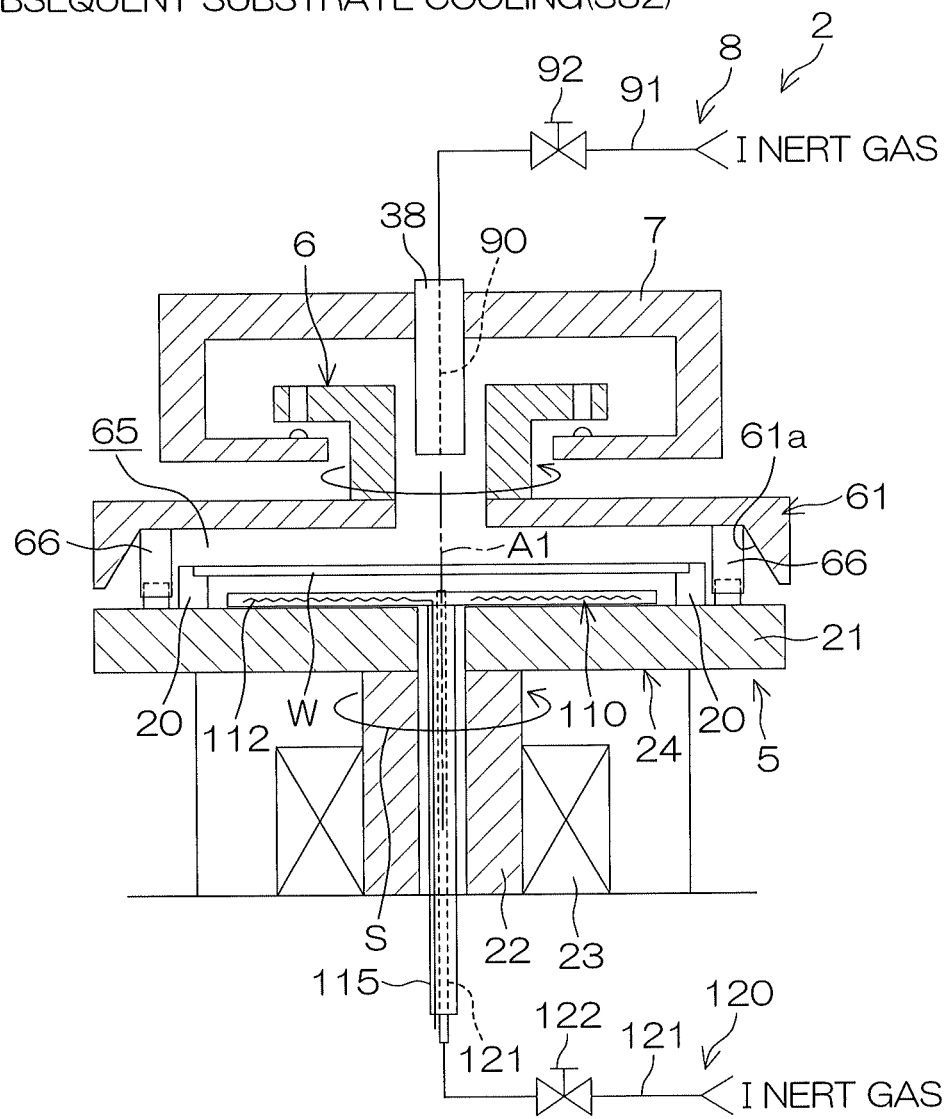
FIG. 14G is a schematic sectional view for describing a subsequent substrate cooling process.

After a lapse of a predetermined period, the control unit 3 stops the heating by the heater unit 110, and accelerates the rotation of the wafer W again (e.g., to 2000 rpm) to perform the subsequent substrate cooling process (S32) for cooling the wafer W to the room temperature. In the subsequent substrate cooling process (S32), as shown in FIG. 14G, the inert gas valves 92 and 122 are opened, whereby the inert gas is sprayed over the upper surface and the lower surface of the wafer W. At this time, it is preferred to quickly replace the inside atmosphere of the treatment space 65 with the inert gas with the guards 17 to 19 all placed in the lower positions. After a lapse of a predetermined period, the control unit 3 controls the electric motor 23 to stop the rotation of the wafer W.

After the completion of the subsequent substrate cooling process (S32), the control unit 3 closes the inert gas valves 92, 122 to stop the supply of the inert gas, and ends the atmosphere control process (S36).

Thereafter, the transport robot CR enters the treatment unit 2, lifts up the treated wafer W from the spin chuck 5, and unloads the wafer W out of the treatment unit 2 (S31: substrate unloading). The wafer W is transferred from the transport robot CR to the transport robot IR, and is stored in the carrier C by the transport robot IR.

Figure 13B:
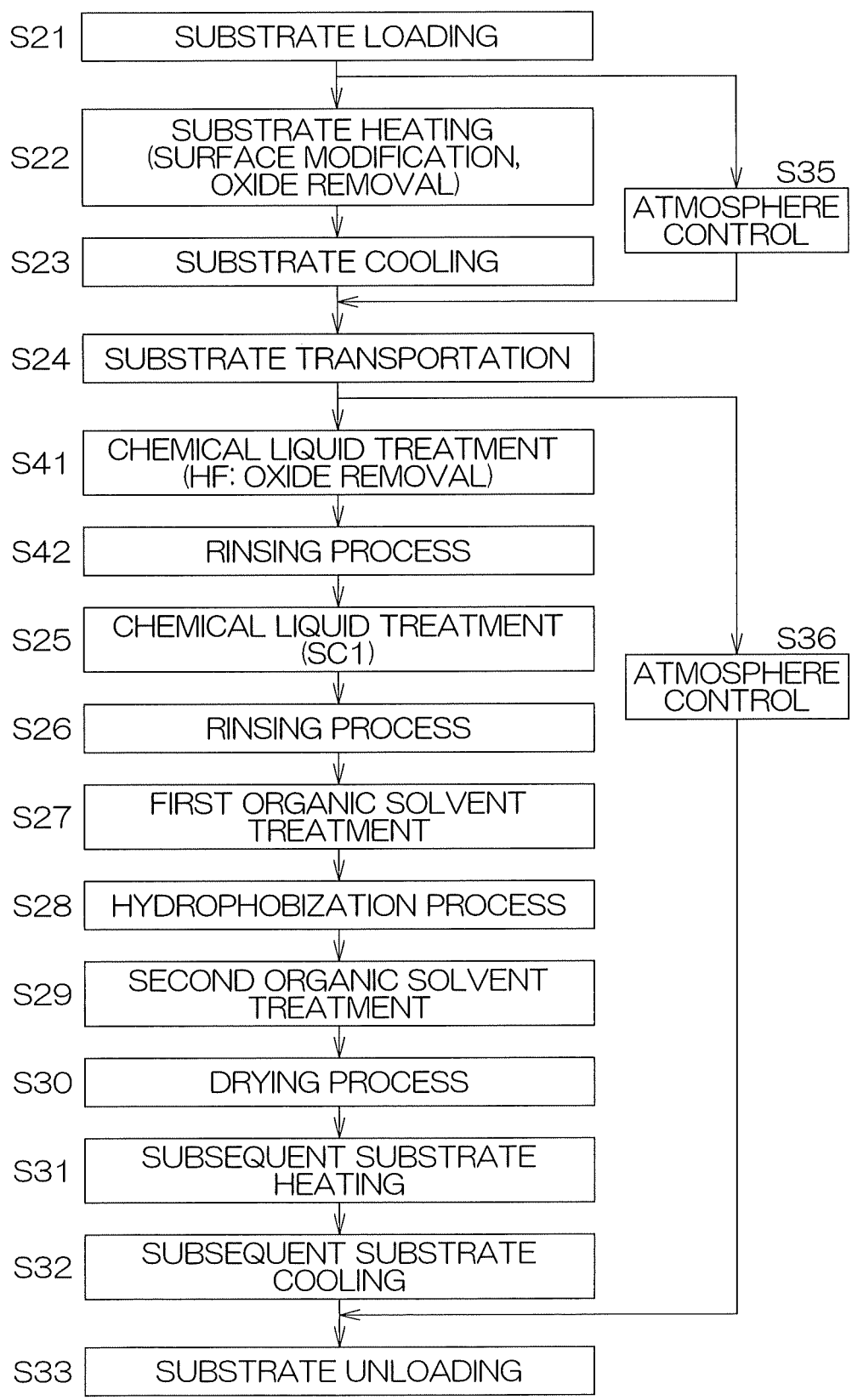
FIG. 13B is a flowchart for describing another exemplary substrate processing process to be performed by the substrate processing apparatus of FIG. 9.

As shown in FIG. 13B, a chemical liquid treatment with hydrofluoric acid (S41: oxide removal process, chemical removal step, chemical liquid cleaning) and a rinsing process (S42) for washing away hydrofluoric acid may be performed before the chemical liquid cleaning process (S25) with the use of the SC1 and the rinsing process (S26) for washing away the SC1. Thus, the wafer W can be cleaned after a trace amount of the oxide present on the surface of the wafer W is reliably removed by the etching effect of hydrofluoric acid (chemical removal process). Where an oxide film is provided on the surface of the wafer W, the surface can be planarized by light etching with hydrofluoric acid. In this case, the atmosphere control process (S36) is started before the oxide removal process (S41) with the use of the chemical liquid.

In the chemical liquid treatment (S41) and the subsequent rinsing process (S42), the chemical liquid (hydrofluoric acid) and the rinse liquid are supplied, for example, from the first treatment liquid supply unit 30.

More specifically, the chemical liquid treatment (S41) is started with the low-oxygen atmosphere maintained. The rotation speed of the wafer W is controlled at the chemical liquid treatment speed (e.g., 300 rpm). In the chemical liquid treatment (S41), hydrofluoric acid (HF) is supplied as the chemical liquid onto the wafer W from the treatment liquid nozzle 33, whereby the upper surface of the wafer W is subjected to an etching process or the like. More specifically, the oxide present on the surface of the wafer W can be etched away, or the surface of the oxide film on the surface of the wafer W can be planarized by the supply of hydrofluoric acid. The chemical liquid cleaning step of cleaning the surface of the wafer W may also be performed by the supply of hydrofluoric acid. Hydrofluoric acid to be supplied is a low-oxygen concentration hydrofluoric acid aqueous solution obtained by reducing the concentration of oxygen dissolved therein by the degassing unit 36. Specifically, hydrofluoric acid to be spouted from the treatment liquid nozzle 33 preferably has a dissolved oxygen concentration of not higher than 100 ppb, thereby preventing the oxidation of the surface of the wafer W attributable to the dissolved oxygen.

Figure 15A:
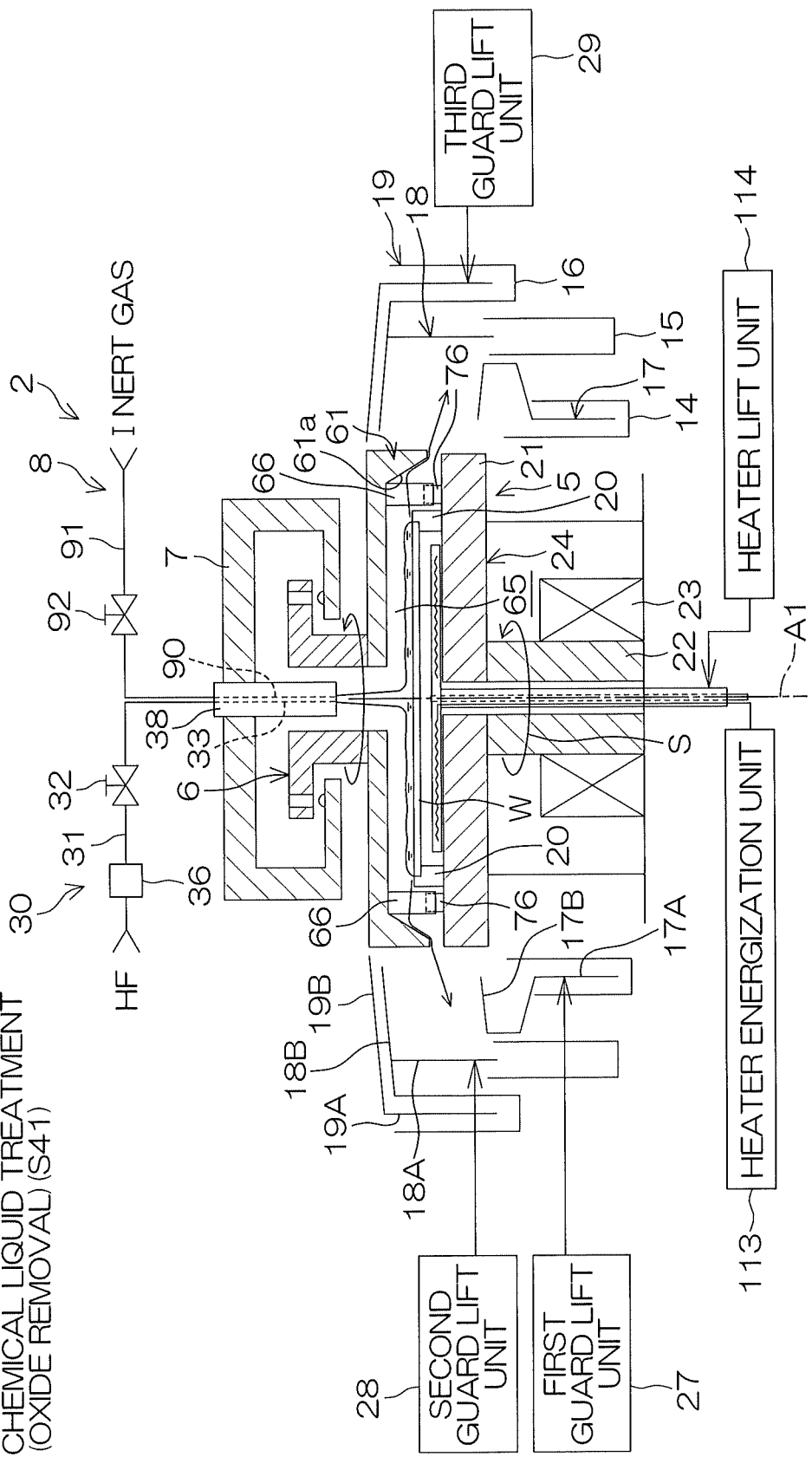
FIG. 15A is a schematic sectional view for describing a chemical liquid treatment (oxide removal step, surface cleaning step).

Referring to FIG. 15A, more specifically, the first guard lift unit 27 places the first guard 17 in the lower position, and the third guard lift unit 29 places the third guard 19 in the upper position. The second guard lift unit 28 places the second guard 18 at the height position where the treatment liquid can be received (guard placement step).

In this state, the chemical liquid valve 32 is opened. Thus, the chemical liquid (hydrofluoric acid) is supplied from the treatment liquid nozzle 33 to the center region of the upper surface of the wafer W being rotated. The chemical liquid spreads over the entire upper surface of the wafer W by centrifugal force.

The chemical liquid is scattered radially outward from the wafer W by centrifugal force. The chemical liquid scattered radially outward from the wafer W reaches the inner peripheral surface 61a of the extension portion 61 of the opposing member 6 opposed to the wafer W from the radially outside. Since the opposing member 6 is rotated together with the wafer W, the chemical liquid adhering to the inner peripheral surface 61a of the extension portion 61 is scattered radially outward of the extension portion 61 by centrifugal force. The chemical liquid scattered radially outward of the extension portion 61 is received by the second guard 18. The chemical liquid received by the second guard 18 is guided to the second cup 15 along the second tubular portion 18A.

After the chemical liquid treatment (S41) is performed for a predetermined period, the rinsing process (S42) is performed. The rotation speed of the wafer W is controlled at the rinsing process speed (e.g., 300 rpm). In the rinsing process, hydrofluoric acid (chemical liquid) on the wafer W is replaced with DIW as the rinse liquid, whereby the upper surface of the wafer W is rinsed. The rinse liquid to be supplied is a low-oxygen concentration rinse liquid (e.g., DIW) obtained by reducing the concentration of oxygen dissolved therein by the degassing unit 37. Specifically, the rinse liquid to be spouted from the treatment liquid nozzle 33 preferably has a dissolved oxygen concentration of not higher than 100 ppb, thereby preventing the oxidation of the surface of the wafer W attributable to the dissolved oxygen.

At the start of the rinsing process (S42), the chemical liquid valve 32 is closed to stop spouting hydrofluoric acid from the treatment liquid nozzle 33. Referring to FIG. 15B, the first guard lift unit 27 maintains the first guard 17 in the lower position, and the third guard lift unit 29 maintains the third guard 19 in the upper position. The second guard lift unit 28 places the second guard 18 at the height position where the treatment liquid can be received (guard placement step).

In this state, the rinse liquid valve 35 is opened, whereby the rinse liquid is supplied from the treatment liquid nozzle 33 toward the center region of the upper surface of the wafer W being rotated. The rinse liquid spreads over the entire upper surface of the wafer W by centrifugal force. Thus, the chemical liquid on the wafer W is replaced with the rinse liquid.

The rinse liquid or a liquid mixture of the chemical liquid and the rinse liquid on the wafer W is scattered radially outward from the wafer W by centrifugal force. The rinse liquid or the liquid mixture of the chemical liquid and the rinse liquid scattered radially outward from the wafer W reaches the inner peripheral surface 61a of the extension portion 61 of the opposing member 6 opposed to the wafer W from the radially outside. Since the opposing member 6 is rotated together with the wafer W, the rinse liquid or the liquid mixture of the chemical liquid and the rinse liquid adhering to the inner peripheral surface 61a of the extension portion 61 is scattered radially outward of the extension portion 61 by centrifugal force. The rinse liquid or the liquid mixture of the chemical liquid and the rinse liquid scattered radially outward of the extension portion 61 is received by the second guard 18. The rinse liquid or the liquid mixture of the chemical liquid and the rinse liquid received by the second guard 18 is guided to the second cup 15 along the second tubular portion 18A.

In this embodiment, the substrate heating step (S22) may be a thermal removal step (S22, oxide removal step) of removing at least a portion of the oxide from the surface of the wafer W by heating. In this case, the oxide is decomposed by a thermal energy. More specifically, bonds between the substrate material and oxygen atoms can be broken by the thermal energy, whereby the oxide is removed. The removal of the oxide by the heating is more advantageous than the removal of the oxide with the use of the chemical liquid without a loss of the substrate material (film loss) due to the etching effect of the chemical liquid.

Figure 16:
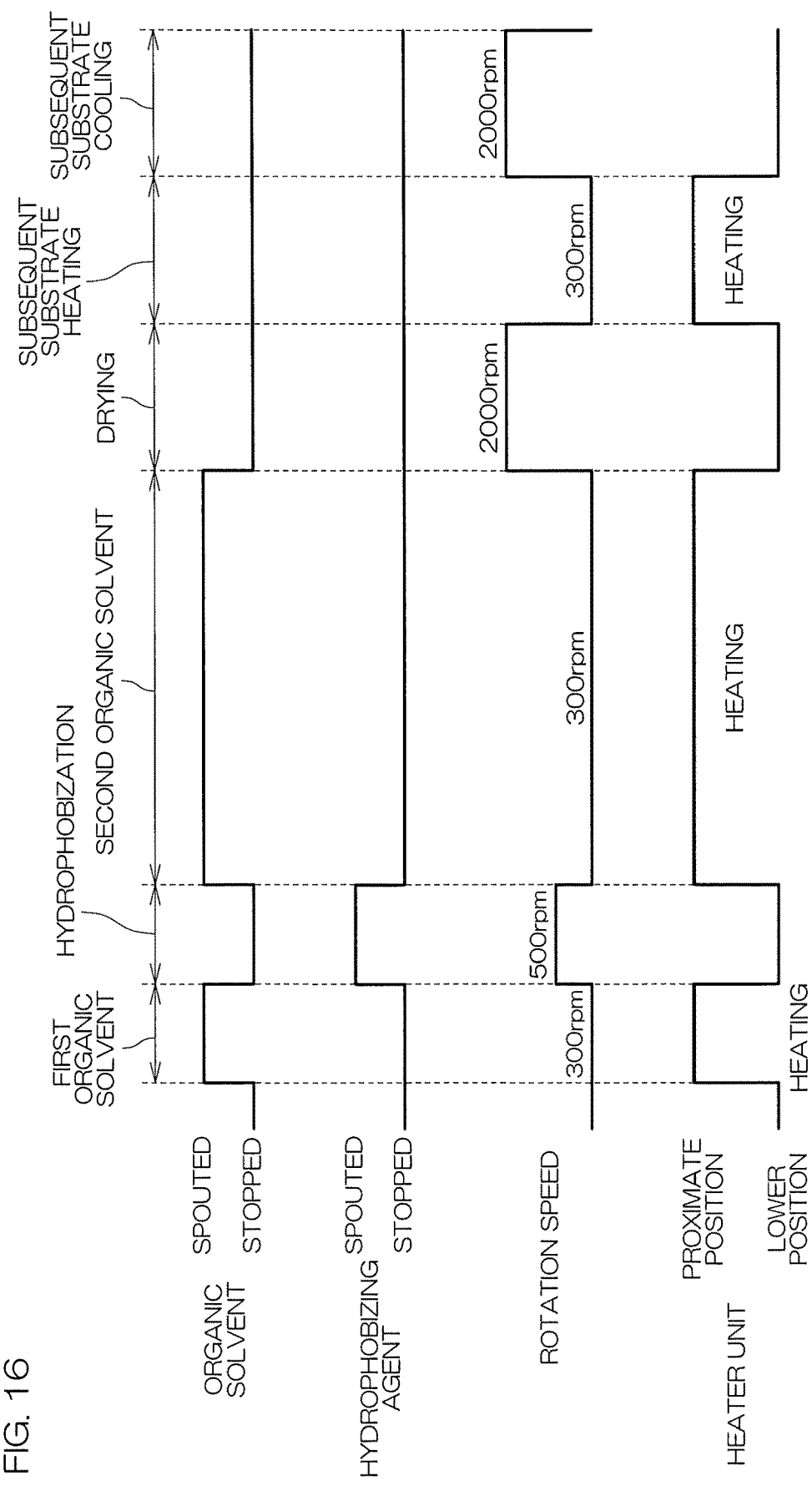
FIG. 16 is a sequence diagram for describing exemplary control operations.

FIG. 16 is a sequence diagram for describing exemplary control operations to be performed on the treatment unit 2 by the control unit 3, mainly showing control operations related to the rotation speed of the wafer W rotated by the spin chuck 5 and the heating of the wafer W by the heater unit 110.

An initial position of the heater unit 110 is the lower position (see FIG. 11) where a distance from the lower surface of the wafer W to the opposing surface 110a is long. When the wafer W to be treated is loaded, for example, the control unit 3 starts the energization of the heater unit 110. During the chemical liquid treatment (S25, S41) and the rinsing process (S26, S42), the control unit 3 maintains the heater unit 110 in the lower position (see FIGS. 14A and 14B) and, therefore, the wafer W is virtually unheated.

During the first organic solvent treatment (S27) and the second organic solvent treatment (S29), the control unit 3 moves up the heater unit 110, and places the heater unit 110 in a proximate position close to the lower surface of the wafer W (see FIGS. 14C and 14E). The heater unit 110 is spaced a sufficient distance from the lower surface of the wafer W, thereby permitting the rotation of the wafer W. In the first organic solvent treatment (S27) and the second organic solvent treatment (S29), the rotation speed of the wafer W is, for example, 300 rpm. With the heater unit 110 located close to the wafer W, the wafer W is heated. Thus, the rinse liquid can be efficiently replaced with the organic solvent.

In the hydrophobization process (S28), the control unit 3 maintains the heater unit 110 in the lower position (see FIG. 14D). Therefore, the wafer W is virtually unheated. This suppresses the evaporation of the solvent of the hydrophobizing agent. Thus, the hydrophobizing agent spreads over the entire surface of the wafer W, whereby the organic solvent can be replaced with the hydrophobizing agent. During the hydrophobization process, the rotations speed of the wafer W is, for example, 500 rpm.

In the drying process (S30), the rotation speed of the wafer W is increased, for example, to 2000 rpm. Thus, the organic solvent on the wafer W is expelled out of the wafer W by centrifugal force.

In the subsequent substrate heating process (S31), the control unit 3 reduces the rotation speed of the wafer W, for example, to 300 rpm. Further, the control unit 3 moves up the heater unit 110 and, as shown in FIG. 14F, places the heater unit 110 in the proximate position close to the lower surface of the wafer W, whereby the wafer W is heated, for example, to about 200° C. In the subsequent substrate heating process (S31), the solvent component and moisture in the hydrophobizing agent film formed on the surface of the wafer W are evaporated. That is, the subsequent substrate heating process (S31) includes a solvent removal process and a dehydration process. The subsequent substrate heating process is preferably a process in which the temperature of the wafer W is elevated to not lower than the boiling point of the solvent of the liquid hydrophobizing agent. For example, the solvent of the liquid hydrophobizing agent may be PGMEA. In this case, the boiling point of the solvent is about 110° C.

In the subsequent substrate cooling process (S32), the control unit 3 increases the rotation speed of the wafer W, for example, to 2000 rpm. As shown in FIG. 14G, the heater unit 110 is located in the lower position, whereby the wafer W is heat-exchanged with the inert gas supplied from above and below to be cooled to the room temperature. After the subsequent substrate cooling process is completed, the control unit 3 stops the rotation of the wafer W, i.e., the rotation of the spin chuck 5, and causes the transport robot CR to unload the treated wafer W from the treatment unit 2.

Figure 17:
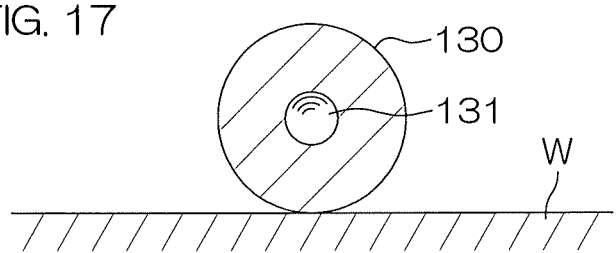
FIG. 17 is a diagram for describing a solvent removal effect to be provided by the subsequent substrate heating process.

FIG. 17 is a diagram for describing a solvent removal effect to be provided by the subsequent substrate heating process (S31). By the treatment of the surface of the wafer W with the hydrophobizing agent, the surface of the wafer W is silylated to be hydrophobic. Dust 130 is liable to adhere to the hydrophobic surface. It is considered that the main component of the dust 130 is C (carbon) and, when an excess amount of the solvent is present, the dust 130 is in the form of a latex containing the solvent 131 therein. Therefore, the subsequent substrate heating process (S31) evaporates the solvent 131 from the dust 130, making it possible to diminish the dust 130 to thereby improve the particle performance.

FIG. 18 is a diagram for describing a dehydration effect to be provided by the subsequent substrate heating process (S31), wherein Y represents a substituent such as alkyl group. If moisture remains on the surface of the wafer W, water molecules 141 are present between molecules 140 of the hydrophobizing agent and the material (e.g., silicon) of the wafer W, thereby forming imperfect bonds. The subsequent substrate heating process (S31) provides the dehydration effect for removing the water molecules 141 present in the bonds, thereby minimizing or eliminating the imperfect bonds. Where the molecules 140 of the hydrophobizing agent are present in an imperfect bonding state, for example, there is a possibility that a reaction residue of the organic substance is liable to adhere to the hydrophobizing agent film. By thus minimizing or eliminating the imperfect bonds through the dehydration process, deterioration in particle performance can be prevented, which may otherwise occur due to the imperfect bonding state.

According to this embodiment, as described above, the heat treatment unit 100 performs the surface modification process (S22) on the wafer W having the oxide on its surface. Thus, the oxide is removed from the wafer W, or the oxide on the wafer W is decomposed and recombined, whereby the surface of the wafer W is planarized. Thereafter, the surface cleaning step (S25, S26, S41, S42) of cleaning the surface of the wafer W with the treatment liquid is performed. In the hydrophobization step (S28) performed after the surface cleaning step, the hydrophobizing agent is supplied to the surface of the wafer W, whereby the surface of the wafer W is modified to be hydrophobic.

The surface of the wafer W is thus modified to be hydrophobic in a state such that the surface unevenness of the wafer W attributable to the oxide is eliminated. Therefore, the modified surface of the wafer W is uniformly made hydrophobic and flat with a lower roughness. Thus, the collapse of the pattern on the surface of the wafer W is suppressed or prevented in the second organic solvent treatment (S29) or the like. With the lower surface roughness, it is possible to suppress or prevent the unevenness of the surface of the wafer W which may be detected as particles.

Since the treatment liquids (the chemical liquids, the rinse liquids, the organic solvents, and the hydrophobizing agent) to be used in the treatment unit 2 each have a lower dissolved oxygen concentration (e.g., not higher than 100 ppb) and do not oxidize the material of the wafer W, the oxide is not newly formed on the surface of the wafer W due to the treatment liquids. During the period from the surface cleaning step to the hydrophobization step, the atmosphere around the wafer W is controlled to the low-oxygen atmosphere (S36). Accordingly, the surface of the wafer W can be modified to be hydrophobic in a state such that the growth of the new oxide on the surface of the wafer W is suppressed.

The low-oxygen atmosphere is an atmosphere having an oxygen concentration that does not permit dissolution of oxygen in the treatment liquids. This suppresses or prevents the growth of the oxide on the surface of the wafer W.

In this embodiment, the second organic solvent treatment (S29, subsequent organic solvent supply step) is performed to wash away an excess amount of the hydrophobizing agent on the wafer W by supplying the organic solvent to the surface of the wafer W after the hydrophobization process (S28). Since the surface of the wafer W can be thus hydrophobized with a proper amount of the hydrophobizing agent, it is possible to prevent the aggravation of the surface roughness of the wafer W and the reduction in hydrophobization performance which may otherwise occur due to the excess hydrophobizing agent.

In this embodiment, the opposing member 6 is placed in the position close to the surface of the wafer Win opposed relation to the surface of the wafer W in the atmosphere control step (S36), whereby the space to which the surface of the wafer W is opposed is limited. The inert gas is supplied to the limited space. Thus, the surface of the wafer W is maintained in the low-oxygen concentration atmosphere. This suppresses or prevents the growth of the oxide on the surface of the wafer W during the process.

In this embodiment, with the opposing member 6 placed in close opposed relation to the surface of the wafer W, the space to which the surface of the wafer W is opposed is limited by the opposing portion 60 in the direction normal to the surface, and is limited by the annular extension portion 61 in the direction parallel to the surface. Thus, the space to which the surface of the wafer W is opposed is a substantially closed space, and the inert gas is supplied to this closed space. Therefore, the surface of the wafer W is maintained in the atmosphere stabilized at a lower oxygen concentration and, in this state, the surface cleaning process or the like is performed. This more reliably suppresses or prevents the growth of the oxide on the surface of the wafer W during the process.

While the two embodiments of the present invention have been described above, the present invention may be embodied in other ways.

For example, the subsequent substrate heating process (S31) described in the second embodiment may be performed in the first embodiment. In this case, the treatment unit 2 preferably has the construction shown in FIG. 11 in which the heater unit 110 is incorporated.

For the subsequent substrate heating process (S31), heating with an infrared lamp, laser, heated vapor (steam) or the like may be employed instead of the heating with the heater unit 110 or in addition to the heating with the heater. The heating of the wafer W is not necessarily required to be the heating from the lower side, but may be heating from the upper side. For example, the infrared lamp may be disposed above the wafer W.

The subsequent substrate heating process (S31) is not necessarily required to be performed within the treatment unit 2, but may be performed in another unit to which the wafer W is transported by the transport robot CR.

In the processes of FIGS. 13A and 13B, the subsequent substrate heating process (S31) and the subsequent substrate cooling process (S32) may be omitted.

The inside atmosphere of a transport chamber in which the transport robot CR is provided may be controlled to a low-oxygen atmosphere to suppress or prevent the growth of the oxide during the transportation.

In the second embodiment, the heat treatment unit 100 is incorporated in the substrate processing apparatus 1, but the heating process for the surface modification (e.g., the oxide removal) of the wafer W may be performed in a device different from the substrate processing apparatus 1.

While the embodiments of the present invention have been described in detail, these embodiments are merely specific examples that are illustrative of the technical principles of the present invention but not limitative of the invention. The spirit and scope of the present invention are limited only by the appended claims.

REFERENCE SIGNS LIST

W Wafer
Ox Oxide
Oxn New oxide
Wsi Silicon exposed portion
Wox Oxide portion
Sm Hydrophobizing substance
IR Transport robot
CR Transport robot
1 Substrate processing apparatus
2 Treatment unit
3 Control unit
4 Chamber
5 Spin chuck
6 Opposing member
7 Support member
8 Inert gas supply unit
10 Organic solvent supply unit
11 Hydrophobizing agent supply unit
12 Support member lift unit
20 Chuck pins
21 Spin base
22 Rotary shaft
23 Electric motor
24 Substrate holding unit
26 Exhaust tub
30 First treatment liquid supply unit
31 Chemical liquid supply pipe
32 Chemical liquid valve
33 Treatment liquid nozzle
34 Rinse liquid supply pipe
35 Rinse liquid valve
36 Degassing unit
37 Degassing unit
40 Second treatment liquid supply unit
41 Chemical liquid supply pipe
42 Chemical liquid valve
43 Treatment liquid nozzle
44 Rinse liquid supply pipe
45 Rinse liquid valve
46 Degassing unit
47 Degassing unit
50 Organic solvent nozzle
51 Organic solvent supply pipe
52 Organic solvent valve
53 Degassing unit
60 Opposing portion
61 Extension portion
62 Tubular portion
70 Opposing member support portion 72 Nozzle support portion
80 Hydrophobizing agent nozzle
81 Hydrophobizing agent supply pipe
82 Hydrophobizing agent valve
83 Degassing unit
90 Inert gas nozzle
91 Inert gas supply pipe
92 Inert gas valve
100 Heat treatment unit
101 Chamber
102 Susceptor
103 Lamp heater unit
104 Flash lamp unit
105 Exhaust unit
106 Inert gas supply unit
110 Heater unit
113 Heater energization unit
114 Heater lift unit
120 Lower surface inert gas supply unit
121 Inert gas supply pipe
122 Inert gas valve

The invention claimed is:

1. A substrate processing method comprising:
a surface modification step of modifying a surface of a substrate having an oxide thereon to reduce a roughness of the surface attributable to the oxide;
a surface cleaning step of supplying a treatment liquid to the modified surface of the substrate to clean the surface of the substrate with the treatment liquid; and
a hydrophobization step of supplying a hydrophobizing agent to the cleaned surface of the substrate to hydrophobize the surface of the substrate,
wherein the surface modification step comprises a thermal modification step of heating the substrate to modify the surface, the thermal modification step including a thermal treatment that supplies thermal energy to the substrate that is effective to brake bonds between a material of the substrate and oxygen so that the oxide on the surface is decomposed and recombined in a manner that is effective to thereby reduce the roughness attributable to the oxide.

2. The substrate processing method according to claim 1, wherein the thermal modification step comprises a thermal removal step of removing at least a portion of the oxide from the surface of the substrate by the heating.

3. The substrate processing method according to claim 1, further comprising a cooling step of cooling the substrate after the thermal modification step,
wherein the surface cleaning step is performed on the substrate after the cooling step.

4. The substrate processing method according to claim 1, further comprising an atmosphere control step of controlling an atmosphere around the substrate to a low-oxygen atmosphere having a lower oxygen concentration than atmospheric air during a period from the surface cleaning step to the hydrophobization step.

5. The substrate processing method according to claim 4, wherein the low-oxygen atmosphere is an atmosphere having an oxygen concentration that does not permit dissolution of oxygen in the treatment liquid.

6. The substrate processing method according to claim 4, wherein the atmosphere control step comprises a shield placement step of placing a shield in a position close to the surface of the substrate in opposed relation to the surface of the substrate, and an inert gas supply step of supplying an inert gas between the shield and the surface of the substrate.

7. The substrate processing method according to claim 6, wherein the shield comprises an opposing portion to be opposed to the surface of the substrate, and an annular extension portion connected to a peripheral portion of the opposing portion to surround a periphery of the substrate,
wherein the extension portion is opposed to the periphery of the substrate in the atmosphere control step.

8. The substrate processing method according to claim 1, wherein the surface modification step comprises an oxide removal step of removing the oxide from the surface of the substrate,
wherein the surface cleaning step comprises the step of supplying the treatment liquid to the oxide-removed surface of the substrate to clean the surface of the substrate with the treatment liquid,
the substrate processing method further comprising an atmosphere control step of controlling an atmosphere around the substrate to a low-oxygen atmosphere having a lower oxygen concentration than atmospheric air during a period from the surface cleaning step to the hydrophobization step.

9. The substrate processing method according to claim 8, wherein the oxide removal step comprises a chemical removal step of supplying a chemical liquid to the surface of the substrate to remove the oxide.

10. The substrate processing method according to claim 9, wherein the chemical liquid has a dissolved oxygen concentration of not higher than 100 ppb.

11. The substrate processing method according to claim 8, wherein the oxide removal step comprises a thermal removal step of removing at least a portion of the oxide from the surface of the substrate by heating.

12. The substrate processing method according to claim 1, wherein the surface cleaning step comprises a chemical liquid cleaning step of supplying a cleaning chemical liquid to the surface of the substrate, and a rinsing step of supplying a rinse liquid to the surface of the substrate to replace the chemical liquid with the rinse liquid.

13. The substrate processing method according to claim 1, wherein the treatment liquid has a dissolved oxygen concentration of not higher than 100 ppb.

14. The substrate processing method according to claim 1, further comprising a degassing step of degassing the treatment liquid to be supplied to the surface of the substrate to remove oxygen from the treatment liquid,
wherein the treatment liquid subjected to the degassing step is supplied to the surface of the substrate in the surface cleaning step.

15. The substrate processing method according to claim 1, wherein the hydrophobization step comprises a hydrophobizing agent supply step of supplying a liquid hydrophobizing agent comprising a solvent and a hydrophobizing substance dissolved in the solvent,
the substrate processing method further comprising a precedent organic solvent supply step of supplying an organic solvent miscible with the solvent of the hydrophobizing agent to the surface of the substrate before the hydrophobization step after the surface cleaning step.

16. The substrate processing method according to claim 15, wherein the organic solvent has a dissolved oxygen concentration of not higher than 100 ppb.

17. The substrate processing method according to claim 1, further comprising a subsequent organic solvent supply step of supplying an organic solvent to the surface of the substrate to wash away an excess amount of the hydrophobizing agent on the substrate after the hydrophobization step.

18. The substrate processing method according to claim 1, wherein the hydrophobizing agent has a dissolved oxygen concentration of not higher than 100 ppb.

19. The substrate processing method according to claim 1, further comprising a thermal dehydration step of heating and dehydrating the hydrophobizing agent on the surface of the substrate after the hydrophobization step.

20. A substrate processing method comprising:
- a thermal removal step of removing at least a portion of an oxide present on a surface of a substrate by heating so as to reduce roughness of the surface, the thermal removal step including a thermal treatment that supplies thermal energy to the substrate that brakes bonds between a material of the substrate and oxygen;
- an oxide film forming step of, after the thermal removal step, forming a new oxide film on the surface of the substrate by introducing an oxygen-containing atmosphere around the substrate;
- an atmosphere control step of controlling an atmosphere around the substrate during the oxide film forming step such that the atmosphere contains oxygen higher in concentration than an atmosphere around the substrate during the thermal removal step;
- a surface cleaning step of supplying a treatment liquid to the oxide-removed surface of the substrate to clean the surface of the substrate with the treatment liquid; and
- a hydrophobization step of supplying a hydrophobizing agent to the cleaned surface of the substrate to hydrophobize the surface of the substrate.

\* \* \* \* \*